(12) United States Patent
Nakamura et al.

(10) Patent No.: US 12,239,006 B2
(45) Date of Patent: Feb. 25, 2025

(54) ORGANIC DEVICE HAVING A FIRST DISPLAY AREA, AND A SECOND DISPLAY AREA INCLUDING A SECOND ELECTRODE SURROUNDING EACH OF FIRST AND SECOND ADJACENT TRANSMISSION AREAS

(71) Applicant: Dai Nippon Printing Co., Ltd., Tokyo (JP)

(72) Inventors: Yoko Nakamura, Tokyo (JP); Yasuyuki Oyagi, Tokyo (JP); Yukio Taniguchi, Tokyo (JP); Ryuji Horiguchi, Tokyo (JP); Isao Inoue, Tokyo (JP)

(73) Assignee: Dai Nippon Printing Co., Ltd., Tokyo (JP)

(*) Notice: Subject to any disclaimer, the term of this patent is extended or adjusted under 35 U.S.C. 154(b) by 504 days.

(21) Appl. No.: 17/646,052

(22) Filed: Dec. 27, 2021

(65) Prior Publication Data
US 2022/0209124 A1    Jun. 30, 2022

(30) Foreign Application Priority Data
Dec. 28, 2020 (JP) .................. 2020-219415

(51) Int. Cl.
*H10K 71/16* (2023.01)
*H10K 50/805* (2023.01)
*H10K 71/00* (2023.01)

(52) U.S. Cl.
CPC ......... *H10K 71/166* (2023.02); *H10K 50/805* (2023.02); *H10K 71/00* (2023.02)

(58) Field of Classification Search
CPC .. H10K 71/166; H10K 50/805; H10K 59/121; H10K 71/60

(Continued)

(56) References Cited

U.S. PATENT DOCUMENTS

| 2011/0037065 A1 | 2/2011 | Ueno et al. |
| 2011/0163327 A1 | 7/2011 | Ueno et al. |

(Continued)

FOREIGN PATENT DOCUMENTS

| JP | 3539597 B2 | 7/2004 |
| JP | 2010-272891 A | 12/2010 |

(Continued)

OTHER PUBLICATIONS

Extended European Search Report dated May 25, 2022 (Application No. 21217917.0).

(Continued)

*Primary Examiner* — Quoc D Hoang
(74) *Attorney, Agent, or Firm* — BURR PATENT LAW, PLLC

(57) ABSTRACT

An organic device may include a substrate, first electrodes disposed on the substrate, organic layers respectively disposed on the first electrodes, and a second electrode disposed on the organic layers. When the organic device is viewed in a direction normal to the substrate, the organic device may include a first display area that includes the second electrode at a first occupancy, and a second display area that includes the second electrode at a second occupancy lower than the first occupancy. The second display area may include the second electrode, and transmission areas each surrounded by the second electrode in plan view. The transmission areas may include a first transmission area, and a second transmission area adjacent to the first transmission area via the second electrode. The first transmission area may have a first shape, and the second transmission area may have a second shape different from the first shape.

9 Claims, 38 Drawing Sheets

(58) Field of Classification Search
USPC .......................................................... 257/40
See application file for complete search history.

(56) References Cited

U.S. PATENT DOCUMENTS

| | | |
|---|---|---|
| 2012/0146010 A1 | 6/2012 | Ueno et al. |
| 2014/0008638 A1 | 1/2014 | Otsuki et al. |
| 2018/0226581 A1 | 8/2018 | Chang et al. |
| 2020/0124927 A1 | 4/2020 | Kim et al. |
| 2020/0335730 A1 | 10/2020 | Oh et al. |
| 2020/0381495 A1 | 12/2020 | Jeon et al. |
| 2021/0047536 A1 | 2/2021 | Chang et al. |
| 2021/0050389 A1* | 2/2021 | Yang .................. H01L 27/1214 |
| 2021/0065625 A1 | 3/2021 | Wang et al. |

FOREIGN PATENT DOCUMENTS

| | | |
|---|---|---|
| JP | 2011-119681 A | 6/2011 |
| JP | WO2012/018082 A1 | 2/2012 |
| JP | 2012-069963 A | 4/2012 |
| KR | 10-2020-0044245 A | 4/2020 |
| WO | 2012/132126 A1 | 10/2012 |
| WO | 2017/072678 A1 | 5/2017 |
| WO | 2019/150327 A1 | 8/2019 |
| WO | 2019/242510 A1 | 12/2019 |

OTHER PUBLICATIONS

Korean Office Action (with English translation) dated Sep. 19, 2024 (Application No. 10-2021-0189404).

\* cited by examiner

ORGANIC DEVICE HAVING A FIRST DISPLAY AREA, AND A SECOND DISPLAY AREA INCLUDING A SECOND ELECTRODE SURROUNDING EACH OF FIRST AND SECOND ADJACENT TRANSMISSION AREAS

CROSS-REFERENCE TO RELATED APPLICATIONS

This application is based upon and claims the benefit of priority from Japanese Patent Application No. 2020-219415, filed on Dec. 28, 2020; the entire contents of which are incorporated herein by reference.

BACKGROUND

Field

An embodiment of the present disclosure relates to an organic device, a group of masks, a mask, and a manufacturing method for an organic device.

Background Art

In recent years, in electronic devices, such as smartphones and tablet PCs, a high-resolution display device is desired in the market. The display device has, for example, a pixel density of 400 ppi or higher or a pixel density of 800 ppi or higher.

Since an organic EL device has a high responsivity or a low power consumption or both, the organic EL display device has become a focus of attention. A method of depositing the material of pixels on a substrate by vapor deposition is known as a method of forming the pixels of an organic EL display device. For example, initially, a substrate on which anodes are formed in a pattern corresponding to elements is prepared. Subsequently, an organic layer is formed on each of the anodes by depositing an organic material on the anode via a corresponding one of the through-holes of a mask. After that, a cathode is formed on each of the organic layers by depositing a conductive material on the organic layer via a corresponding one of the through-holes of the mask.

Patent Document 1: Japanese Patent No. 3539597

SUMMARY

As the area of each cathode increases, the electrical resistance of the cathode decreases. On the other hand, as the area of each cathode increases, the transmittance of light in an organic device decreases.

An embodiment of the present disclosure provides an organic device. The organic device may include a substrate, first electrodes disposed on the substrate, organic layers respectively disposed on the first electrodes, and a second electrode disposed on the organic layers. When the organic device is viewed in a direction normal to the substrate, the organic device may include a first display area that includes the second electrode at a first occupancy and a second display area that includes the second electrode at a second occupancy lower than the first occupancy. The second display area may include the second electrode, and transmission areas each surrounded by the second electrode in plan view. The transmission areas may include a first transmission area, and a second transmission area adjacent to the first transmission area via the second electrode. The first transmission area may have a first shape, and the second transmission area may have a second shape different from the first shape.

According to the embodiment of the present disclosure, it is possible to increase the transmittance of light in an organic device.

DESCRIPTION OF THE EMBODIMENTS

Figure 1:
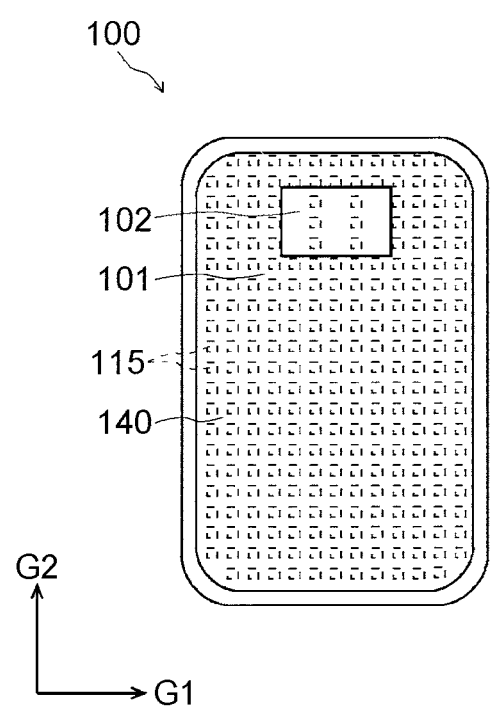
FIG. 1 is a plan view of an example of an organic device according to an embodiment of the present disclosure.

In the specification and the attached drawings, unless otherwise described, terms that mean substances that are the basis of components, such as "substrate", "substrate material, "plate", "sheet", and "film", are not distinguished from one another by the difference in name.

In the specification and the attached drawings, unless otherwise described, terms, such as "parallel" and "orthogonal", values of length and angle, and the like that determine shapes, geometrical conditions and the degrees of them are not limited to strict meanings and are interpreted by including the range of degrees to which similar functions may be expected.

In the specification and the attached drawings, unless otherwise described, when a component of a member, an area, or the like is "on" and "under", "upper side" and "lower side", or "upward" and "downward" of another component of another member, another area, or the like, it includes a case where a component is directly in contact with another component. Furthermore, it also includes a case where further another component is included between a component and another component, that is, a component and another component are indirectly in contact with each other. Unless otherwise described, words "up", "upper side", and "upward", or "down", "lower side", and "downward" may be inverted upside down.

In the specification and the attached drawings, unless otherwise described, the same or similar reference signs denote the same portions or portions having similar functions, and the repeated description can be omitted. The scale ratio of the drawings can be different from the actual ratio for the sake of convenience of illustration, and a portion of components can be omitted from the drawings.

In the specification and the attached drawings, unless otherwise described, an embodiment of the present disclosure may be combined with another embodiment or a modification without any contradiction. Alternatively, other embodiments or another embodiment and a modification may also be combined with each other without any contradiction. Alternatively, modifications may also be combined with each other without any contradiction.

In the specification and the attached drawings, unless otherwise described, when a plurality of steps will be described for a method, such as a manufacturing method, another undisclosed step may be performed between the disclosed steps. The order of disclosed steps may be selected without any contradiction.

In the specification and the attached drawings, unless otherwise described, the range expressed by "X" to "Y" includes numeric values or elements assigned to "X" and "Y". For example, a numeric range defined by the expression "34 to 38 percent by mass" is equivalent to a numeric range defined by the expression "higher than or equal to 34 percent by mass and lower than or equal to 38 percent by mass". For example, a range defined by the expression "masks 50A to 50B" includes the mask 50A and the mask 50B.

In an embodiment of the specification, an example in which a group of masks that includes a plurality of masks is used to form electrodes on a substrate when an organic EL display device is manufactured will be described. However, the uses of the group of the masks are not limited, and the present embodiment may be applied to a group of masks used in various uses. The group of the masks of the present embodiment may be used to, for example, form electrodes of an apparatus for displaying or projecting an image or a video to present virtual reality, so-called VR, or augmented reality, so-called AR. Alternatively, the group of the masks of the present embodiment may also be used to form electrodes of a display device other than an organic EL display device, such as electrodes of a liquid crystal display device. Alternatively, the group of the masks of the present embodiment may also be used to form electrodes of an organic device other than a display device, such as electrodes of a pressure sensor.

According to a first aspect of the present disclosure, an organic device includes a substrate; first electrodes disposed on the substrate; organic layers respectively disposed on the first electrodes; and a second electrode disposed on the organic layers, wherein, when the organic device is viewed in a direction normal to the substrate, the organic device includes a first display area that includes the second electrode at a first occupancy and a second display area that includes the second electrode at a second occupancy lower than the first occupancy, the second display area includes the second electrode, and transmission areas each surrounded by the second electrode in plan view, the transmission areas include a first transmission area, and a second transmission area adjacent to the first transmission area via the second electrode, the first transmission area has a first shape, and the second transmission area has a second shape different from the first shape.

According to a second aspect of the present disclosure, in the organic device according to the above-described first aspect, an area of the first transmission area may be different from an area of the second transmission area.

According to a third aspect of the present disclosure, in the organic device according to the above-described first aspect or the above-described second aspect, the transmission area may include a third transmission area adjacent to the first transmission area and the second transmission area via the second electrode. The third transmission area may have a third shape different from the first shape and different from the second shape.

According to a fourth aspect of the present disclosure, in the organic device according to any one of the above-described first aspect to the above-described third aspect, the transmission area may include a fourth transmission area adjacent to the first transmission area and the second transmission area via the second electrode. The fourth transmission area may have a fourth shape different from the first shape and different from the second shape.

According to a fifth aspect of the present disclosure, in the organic device according to any one of the above-described first aspect to the above-described fourth aspect, 80% or higher of the transmission areas may correspond to the first transmission area.

According to a sixth aspect of the present disclosure, in the organic device according to any one of the above-described first aspect to the above-described fifth aspect, the second display area may have a first split percentage of higher than or equal to 80%. The first split percentage may be the percentage of a first split number to the total number of pixel groups each including the four organic layers, the first split number may be the number of split pixel groups, and a path connecting the four organic layers of each of the split pixel groups may partially include the transmission area.

According to a seventh aspect of the present disclosure, in the organic device according to any one of the above-described first aspect to the above-described sixth aspect, in the second display area, the second electrode may include a trunk electrode, and a branch electrode connected to the trunk electrode. The branch electrode may include two first electrode ends in a first electrode direction, and one second electrode end in a second electrode direction that intersects with the first electrode direction. The two first electrode ends and the one second electrode end may be in contact with the transmission area.

According to an eighth aspect of the present disclosure, in the organic device according to the above-described seventh aspect, the second electrode may include a first layer and a second layer. The first display area may include electrode overlap areas arranged at a twenty-third pitch in a second element direction. Each of the electrode overlap areas may include the first layer and the second layer in plan view. A width of the first electrode end may be greater than or equal to 0.4 times the twenty-third pitch.

According to a ninth aspect of the present disclosure, in the organic device according to the above-described seventh aspect or the above-described eighth aspect, the second electrode may include a first layer and a second layer. The first display area may include electrode overlap areas arranged at a thirteenth pitch in a first element direction. Each of the electrode overlap areas may include the first layer and the second layer in plan view. A width of the second electrode end may be greater than or equal to 0.4 times the thirteenth pitch.

According to a tenth aspect of the present disclosure, a group of masks includes two or more masks, wherein each of the masks includes a blocking area and through-holes, when a mask stack in which the two or more masks are stacked is viewed in a direction normal to the masks, the mask stack includes a through area that overlaps the through-holes, when the mask stack is viewed in the direction normal to the masks, the mask stack includes a first mask area that includes the through area with a first open area ratio, and a second mask area that includes the through area with a second open area ratio less than the first open area ratio, the second mask area includes the through area, and overlap areas each surrounded by the through area in plan view, each of the overlap areas includes the blocking areas of the two or more masks in plan view, the overlap areas include a first overlap area, and a second overlap area adjacent to the first overlap area via the through area, the first overlap area has a first mask shape, and the second overlap area has a second mask shape different from the first mask shape.

According to an eleventh aspect of the present disclosure, in the group of the masks according to the above-described tenth aspect, an area of the first overlap area may be different from an area of the second overlap area.

According to a twentieth aspect of the present disclosure, in the group of the masks according to the above-described tenth aspect or the above-described eleventh aspect, the overlap areas may include a third overlap area adjacent to the first overlap area and the second overlap area via the through area. The third overlap area may have a third mask shape different from the first mask shape and different from the second mask shape.

According to a thirteenth aspect of the present disclosure, in the group of the masks according to any one of the above-described tenth aspect to the above-described twelfth aspect, the overlap areas may include a fourth overlap area adjacent to the first overlap area and the second overlap area via the through area. The fourth overlap area may have a fourth mask shape different from the first mask shape and different from the second mask shape.

According to a fourteenth aspect of the present disclosure, in the group of the masks according to any one of the above-described tenth aspect to the above-described thirteenth aspect, 80% or higher of the overlap areas may correspond to the first overlap area.

According to a fifteenth aspect of the present disclosure, in the group of the masks according to any one of the above-described tenth aspect to the above-described fourteenth aspect, in the second mask area, the through area may include a trunk area, and a branch area connected to the trunk area. The branch area may include two first area ends in a first hole direction, and one second area end in a second hole direction that intersects with the first hole direction. The two first area ends and the one second area end may be in contact with the overlap area.

According to a sixteenth aspect of the present disclosure, in the group of the masks according to the above-described fifteenth aspect, the first mask area may include hole overlap areas arranged at a twenty-seventh pitch in a second mask direction. Each of the hole overlap areas may include the through-holes of the two or more masks in plan view. A width of the first area end may be greater than or equal to 0.4 times the twenty-seventh pitch.

According to a seventeenth aspect of the present disclosure, in the group of the masks according to the above-described fifteenth aspect or the above-described sixteenth aspect, the first mask area may include hole overlap areas arranged at a seventeenth pitch in a first mask direction. Each of the hole overlap areas may include the through-holes of the two or more masks in plan view. A width of the second area end may be greater than or equal to 0.4 times the seventeenth pitch.

According to an eighteenth aspect of the present disclosure, a mask having a third mask direction and a fourth mask direction that intersects with the third mask direction includes a blocking area; and through-holes, wherein, when the mask is viewed in a direction normal to the mask, the mask includes a third mask area that includes the through-holes at a third open area ratio, and a fourth mask area that includes the through-holes at a fourth open area ratio less than the third open area ratio, in the third mask area, the through-holes are arranged at a thirty-fifth pitch in the third mask direction, and in the fourth mask area, an average of a distance between centers of the two through-holes arranged in the third mask direction is greater than or equal to 1.1 times the thirty-fifth pitch.

According to a nineteenth aspect of the present disclosure, in the mask according to the above-described eighteenth aspect, in the fourth mask area, a standard deviation of the distance between the centers of the two through-holes arranged in the third mask direction may be greater than or equal to 0.2 times the thirty-fifth pitch.

According to a twentieth aspect of the present disclosure, a manufacturing method for an organic device includes a second electrode forming step of forming a second electrode on organic layers respectively on first electrodes on a substrate by using the above-described group of the masks, wherein the second electrode forming step includes a step of forming a first layer of the second electrode by vapor deposition using a first one of the masks; and a step of forming a second layer of the second electrode by vapor deposition using a second one of the masks.

Hereinafter, an embodiment of the present disclosure will be described in detail with reference to the attached drawings. Embodiments described below are examples of the embodiment of the present disclosure, and the present disclosure should not be interpreted limitedly to only these embodiments.

Initially, an organic device 100 will be described. The organic device 100 includes an electrode formed by using a group of the masks according to the present embodiment. FIG. 1 is a plan view of an example of the organic device 100 when viewed in a direction normal to the substrate of the organic device 100. In the following description, a view in a direction normal to the surface of a substance that is a basis for the substrate or the like is also referred to as plan view.

The organic device 100 includes the substrate, and a plurality of elements 115 arranged in the in-plane direction of the substrate. The elements 115 are, for example, pixels. As shown in FIG. 1, the organic device 100 may include a first display area 101 and a second display area 102 in plan view. The second display area 102 may have a smaller area than the first display area 101. As shown in FIG. 1, the second display area 102 may be surrounded by the first display area 101. Although not shown in the drawing, part of the outer edge of the second display area 102 may be located in the same straight line with part of the outer edge of the first display area 101.

Figure 2:
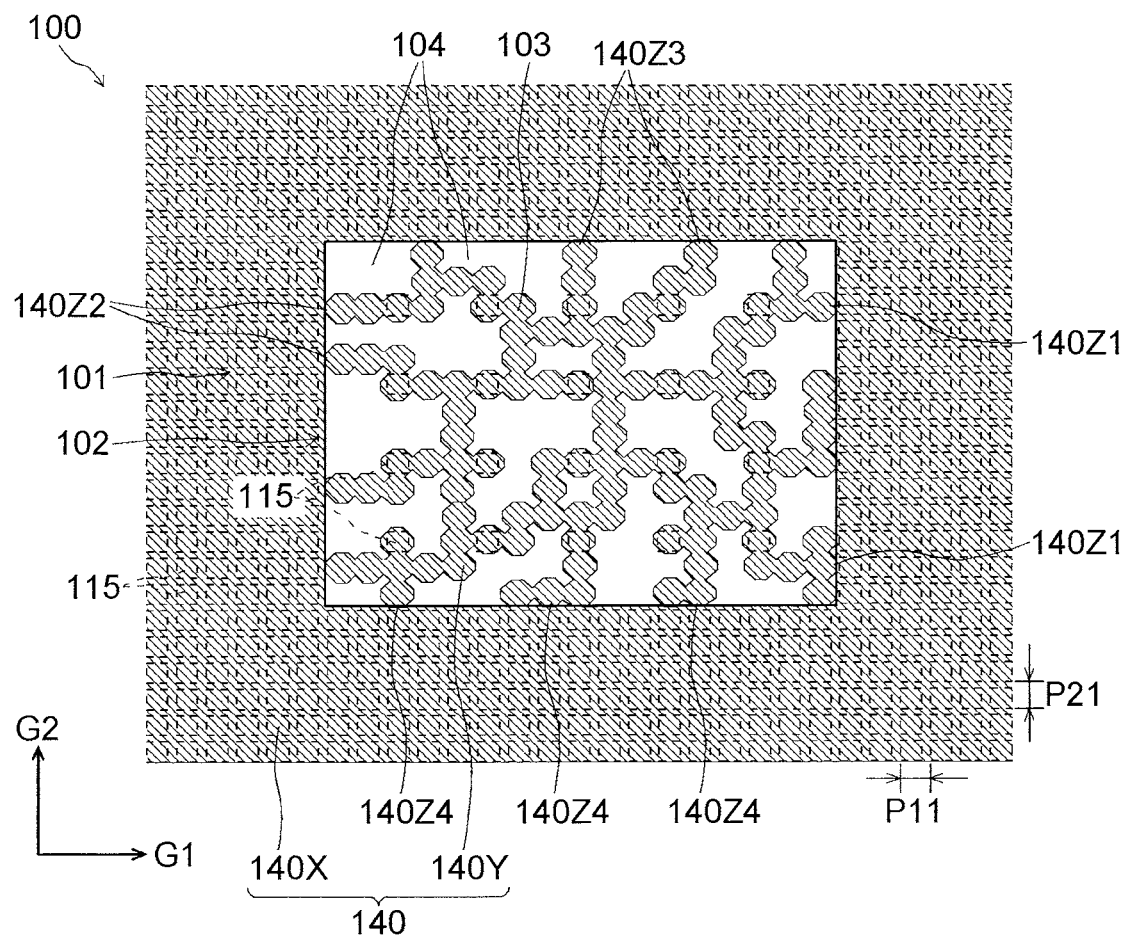
FIG. 2 is a plan view of a second display area of the organic device.

FIG. 2 is an enlarged plan view of the second display area 102 and its surroundings in FIG. 1. In the first display area 101, the elements 115 may be arranged in two different directions. In the example shown in FIGS. 1 and 2, the two or more elements 115 of the first display area 101 may be arranged in a first element direction G1. The two or more elements 115 of the first display area 101 may be arranged in a second element direction G2 that intersects with the first element direction G1. The second element direction G2 may be orthogonal to the first element direction G1.

The organic device 100 includes a second electrode 140. The second electrode 140 is located on organic layers 130 (described later). The second electrode 140 may be electrically connected to the two or more organic layers 130. For example, the second electrode 140 may overlap the two or more organic layers 130 in plan view. The second electrode 140 located in the first display area 101 is also referred to as second electrode 140X. The second electrode 140 located in the second display area 102 is also referred to as second electrode 140Y.

The second electrode 140X has a first occupancy. The first occupancy is calculated by dividing the total area of the second electrode 140 located in the first display area 101 by the area of the first display area 101. The second electrode 140Y has a second occupancy. The second occupancy is calculated by dividing the total area of the second electrode 140 located in the second display area 102 by the area of the second display area 102. The second occupancy may be lower than the first occupancy. For example, as shown in FIG. 2, the second display area 102 may include non-transmission areas 103 and transmission areas 104. The transmission areas 104 do not overlap the second electrode 140Y in plan view. Each of the transmission areas 104 may be surrounded by the second electrode 140Y in plan view. The non-transmission areas 103 overlap the second electrode 140Y in plan view.

The ratio of the second occupancy to the first occupancy, for example, may be greater than or equal to 0.2, may be greater than or equal to 0.3, or may be greater than or equal to 0.4. The ratio of the second occupancy to the first occupancy, for example, may be less than or equal to 0.6, may be less than or equal to 0.7, or may be less than or equal to 0.8. The range of the ratio of the second occupancy to the first occupancy may be determined by a first group consisting of 0.2, 0.3, and 0.4, and/or a second group consisting of 0.6, 0.7, and 0.8. The range of the ratio of the second occupancy to the first occupancy may be determined by a combination of any one of the values in the first group and any one of the values in the second group. The range of the ratio of the second occupancy to the first occupancy may be determined by a combination of any two of the values in the first group. The range of the ratio of the second occupancy to the first occupancy may be determined by a combination of any two of the values in the second group. For example, the ratio of the second occupancy to the first occupancy may be greater than or equal to 0.2 and less than or equal to 0.8, may be greater than or equal to 0.2 and less than or equal to 0.7, may be greater than or equal to 0.2 and less than or equal to 0.6, may be greater than or equal to 0.2 and less than or equal to 0.4, may be greater than or equal to 0.2 and less than or equal to 0.3, may be greater than or equal to 0.3 and less than or equal to 0.8, may be greater than or equal to 0.3 and less than or equal to 0.7, may be greater than or equal to 0.3 and less than or equal to 0.6, may be greater than or equal to 0.3 and less than or equal to 0.4, may be greater than or equal to 0.4 and less than or equal to 0.8, may be greater than or equal to 0.4 and less than or equal to 0.7, may be greater than or equal to 0.4 and less than or equal to 0.6, may be greater than or equal to 0.6 and less than or equal to 0.8, may be greater than or equal to 0.6 and less than or equal to 0.7, or may be greater than or equal to 0.7 and less than or equal to 0.8.

The transmittance of the non-transmission areas 103 is also referred to as first transmittance. The transmittance of the transmission areas 104 is also referred to as second transmittance. Since the transmission areas 104 do not include the second electrode 140Y, the second transmittance is higher than the first transmittance. Therefore, in the second display area 102 that includes the transmission areas 104, light having reached the organic device 100 is able to pass through the transmission areas 104 and reach an optical component or the like on the back side of the substrate. The optical component is a component of, for example, a camera or the like that implements a function by detecting light. Since the second display area 102 includes the non-transmission areas 103, when the elements 115 are pixels, a video is able to be displayed in the second display area 102. In this way, the second display area 102 is able to detect light and display a video. Examples of the function of the second display area 102, implemented by detecting light, include sensors, such as a camera, a fingerprint sensor, and a face recognition sensor. As the second transmittance of the transmission areas 104 of the second display area 102 increases and the second occupancy decreases, the amount of light received by the sensor is able to be increased.

When any one of the size of each non-transmission area 103 in each of the first element direction G1 and the second element direction G2 and the size of each transmission area 104 in each of the first element direction G1 and the second element direction G2 is less than or equal to 1 mm, the first transmittance and the second transmittance are measured by using a microspectrophotometer. Any one of OSP-SP200 made by Olympus Corporation and LCF series made by Otsuka Electronics Co., Ltd. can be used as the microspectrophotometer. Any of the microspectrophotometers is capable of measuring a transmittance in a visible range greater than or equal to 380 nm and less than or equal to 780 nm. Any one of quartz, borosilicate glass for TFT liquid crystal, and non-alkali glass for TFT liquid crystal is used as a reference. Measurement results at 550 nm are used as the first transmittance and the second transmittance. When both the size of each non-transmission area 103 in each of the first element direction G1 and the second element direction G2 and the size of each transmission area 104 in each of the first element direction G1 and the second element direction G2 are greater than 1 mm, the first transmittance and the second transmittance are measured by using a spectrophotometer. Any one of ultraviolet and visible spectrophotometers UV-2600i and UV-3600i Plus made by Shimadzu Corporation can be used as the spectrophotometer. When a micro beam lens unit is attached to the spectrophotometer, the transmittance of an area with a size of up to 1 mm is able to be measured. Atmosphere is used as a reference. Measurement results at 550 nm are used as the first transmittance and the second transmittance.

TR2/TR1 that is the ratio of a second transmittance TR2 to a first transmittance TR1, for example, may be greater than or equal to 1.2, may be greater than or equal to 1.5, or may be greater than or equal to 1.8. TR2/TR1, for example, may be less than or equal to two, may be less than or equal to three, or may be less than or equal to four. The range of TR2/TR1 may be determined by a first group consisting of 1.2, 1.5, and 1.8 and/or a second group consisting of two, three, and four. The range of TR2/TR1 may be determined by a combination of any one of the values in the first group and any one of the values in the second group. The range of TR2/TR1 may be determined by a combination of any two of the values in the first group. The range of TR2/TR1 may be determined by a combination of any two of the values in the second group. For example, TR2/TR1 may be greater than or equal to 1.2 and less than or equal to four, may be greater than or equal to 1.2 and less than or equal to three, may be greater than or equal to 1.2 and less than or equal to two, may be greater than or equal to 1.2 and less than or equal to 1.8, may be greater than or equal to 1.2 and less than or equal to 1.5, may be greater than or equal to 1.5 and less than or equal to four, may be greater than or equal to 1.5 and less than or equal to three, may be greater than or equal to 1.5 and less than or equal to two, may be greater than or equal to 1.5 and less than or equal to 1.8, may be greater than or equal to 1.8 and less than or equal to four, may be greater than or equal to 1.8 and less than or equal to three, may be greater than or equal to 1.8 and less than or equal to two, may be greater than or equal to two and less than or equal to four, may be greater than or equal to two and less than or equal to three, or may be greater than or equal to three and less than or equal to four.

As shown in FIG. 2, the second electrode 140 may have electrode connection ends. The electrode connection ends connect the second electrode 140Y to the second electrode 140X. Each of the electrode connection ends corresponds to the boundary between the second electrode 140X and the second electrode 140Y. The electrode connection ends may include a first electrode connection end 140Z1, a second electrode connection end 140Z2, a third electrode connection end 140Z3, and a fourth electrode connection end 140Z4. The first electrode connection end 140Z1 is located at one of the boundaries in the first element direction G1. The second electrode connection end 140Z2 is located at the other one of the boundaries in the first element direction G1. The third electrode connection end 140Z3 is located at one of the boundaries in the second element direction G2. The fourth electrode connection end 140Z4 is located at the other one of the boundaries in the second element direction G2. In the example shown in FIG. 2, a boundary line that defines one of the boundaries in the first element direction G1 extends in the second element direction G2. Therefore, the angle formed by the boundary line that defines one of the boundaries in the first element direction G1 and the first element direction G1 is 90°. Although not shown in the drawing, the boundary line that defines one of the boundaries in the first element direction G1 does not need to be a straight line. When, for example, the outline of the second display area 102 is a circle, the boundary line that defines one of the boundaries in the first element direction G1 is a circular arc. In this case, the angle formed by the boundary line that defines one of the boundaries in the first element direction G1 and the first element direction G1 is greater than 45° and less than or equal to 90°. In other words, a boundary line that has an angle of greater than 45° and less than or equal to 90° with respect to the first element direction G1 and that is located on one side in the first element direction G1 may be determined as one of the boundaries in the first element direction G1. Similarly, a boundary line that has an angle of greater than 45° and less than or equal to 90° with respect to the first element direction G1 and that is located on the other side in the first element direction G1 may be determined as the other one of the boundaries in the first element direction G1. A boundary line that has an angle of greater than 45° and less than or equal to 90° with respect to the second element direction G2 and that is located on one side in the second element direction G2 may be determined as one of the boundaries in the second element direction G2. A boundary line that has an angle of greater than 45° and less than or equal to 90° with respect to the second element direction G2 and that is t located on the other side in the second element direction G2 may be determined as the other one of the boundaries in the second element direction G2.

As shown in FIG. 2, the second electrode 140Y of the second display area 102 may include an area that is continuous from one of the electrode connection ends to the other one of the electrode connection ends. For example, the second electrode 140Y may have the following areas. The areas may overlap each other. The second electrode 140Y may have all the areas of the following types. The second electrode 140Y may include one or some of the areas of the following types.

An area continuous from the first electrode connection end 140Z1 to the second electrode connection end 140Z2

An area continuous from the first electrode connection end 140Z1 to the third electrode connection end 140Z3

An area continuous from the first electrode connection end 140Z1 to the fourth electrode connection end 140Z4

An area continuous from the second electrode connection end 140Z2 to the third electrode connection end 140Z3

An area continuous from the second electrode connection end 140Z2 to the fourth electrode connection end 140Z4

An area continuous from the third electrode connection end 140Z3 to the fourth electrode connection end 140Z4

Figure 3:
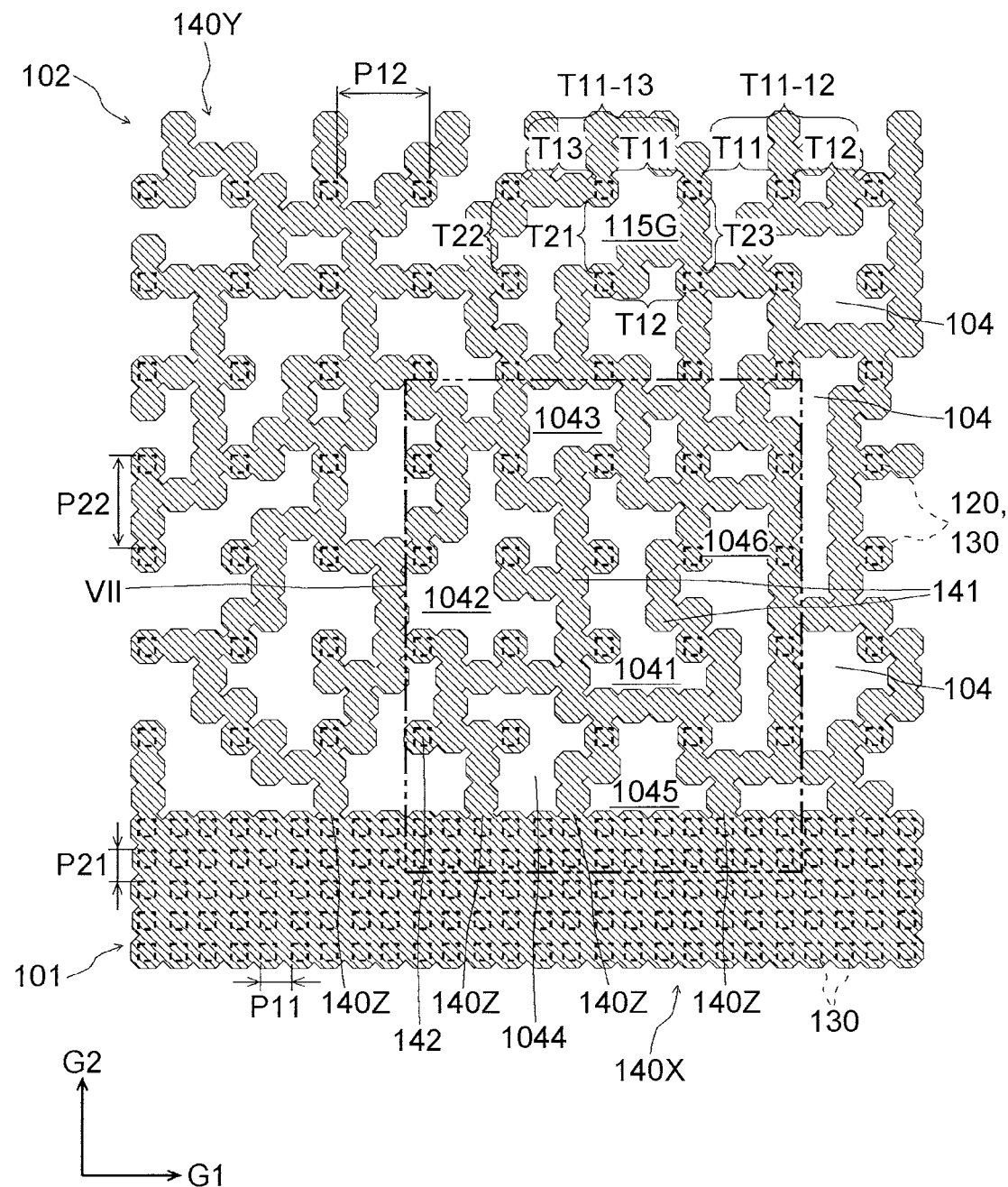
FIG. 3 is a plan view of an example of a second electrode in the second display area.

FIG. 3 is an enlarged plan view of the second electrode 140X of the first display area 101 and the second electrode 140Y of the second display area 102. Each of the second electrode 140X and the second electrode 140Y may overlap the organic layers 130 in plan view. The organic layer 130 is one component of the element 115.

In the first display area 101, the organic layers 130 may be arranged at an eleventh pitch P11 in the first element direction G1. In the second display area 102, the organic layers 130 may be arranged at a twelfth pitch P12 in the first element direction G1. The twelfth pitch P12 may be greater than the eleventh pitch P11. As will be described later, the twelfth pitch P12 may be the same as the eleventh pitch P11.

The ratio of the twelfth pitch P12 to the eleventh pitch P11, for example, may be greater than or equal to 1.0, may be greater than or equal to 1.1, may be greater than or equal to 1.3, or may be greater than or equal to 1.5. The ratio of the twelfth pitch P12 to the eleventh pitch P11, for example, may be less than or equal to 2.0, may be less than or equal to 3.0, or may be less than or equal to 4.0. The range of the ratio of the twelfth pitch P12 to the eleventh pitch P11 may be determined by a first group consisting of 1.0, 1.1, 1.3, and 1.5 and/or a second group consisting of 2.0, 3.0, and 4.0. The range of the ratio of the twelfth pitch P12 to the eleventh pitch P11 may be determined by a combination of any one of the values in the first group and any one of the values in the second group. The range of the ratio of the twelfth pitch P12 to the eleventh pitch P11 may be determined by a combination of any two of the values in the first group. The range of the ratio of the twelfth pitch P12 to the eleventh pitch P11 may be determined by a combination of any two of the values in the second group. For example, the ratio of the twelfth pitch P12 to the eleventh pitch P11 may be greater than or equal to 1.0 and less than or equal to 4.0, may be greater than or equal to 1.0 and less than or equal to 3.0, may be greater than or equal to 1.0 and less than or equal to 2.0, may be greater than or equal to 1.0 and less than or equal to 1.5, may be greater than or equal to 1.0 and less than or equal to 1.3, may be greater than or equal to 1.0 and less than or equal to 1.1, may be greater than or equal to 1.1 and less than or equal to 4.0, may be greater than or equal to 1.1 and less than or equal to 3.0, may be greater than or equal to 1.1 and less than or equal to 2.0, may be greater than or equal to 1.1 and less than or equal to 1.5, may be greater than or equal to 1.1 and less than or equal to 1.3, may be greater than or equal to 1.3 and less than or equal to 4.0, may be greater than or equal to 1.3 and less than or equal to 3.0, may be greater than or equal to 1.3 and less than or equal to 2.0, may be greater than or equal to 1.3 and less than or equal to 1.5, may be greater than or equal to 1.5 and less than or equal to 4.0, may be greater than or equal to 1.5 and less than or equal to 3.0, may be greater than or equal to 1.5 and less than or equal to 2.0, may be greater than or equal to 2.0 and less than or equal to 4.0, may be greater than or equal to 2.0 and less than or equal to 3.0, or may be greater than or equal to 3.0 and less than or equal to 4.0. When the ratio of the twelfth pitch P12 to the eleventh pitch P11 is small, the difference of the pixel density of the second display area 102 from the pixel density of the first display area 101 reduces. Thus, it is possible to reduce the visual difference between the first display area 101 and the second display area 102.

In the first display area 101, the organic layers 130 may be arranged at a twenty-first pitch P21 in the second element direction G2. In the second display area 102, the organic layers 130 may be arranged at a twenty-second pitch P22 in the second element direction G2. The twenty-second pitch P22 may be greater than the twenty-first pitch P21. As will be described later, the twenty-second pitch P22 may be the same as the twenty-first pitch P21.

The ratio of the twenty-second pitch P22 to the twenty-first pitch P21, for example, may be greater than or equal to 1.0, may be greater than or equal to 1.1, may be greater than or equal to 1.3, or may be greater than or equal to 1.5. The ratio of the twenty-second pitch P22 to the twenty-first pitch P21, for example, may be less than or equal to 2.0, may be less than or equal to 3.0, or may be less than or equal to 4.0. The range of the ratio of the twenty-second pitch P22 to the twenty-first pitch P21 may be determined by a first group consisting of 1.0, 1.1, 1.3, and 1.5 and/or a second group consisting of 2.0, 3.0, and 4.0. The range of the ratio of the twenty-second pitch P22 to the twenty-first pitch P21 may be determined by a combination of any one of the values in the first group and any one of the values in the second group. The range of the ratio of the twenty-second pitch P22 to the twenty-first pitch P21 may be determined by a combination of any two of the values in the first group. The range of the ratio of the twenty-second pitch P22 to the twenty-first pitch P21 may be determined by a combination of any two of the values in the second group. For example, the ratio of the twenty-second pitch P22 to the twenty-first pitch P21 may be greater than or equal to 1.0 and less than or equal to 4.0, may be greater than or equal to 1.0 and less than or equal to 3.0, may be greater than or equal to 1.0 and less than or equal to 2.0, may be greater than or equal to 1.0 and less than or equal to 1.5, may be greater than or equal to 1.0 and less than or equal to 1.3, may be greater than or equal to 1.0 and less than or equal to 1.1, may be greater than or equal to 1.1 and less than or equal to 4.0, may be greater than or equal to 1.1 and less than or equal to 3.0, may be greater than or equal to 1.1 and less than or equal to 2.0, may be greater than or equal to 1.1 and less than or equal to 1.5, may be greater than or equal to 1.1 and less than or equal to 1.3, may be greater than or equal to 1.3 and less than or equal to 4.0, may be greater than or equal to 1.3 and less than or equal to 3.0, may be greater than or equal to 1.3 and less than or equal to 2.0, may be greater than or equal to 1.3 and less than or equal to 1.5, may be greater than or equal to 1.5 and less than or equal to 4.0, may be greater than or equal to 1.5 and less than or equal to 3.0, may be greater than or equal to 1.5 and less than or equal to 2.0, may be greater than or equal to 2.0 and less than or equal to 4.0, may be greater than or equal to 2.0 and less than or equal to 3.0, or may be greater than or equal to 3.0 and less than or equal to 4.0. When the ratio of the twenty-second pitch P22 to the twenty-first pitch P21 is small, the difference of the pixel density of the second display area 102 from the pixel density of the first display area 101 reduces. Thus, it is possible to reduce the visual difference between the first display area 101 and the second display area 102.

As shown in FIG. 3, the second electrode 140Y may be disposed irregularly. Thus, each transmission area 104 surrounded by the second electrode 140Y may have an irregular shape. Thus, it is possible to reduce constructive interference between light waves diffracted at the time of passing through the transmission areas 104. Therefore, it is possible to reduce entry of high-intensity diffracted light into the sensor. Thus, for example, it is possible to reduce blurring of an image generated by the sensor.

An example of the irregular shape will be described. As shown in FIG. 3, the transmission areas 104 may include a first transmission area 1041 and a second transmission area 1042. The second transmission area 1042 is adjacent to the first transmission area 1041 via the second electrode 140Y. The first transmission area 1041 has a first shape. The second transmission area 1042 may have a second shape different from the first shape. A specific difference between the first shape and the second shape is selected. For example, the area of the second shape may be different from the area of the first shape.

Figure 4:
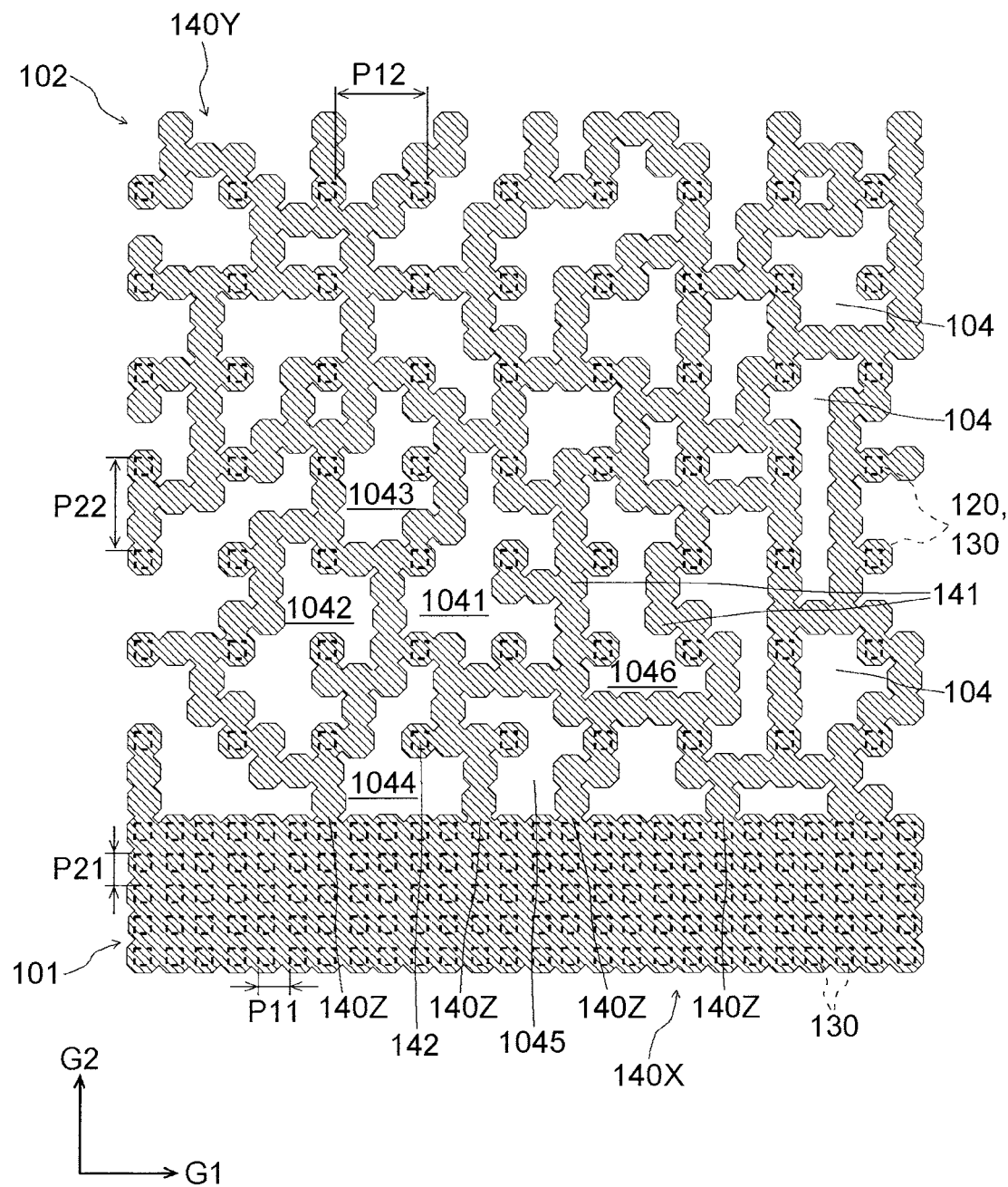
FIG. 4 is a plan view of an example of a manner of classifying transmission areas of the second display area.

The first transmission area 1041 does not need to be a term that indicates a specific transmission area 104. For example, as shown in FIG. 4, the transmission area 104 different from the first transmission area 1041 in the case of FIG. 3 may correspond to the first transmission area 1041. The shapes of the second electrode 140 and transmission areas 104 shown in FIG. 4 are the same as the shapes of the second electrode 140 and transmission areas 104 shown in FIG. 3. In the example of FIG. 4 as well, there is the transmission area 104 adjacent to the first transmission area 1041 via the second electrode 140Y and having a shape different from that of the first transmission area 1041. In other words, in the example of FIG. 4 as well, there is the transmission area 104 that corresponds to the second transmission area 1042 in relation to the first transmission area 1041. In this way, when the adjacent two of the transmission areas 104 via the second electrode 140 have different shapes from each other, one of the transmission areas 104 may be referred to as the first transmission area 1041, and the other one of the transmission areas 104 may be referred to as the second transmission area 1042. When only the plurality of transmission areas 104 having the same shape is present around a target one transmission area 104, the target one transmission area 104 is not referred to as the first transmission area 1041.

The second display area 102 may have a first applicable percentage. The first applicable percentage is the percentage of a first applicable number to the total number of the transmission areas 104. The first applicable number is the number of the transmission areas 104 that can be referred to as the first transmission area 1041 in relation to the second transmission area 1042. The first applicable percentage, for example, may be higher than or equal to 80%, may be higher than or equal to 85%, or may be higher than or equal to 90%. The first applicable percentage, for example, may be lower than or equal to 95%, may be lower than or equal to 97%, or may be lower than or equal to 99%. The range of the first applicable percentage may be determined by a first group consisting of 80%, 85%, and 90% and/or a second group consisting of 95%, 97%, and 99%. The range of the first applicable percentage may be determined by a combination of any one of the values in the first group and any one of the values in the second group. The range of the first applicable percentage may be determined by a combination of any two of the values in the first group. The range of the first applicable percentage may be determined by a combination of any two of the values in the second group. For example, the first applicable percentage may be higher than or equal to 80% and lower than or equal to 99%, may be higher than or equal to 80% and lower than or equal to 97%, may be higher than or equal to 80% and lower than or equal to 95%, may be higher than or equal to 80% and lower than or equal to 90%, may be higher than or equal to 80% and lower than or equal to 85%, may be higher than or equal to 85% and lower than or equal to 99%, may be higher than or equal to 85% and lower than or equal to 97%, may be higher than or equal to 85% and lower than or equal to 95%, may be higher than or equal to 85% and lower than or equal to 90%, may be higher than or equal to 90% and lower than or equal to 99%, may be higher than or equal to 90% and lower than or equal to 97%, may be higher than or equal to 90% and lower than or equal to 95%, may be higher than or equal to 95% and lower than or equal to 99%, may be higher than or equal to 95% and lower than or equal to 97%, or may be higher than or equal to 97% and lower than or equal to 99%.

The second transmission area 1042 may be adjacent to the first transmission area 1041 via the first electrode 120 and the second electrode 140Y. In the example shown in FIGS. 3 and 4, the second transmission area 1042 is adjacent to the first transmission area 1041 via the first electrode 120 and the second electrode 140Y in the first element direction G1.

As shown in FIGS. 3 and 4, the transmission areas 104 may include a third transmission area 1043. The third transmission area 1043 is adjacent to the first transmission area 1041 and the second transmission area 1042 via the second electrode 140Y. The third transmission area 1043 may have a third shape different from the first shape and different from the second shape. For example, the area of the third shape may be different from the area of the first shape and different from the area of the second shape.

The second display area 102 may have a second applicable percentage. The second applicable percentage is the percentage of a second applicable number to the total number of the transmission areas 104. The second applicable number is the number of the transmission areas 104 that can be referred to as the first transmission area 1041 in relation to the second transmission area 1042 and the third transmission area 1043. The above-described range of the first applicable percentage may be adopted as the range of the second applicable percentage.

The third transmission area 1043 may be adjacent to the first transmission area 1041 via the first electrode 120 and the second electrode 140Y. In the example shown in FIGS. 3 and 4, the third transmission area 1043 is adjacent to the first transmission area 1041 via the first electrode 120 and the second electrode 140Y in the second element direction G2.

As shown in FIGS. 3 and 4, the transmission areas 104 may include a fourth transmission area 1044. The fourth transmission area 1044 is adjacent to the first transmission area 1041 and the second transmission area 1042 via the second electrode 140Y. The fourth transmission area 1044 may have a fourth shape different from the first shape and different from the second shape. For example, the area of the fourth shape may be different from the area of the first shape and different from the area of the second shape. The fourth shape may be different from the third shape.

The second display area 102 may have a third applicable percentage. The third applicable percentage is the percentage of a third applicable number to the total number of the transmission areas 104. The third applicable number is the number of the transmission areas 104 that can be referred to as the first transmission area 1041 in relation to the second transmission area 1042, the third transmission area 1043, and the fourth transmission area 1044. The above-described range of the first applicable percentage may be adopted as the range of the third applicable percentage.

The fourth transmission area 1044 may be adjacent to the first transmission area 1041 via the first electrode 120 and the second electrode 140Y. In the example shown in FIG. 4, the fourth transmission area 1044 is adjacent to the first transmission area 1041 via the first electrode 120 and the second electrode 140Y in the second element direction G2.

As shown in FIGS. 3 and 4, the transmission areas 104 may include a fifth transmission area 1045. The fifth transmission area 1045 is adjacent to the first transmission area 1041 via the second electrode 140Y. The fifth transmission area 1045 is adjacent to the fourth transmission area 1044 via the second electrode 140Y. The fifth transmission area 1045 may have a fifth shape different from the first shape. For example, the area of the fifth shape may be different from the area of the first shape. The fifth shape may be different from the second shape, different from the third shape, and different from the fourth shape.

The second display area 102 may have a fourth applicable percentage. The fourth applicable percentage is the percentage of a fourth applicable number to the total number of the transmission areas 104. The fourth applicable number is the number of the transmission areas 104 that can be referred to as the first transmission area 1041 in relation to the second transmission area 1042, the third transmission area 1043, the fourth transmission area 1044, and the fifth transmission area 1045. The above-described range of the first applicable percentage may be adopted as the range of the fourth applicable percentage.

The fifth transmission area 1045 may be adjacent to the first transmission area 1041 via the first electrode 120 and the second electrode 140Y. In the example shown in FIGS. 3 and 4, the fifth transmission area 1045 is adjacent to the first transmission area 1041 via the first electrode 120 and the second electrode 140Y in the second element direction G2.

As shown in FIGS. 3 and 4, the transmission areas 104 may include a sixth transmission area 1046. The sixth transmission area 1046 is adjacent to the first transmission area 1041 via the second electrode 140Y. The sixth transmission area 1046 may have a sixth shape different from the first shape. For example, the area of the sixth shape may be different from the area of the first shape. The sixth shape may be different from the second shape, different from the third shape, different from the fourth shape, and different from the fifth shape.

The second display area 102 may have a fifth applicable percentage. The fifth applicable percentage is the percentage of a fifth applicable number to the total number of the transmission areas 104. The fifth applicable number is the number of the transmission areas 104 that can be referred to as the first transmission area 1041 in relation to the second transmission area 1042, the third transmission area 1043, the fourth transmission area 1044, the fifth transmission area 1045, and the sixth transmission area 1046. The above-described range of the first applicable percentage may be adopted as the range of the fifth applicable percentage.

The sixth transmission area 1046 may be adjacent to the first transmission area 1041 via the first electrode 120 and the second electrode 140Y. In the example shown in FIGS. 3 and 4, the sixth transmission area 1046 is adjacent to the first transmission area 1041 via the first electrode 120 and the second electrode 140Y in the first element direction G1.

Two of the transmission areas 104 having different shapes may be adjacent to each other via the first electrode 120 and the second electrode 140Y in a direction in which the plurality of first electrodes 120 is arranged regularly. In the example shown in FIG. 4, as described above, the first transmission area 1041 and the second transmission area 1042 are adjacent to each other and the first transmission area 1041 and the sixth transmission area 1046 are adjacent to each other in the first element direction G1. In the example shown in FIG. 4, as described above, the first transmission area 1041 and the third transmission area 1043 are adjacent to each other, the first transmission area 1041 and the fourth transmission area 1044 are adjacent to each other, and the first transmission area 1041 and the fifth transmission area 1045 are adjacent to each other in the second element direction G2.

According to the present embodiment, it is possible to reduce constructive interference between light waves diffracted rays of light diffracted at the time of passing through the transmission areas 104 in the direction in which the plurality of first electrodes 120 is arranged regularly.

As shown in FIG. 3, the second electrode 140Y or the transmission area 104 is present between any adjacent two of the organic layers 130 in the first element direction G1 or the second element direction G2. The configuration of the second display area 102 in the area between any adjacent two of the organic layers 130 in plan view may be classified as an eleventh type T11, a twelfth type T12, a thirteenth type T13, a twenty-first type T21, a twenty-second type T22, or a twenty-third type T23. The eleventh type T11 includes the transmission area 104 having a size greater than or equal to 0.5 times the twelfth pitch P12 in the first element direction G1 between the adjacent two organic layers 130 in the first element direction G1. The twelfth type T12 includes the transmission area 104 having a size less than 0.5 times the twelfth pitch P12 in the first element direction G1 between the adjacent two organic layers 130 in the first element direction G1. The thirteenth type T13 includes the second electrode 140Y continuously extending in the first element direction G1 between the adjacent two organic layers 130 in the first element direction G1. The twenty-first type T21 includes the transmission area 104 having a size greater than or equal to 0.5 times the twenty-second pitch P22 in the second element direction G2 between the adjacent two organic layers 130 in the second element direction G2. The twenty-second type T22 includes the transmission area 104 having a size less than 0.5 times the twenty-second pitch P22 in the second element direction G2 between the adjacent two organic layers 130 in the second element direction G2. The twenty-third type T23 includes the second electrode 140Y continuously extending in the second element direction G2 between the adjacent two organic layers 130 in the second element direction G2. Although not shown in the drawing, the configuration of the second display area 102 between the adjacent two organic layers 130 may be classified as another type.

The thirteenth type T13 and the twenty-third type T23 are preferably not locally concentrated. For example, a pixel group 115G that includes four organic layers 130 preferably includes any one of the eleventh type T11, the twelfth type T12, the twenty-first type T21, and the twenty-second type T22. When the pixel group 115G includes any one of the eleventh type T11, the twelfth type T12, the twenty-first type T21, and the twenty-second type T22, the second electrode 140Y is split at a location in the path that connects the four organic layers 130 in the first element direction G1 or the second element direction G2 in plan view. In other words, the path that connects the four organic layers 130 partially includes the transmission area 104. Thus, it is possible to reduce constructive interference between light waves diffracted at the time of passing through the transmission areas 104. The pixel group 115G that includes any one of the eleventh type T11, the twelfth type T12, the twenty-first type T21, and the twenty-second type T22 is also referred to as split pixel group.

Figure 5:
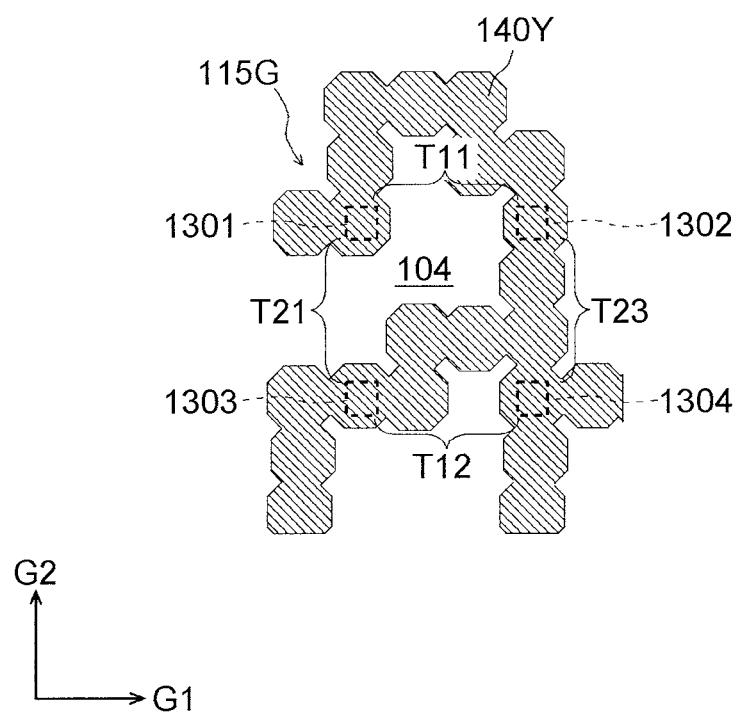
FIG. 5 is a plan view showing an example of a pixel group.

FIG. 5 is an enlarged diagram of part of FIG. 3. The pixel group 115G includes a first organic layer 1301, a second organic layer 1302, a third organic layer 1303, and a fourth organic layer 1304. The first organic layer 1301 and the second organic layer 1302 are adjacent to each other in the first element direction G1. The third organic layer 1303 and the fourth organic layer 1304 are adjacent to each other in the first element direction G1. The first organic layer 1301 and the third organic layer 1303 are adjacent to each other in the second element direction G2. The second organic layer 1302 and the fourth organic layer 1304 are adjacent to each other in the second element direction G2.

The area between the first organic layer 1301 and the second organic layer 1302 is made up of the eleventh type T11. The area between the third organic layer 1303 and the fourth organic layer 1304 is made up of the twelfth type T12. The area between the first organic layer 1301 and the third organic layer 1303 is made up of the twenty-first type T21. The area between the second organic layer 1302 and the fourth organic layer 1304 is made up of the twenty-third type T23.

The second display area 102 may have a first split percentage. The first split percentage is the percentage of the first split number to the total number of the pixel groups 115G present in the second display area 102. The first split number is the number of the pixel groups 115G that each include any one of the eleventh type T11, the twelfth type T12, the twenty-first type T21, and the twenty-second type T22. The first split percentage, for example, may be higher than or equal to 80%, may be higher than or equal to 85%, or may be higher than or equal to 90%. The first split percentage, for example, may be lower than or equal to 95%, may be lower than or equal to 97%, or may be lower than or equal to 99%. The range of the first split percentage may be determined by a first group consisting of 80%, 85%, and 90% and/or a second group consisting of 95%, 97%, and 99%. The range of the first split percentage may be determined by a combination of any one of the values in the first group and any one of the values in the second group. The range of the first split percentage may be determined by a combination of any two of the values in the first group. The range of the first split percentage may be determined by a combination of any two of the values in the second group. For example, the first split percentage may be higher than or equal to 80% and lower than or equal to 99%, may be higher than or equal to 80% and lower than or equal to 97%, may be higher than or equal to 80% and lower than or equal to 95%, may be higher than or equal to 80% and lower than or equal to 90%, may be higher than or equal to 80% and lower than or equal to 85%, may be higher than or equal to 85% and lower than or equal to 99%, may be higher than or equal to 85% and lower than or equal to 97%, may be higher than or equal to 85% and lower than or equal to 95%, may be higher than or equal to 85% and lower than or equal to 90%, may be higher than or equal to 90% and lower than or equal to 99%, may be higher than or equal to 90% and lower than or equal to 97%, may be higher than or equal to 90% and lower than or equal to 95%, may be higher than or equal to 95% and lower than or equal to 99%, may be higher than or equal to 95% and lower than or equal to 97%, or may be higher than or equal to 97% and lower than or equal to 99%.

As shown in FIG. 3, the second display area 102 may include an eleventh-twelfth array T11-12 in which the eleventh type T11 and the twelfth type T12 are arranged in the first element direction G1. The second display area 102 may include an eleventh-thirteenth array T11-13 in which the eleventh type T11 and the thirteenth type T13 are arranged in the first element direction G1. The second display area 102 may include a twelfth-thirteenth array in which the twelfth type T12 and the thirteenth type T13 are arranged in the first element direction G1. The second display area 102 may include a twenty-first-twenty-second array in which the twenty-first type T21 and the twenty-second type T22 are arranged in the second element direction G2. The second display area 102 may include a twenty-first-twenty-third array in which the twenty-first type T21 and the twenty-third type T23 are arranged in the second element direction G2. The second display area 102 may include a twenty-second-twenty-third array in which the twenty-second type T22 and the twenty-third type T23 are arranged in the second element direction G2.

As shown in FIGS. 3 and 4, the second electrode 140Y may include trunk electrodes 141 and branch electrodes 142. Each of the trunk electrodes 141 makes up a path from one electrode connection end to another one electrode connection end. Each of the branch electrodes 142 is connected to any one of the trunk electrodes 141.

Figure 6:
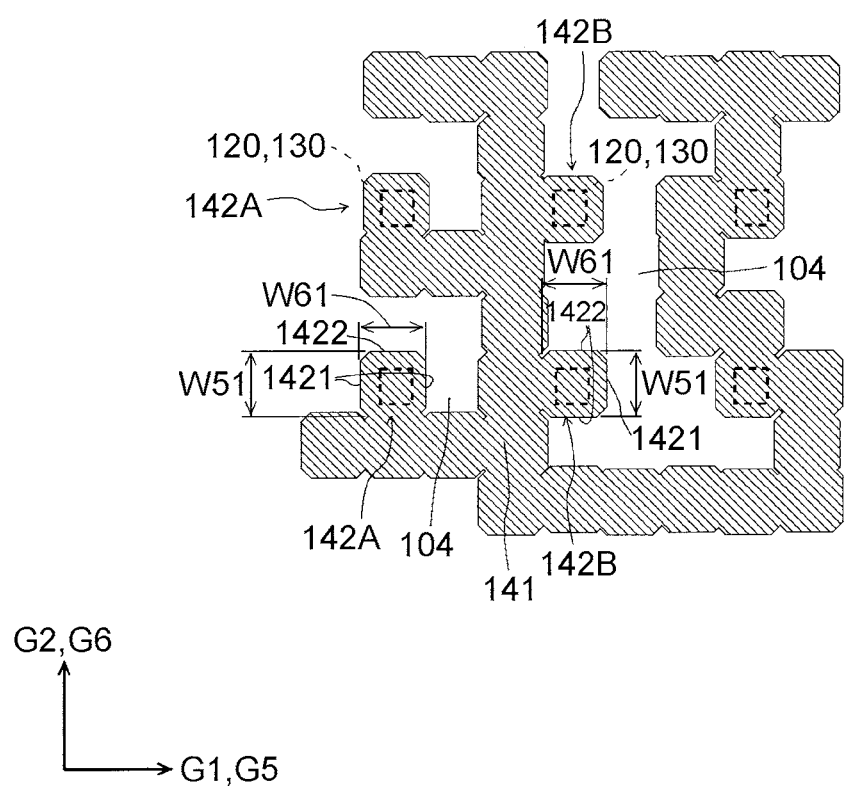
FIG. 6 is a plan view of examples of a branch electrode of the second electrode.

FIG. 6 is a plan view of examples of the branch electrode 142. The branch electrode 142 may be a first branch electrode 142A or a second branch electrode 142B.

The first branch electrode 142A has two first electrode ends 1421 and one second electrode end 1422. The first electrode end 1421 is an end of the branch electrode 142 in a fifth electrode direction G5. The two first electrode ends 1421 are opposite in the fifth electrode direction G5. The fifth electrode direction G5 may be parallel to the first element direction G1. Although not shown in the drawing, the fifth electrode direction G5 does not need to be parallel to the first element direction G1. The second electrode end 1422 is an end of the branch electrode 142 in a sixth electrode direction G6. The sixth electrode direction G6 intersects with the fifth electrode direction G5. The sixth electrode direction G6 may be orthogonal to the fifth electrode direction G5. The two first electrode ends 1421 and the one second electrode end 1422 are in contact with the transmission area 104.

The second branch electrode 142B includes one first electrode end 1421 and two second electrode ends 1422. The two second electrode ends 1422 are opposite in the sixth electrode direction G6. The one first electrode end 1421 and the two second electrode ends 1422 are in contact with the transmission area 104.

The width W51 of the first electrode end 1421 may have a constant ratio to the twenty-first pitch P21. The ratio of the width W51 to the twenty-first pitch P21, for example, may be greater than or equal to 0.4, may be greater than or equal to 0.6, or may be greater than or equal to 0.8. The ratio of the width W51 to the twenty-first pitch P21, for example, may be less than or equal to 1.2, may be less than or equal to 1.4, or may be less than or equal to 1.6. The range of the ratio of the width W51 to the twenty-first pitch P21 may be determined by a first group consisting of 0.4, 0.6, and 0.8 and/or a second group consisting of 1.2, 1.4, and 1.6. The range of the ratio of the width W51 to the twenty-first pitch P21 may be determined by a combination of any one of the values in the first group and any one of the values in the second group. The range of the ratio of the width W51 to the twenty-first pitch P21 may be determined by a combination of any two of the values in the first group. The range of the ratio of the width W51 to the twenty-first pitch P21 may be determined by a combination of any two of the values in the second group. For example, the ratio of the width W51 to the twenty-first pitch P21 may be greater than or equal to 0.4 and less than or equal to 1.6, may be greater than or equal to 0.4 and less than or equal to 1.4, may be greater than or equal to 0.4 and less than or equal to 1.2, may be greater than or equal to 0.4 and less than or equal to 0.8, may be greater than or equal to 0.4 and less than or equal to 0.6, may be greater than or equal to 0.6 and less than or equal to 1.6, may be greater than or equal to 0.6 and less than or equal to 1.4, may be greater than or equal to 0.6 and less than or equal to 1.2, may be greater than or equal to 0.6 and less than or equal to 0.8, may be greater than or equal to 0.8 and less than or equal to 1.6, may be greater than or equal to 0.8 and less than or equal to 1.4, may be greater than or equal to 0.8 and less than or equal to 1.2, may be greater than or equal to 1.2 and less than or equal to 1.6, may be greater than or equal to 1.2 and less than or equal to 1.4, or may be greater than or equal to 1.4 and less than or equal to 1.6.

The width W51, for example, may be greater than or equal to 20 μm, may be greater than or equal to 40 μm, or may be greater than or equal to 60 μm. The width W51, for example, may be less than or equal to 110 μm, may be less than or equal to 130 μm, or may be less than or equal to 150 μm. The range of the width W51 may be determined by a first group consisting of 20 μm, 40 μm, and 60 μm and/or a second group consisting of 110 μm, 130 μm, and 150 μm. The range of the width W51 may be determined by a combination of any one of the values in the first group and any one of the values in the second group. The range of the width W51 may be determined by a combination of any two of the values in the first group. The range of the width W51 may be determined by a combination of any two of the values in the second group. For example, the width W51 may be greater than or equal to 20 μm and less than or equal to 150 μm, may be greater than or equal to 20 μm and less than or equal to 130 μm, may be greater than or equal to 20 μm and less than or equal to 110 μm, may be greater than or equal to 20 μm and less than or equal to 60 μm, may be greater than or equal to 20 μm and less than or equal to 40 μm, may be greater than or equal to 40 μm and less than or equal to 150 μm, may be greater than or equal to 40 μm and less than or equal to 130 μm, may be greater than or equal to 40 μm and less than or equal to 110 μm, may be greater than or equal to 40 μm and less than or equal to 60 μm, may be greater than or equal to 60 μm and less than or equal to 150 μm, may be greater than or equal to 60 μm and less than or equal to 130 μm, may be greater than or equal to 60 μm and less than or equal to 110 μm, may be greater than or equal to 110 μm and less than or equal to 150 μm, may be greater than or equal to 110 μm and less than or equal to 130 μm, or may be greater than or equal to 130 μm and less than or equal to 150 μm.

The width W61 of the second electrode end 1422 may have a constant ratio to the eleventh pitch P11. The ratio of the width W61 to the eleventh pitch P11, for example, may be greater than or equal to 0.4, may be greater than or equal to 0.6, or may be greater than or equal to 0.8. The ratio of the width W61 to the eleventh pitch P11, for example, may be less than or equal to 1.2, may be less than or equal to 1.4, or may be less than or equal to 1.6. The range of the ratio of the width W61 to the eleventh pitch P11 may be determined by a first group consisting of 0.4, 0.6, and 0.8 and/or a second group consisting of 1.2, 1.4, and 1.6. The range of the ratio of the width W61 to the eleventh pitch P11 may be determined by a combination of any one of the values in the first group and any one of the values in the second group. The range of the ratio of the width W61 to the eleventh pitch P11 may be determined by a combination of any two of the values in the first group. The range of the ratio of the width W61 to the eleventh pitch P11 may be determined by a combination of any two of the values in the second group. For example, the ratio of the width W61 to the eleventh pitch P11 may be greater than or equal to 0.4 and less than or equal to 1.6, may be greater than or equal to 0.4 and less than or equal to 1.4, may be greater than or equal to 0.4 and less than or equal to 1.2, may be greater than or equal to 0.4 and less than or equal to 0.8, may be greater than or equal to 0.4 and less than or equal to 0.6, may be greater than or equal to 0.6 and less than or equal to 1.6, may be greater than or equal to 0.6 and less than or equal to 1.4, may be greater than or equal to 0.6 and less than or equal to 1.2, may be greater than or equal to 0.6 and less than or equal to 0.8, may be greater than or equal to 0.8 and less than or equal to 1.6, may be greater than or equal to 0.8 and less than or equal to 1.4, may be greater than or equal to 0.8 and less than or equal to 1.2, may be greater than or equal to 1.2 and less than or equal to 1.6, may be greater than or equal to 1.2 and less than or equal to 1.4, or may be greater than or equal to 1.4 and less than or equal to 1.6.

The width W61, for example, may be greater than or equal to 20 μm, may be greater than or equal to 40 μm, or may be greater than or equal to 60 μm. The width W61, for example, may be less than or equal to 110 μm, may be less than or equal to 130 μm, or may be less than or equal to 150 μm. The range of the width W61 may be determined by a first group consisting of 20 μm, 40 μm, and 60 μm and/or a second group consisting of 110 μm, 130 μm, and 150 μm. The range of the width W61 may be determined a combination of any one of the values in the first group and any one of the values in the second group. The range of the width W61 may be determined by a combination of any two of the values in the first group. The range of the width W61 may be determined by a combination of any two of the values in the second group. For example, the width W61 may be greater than or equal to 20 μm and less than or equal to 150 μm, may be greater than or equal to 20 μm and less than or equal to 130 μm, may be greater than or equal to 20 μm and less than or equal to 110 μm, may be greater than or equal to 20 μm and less than or equal to 60 μm, may be greater than or equal to 20 μm and less than or equal to 40 μm, may be greater than or equal to 40 μm and less than or equal to 150 μm, may be greater than or equal to 40 μm and less than or equal to 130 μm, may be greater than or equal to 40 μm and less than or equal to 110 μm, may be greater than or equal to 40 μm and less than or equal to 60 μm, may be greater than or equal to 60 μm and less than or equal to 150 μm, may be greater than or equal to 60 μm and less than or equal to 130 μm, may be greater than or equal to 60 μm and less than or equal to 110 μm, may be greater than or equal to 110 μm and less than or equal to 150 μm, may be greater than or equal to 110 μm and less than or equal to 130 μm, or may be greater than or equal to 130 μm and less than or equal to 150 μm.

Since the second electrode 140Y includes the branch electrodes 142, it is easy to dispose the second electrode 140Y irregularly. Thus, it is possible to further reduce constructive interference between light waves diffracted at the time of passing through the transmission areas 104.

Figure 7:
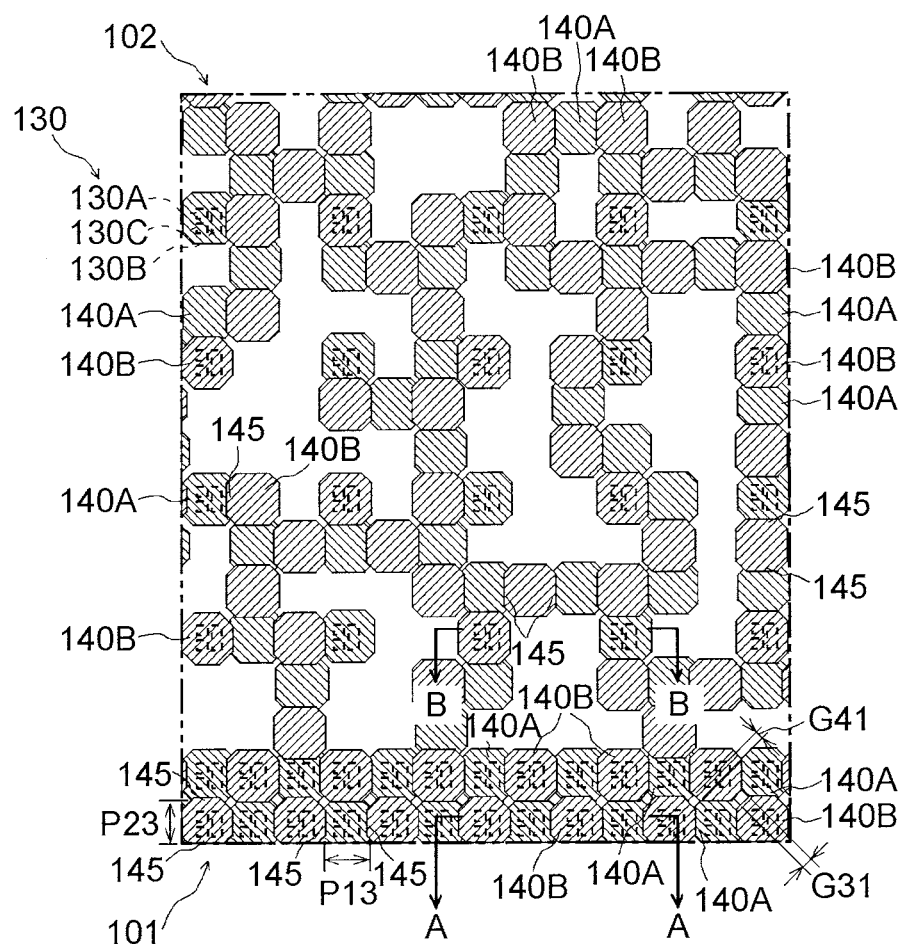
FIG. 7 is a plan view of an area surrounded by the alternate long and two-short dashed line and indicated by the reference sign VII in the organic device shown in FIG. 3.

The layer structure of the second electrode 140 will be described. FIG. 7 is an enlarged plan view of the area surrounded by the alternate long and two-short dashed line and indicated by the reference sign VII in the organic device 100 shown in FIG. 3.

The second electrode 140 may include a plurality of layers. For example, the second electrode 140 may include first layers 140A and second layers 140B. The first layers 140A are formed by vapor deposition using a first mask 50A (described later). The second layers 140B are formed by vapor deposition using a second mask 50B (described later).

In the first display area 101, the first layers 140A may be arranged in a third element direction G3 and a fourth element direction G4. The third element direction G3 is a direction that intersects with both the first element direction G1 and the second element direction G2. The angle formed by the third element direction G3 with each of the first element direction G1 and the second element direction G2 is, for example, greater than or equal to 20° and less than or equal to 70°. The fourth element direction G4 is a direction that intersects with both the first element direction G1 and the second element direction G2. The angle formed by the fourth element direction G4 with each of the first element direction G1 and the second element direction G2 is, for example, greater than or equal to 20° and less than or equal to 70°. The third element direction G3 intersects with the fourth element direction G4. For example, the third element direction G3 may be orthogonal to the fourth element direction G4.

The reference sign G31 indicates the gap between any adjacent two of the first layers 140A in the third element direction G3. The gap G31, for example, may be greater than or equal to 5 μm, may be greater than or equal to 10 μm, or may be greater than or equal to 15 μm. The gap G31, for example, may be less than or equal to 30 μm, may be less than or equal to 40 μm, or may be less than or equal to 50 μm. The range of the gap G31 may be determined by a first group consisting of 5 μm, 10 μm, and 15 μm and/or a second group consisting of 30 μm, 40 μm, and 50 μm. The range of the gap G31 may be determined by a combination of any one of the values in the first group and any one of the values in the second group. The range of the gap G31 may be determined by a combination of any two of the values in the first group. The range of the gap G31 may be determined by a combination of any two of the values in the second group. For example, the gap G31 may be greater than or equal to 5 ∞m and less than or equal to 50 μm, may be greater than or equal to 5 μm and less than or equal to 40 ∞m, may be greater than or equal to 5 μm and less than or equal to 30 μm, may be greater than or equal to 5 μm and less than or equal to 15 μm, may be greater than or equal to 5 μm and less than or equal to 10 μm, may be greater than or equal to 10 μm and less than or equal to 50 μm, may be greater than or equal to 10 μm and less than or equal to 40 μm, may be greater than or equal to 10 μm and less than or equal to 30 μm, may be greater than or equal to 10 μm and less than or equal to 15 μm, may be greater than or equal to 15 μm and less than or equal to 50 μm, may be greater than or equal to 15 μm and less than or equal to 40 μm, may be greater than or equal to 15 μm and less than or equal to 30 μm, may be greater than or equal to 30 μm and less than or equal to 50 μm, may be greater than or equal to 30 μm and less than or equal to 40 μm, or may be greater than or equal to 40 μm and less than or equal to 50 μm.

The reference sign G41 indicates the gap between any adjacent two of the first layers 140A in the fourth element direction G4. The above-described range of the gap G31 may be adopted as the range of the gap G41.

In the first display area 101, the second layers 140B, as well as the first layers 140A, may be arranged in the third element direction G3 and the fourth element direction G4. The above-described range of the gap G31 may be adopted as the range of the gap between any adjacent two of the second layers 140B in the third element direction G3. The above-described range of the gap G41 may be adopted as the range of the gap between any adjacent two of the second layers 140B in the fourth element direction G4.

The first layer 140A may be connected to the second layer 140B in the first element direction G1. In this case, as shown in FIG. 7, in the first display area 101, electrode overlap areas 145 may be arranged at a thirteenth pitch P13 in the first element direction G1. The electrode overlap area 145 is an area in which a plurality of layers of the second electrode 140 overlaps in plan view. In the present embodiment, the electrode overlap area 145 is an area in which the first layer 140A and the second layer 140B overlap. The above-described range of the eleventh pitch P11 may be adopted as the range of the thirteenth pitch P13.

The first layer 140A may be connected to the second layer 140B in the second element direction G2. In this case, in the first display area 101, the electrode overlap areas 145 may be arranged at a twenty-third pitch P23 in the second element direction G2. The above-described range of the twenty-first pitch P21 may be adopted as the range of the twenty-third pitch P23.

The width W51 of the first electrode end 1421 may have a constant ratio to the twenty-third pitch P23. The range of the ratio of the width W51 to the twenty-first pitch P21 may be adopted as the range of the ratio of the width W51 to the twenty-third pitch P23.

The width W61 of the second electrode end 1422 may have a constant ratio to the thirteenth pitch P13. The range of the ratio of the width W61 to the eleventh pitch P11 may be adopted as the range of the ratio of the width W61 to the thirteenth pitch P13.

The area of the electrode overlap area 145 may be less than the area of the first layer 140A. The ratio of the area of the electrode overlap area 145 to the area of the first layer 140A, for example, may be greater than or equal to 0.02, may be greater than or equal to 0.05, or may be greater than or equal to 0.10. The ratio of the area of the electrode overlap area 145 to the area of the first layer 140A, for example, may be less than or equal to 0.20, may be less than or equal to 0.30, or may be less than or equal to 0.40. The range of the ratio of the area of the electrode overlap area 145 to the area of the first layer 140A may be determined by a first group consisting of 0.02, 0.05, and 0.10 and/or a second group consisting of 0.20, 0.30, and 0.40. The range of the ratio of the electrode overlap area 145 to the area of the first layer 140A may be determined by a combination of any one of the values in the first group and any one of the values in the second group. The range of the ratio of the electrode overlap area 145 to the area of the first layer 140A may be determined by a combination of any two of the values in the first group. The range of the ratio of the electrode overlap area 145 to the area of the first layer 140A may be determined by a combination of any two of the values in the second group. For example, the ratio of the area of the electrode overlap area 145 to the area of the first layer 140A may be greater than or equal to 0.02 and less than or equal to 0.40, may be greater than or equal to 0.02 and less than or equal to 0.30, may be greater than or equal to 0.02 and less than or equal to 0.20, may be greater than or equal to 0.02 and less than or equal to 0.10, may be greater than or equal to 0.02 and less than or equal to 0.05, may be greater than or equal to 0.05 and less than or equal to 0.50, may be greater than or equal to 0.05 and less than or equal to 0.30, may be greater than or equal to 0.05 and less than or equal to 0.20, may be greater than or equal to 0.05 and less than or equal to 0.10, may be greater than or equal to 0.10 and less than or equal to 0.40, may be greater than or equal to 0.10 and less than or equal to 0.30, may be greater than or equal to 0.10 and less than or equal to 0.20, may be greater than or equal to 0.20 and less than or equal to 0.40, may be greater than or equal to 0.20 and less than or equal to 0.30, or may be greater than or equal to 0.30 and less than or equal to 0.40.

The area of the electrode overlap area 145 may be less than the area of the second layer 140B. The above-described range of the ratio of the area of the electrode overlap area 145 to the area of the first layer 140A may be adopted as the range of the ratio of the area of the electrode overlap area 145 to the area of the second layer 140B.

Figure 8:
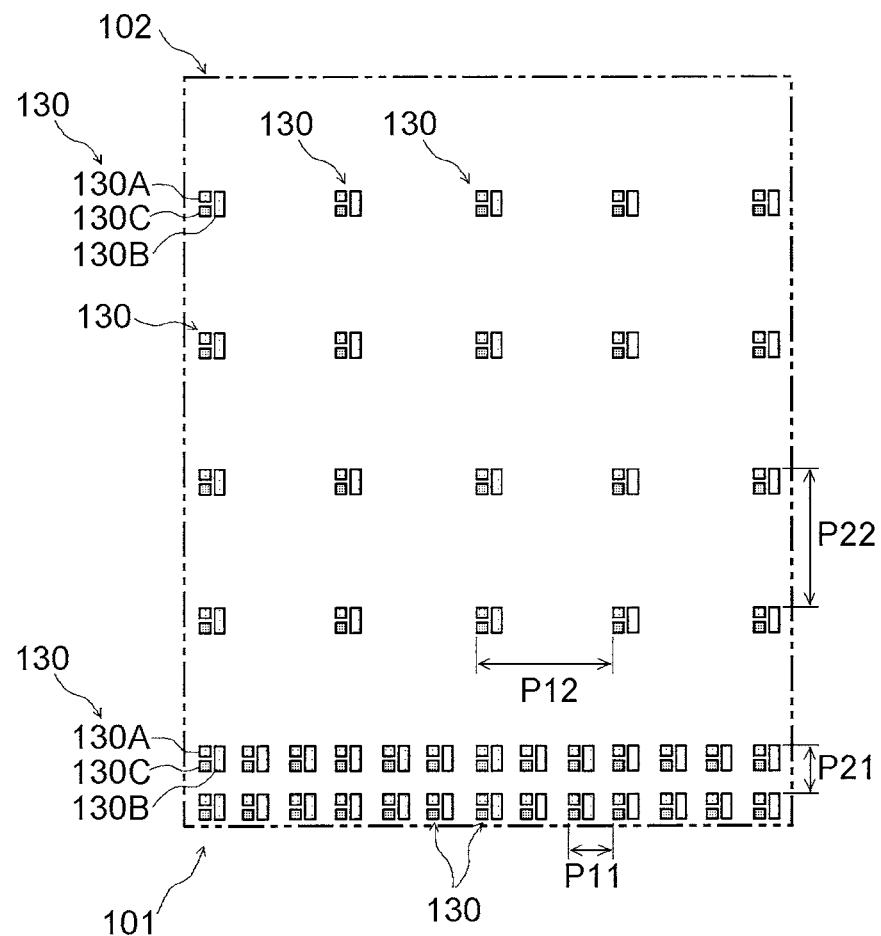
FIG. 8 is a plan view of a state where the second electrode is removed from the organic device shown in FIG. 7.

FIG. 8 is a plan view of a state where the second electrode 140 is removed from the organic device 100 shown in FIG. 7. The organic layers 130 may include first organic layers 130A, second organic layers 130B, and third organic layers 130C. The first organic layer 130A, the second organic layer 130B, and the third organic layer 130C are, for example, a red light emitting layer, a blue light emitting layer, and a green light emitting layer, respectively. In the following description, when the configuration of an organic layer, which is common among the first organic layer 130A, the second organic layer 130B, and the third organic layer 130C, is described, the term and the reference sign "organic layer 130" are used.

The layout of the second electrode 140 and the organic layers 130 in plan view is detected by observing the organic device 100 with a high-powered digital microscope. The above-described occupancies, areas, sizes, gaps, and the like are able to be calculated in accordance with detection results. When the organic device 100 includes a cover, such as a cover glass, the second electrode 140 and the organic layers 130 may be observed after removing the cover by, for example, peeling or breaking the cover. A scanning electron microscope may be used instead of a digital microscope.

As shown in FIGS. 7 and 8, one organic layer 130 that includes one first organic layer 130A, one second organic layer 130B, and one third organic layer 130C may overlap one first layer 140A or one second layer 140B in plan view.

Figure 9:
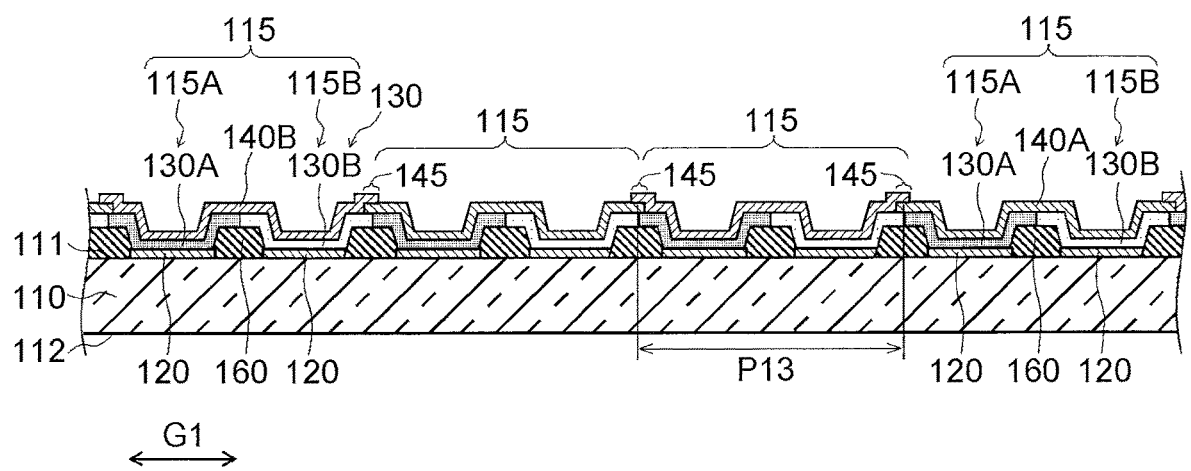
FIG. 9 is a sectional view of the organic device, taken along the line A-A in FIG. 7.
Figure 10:
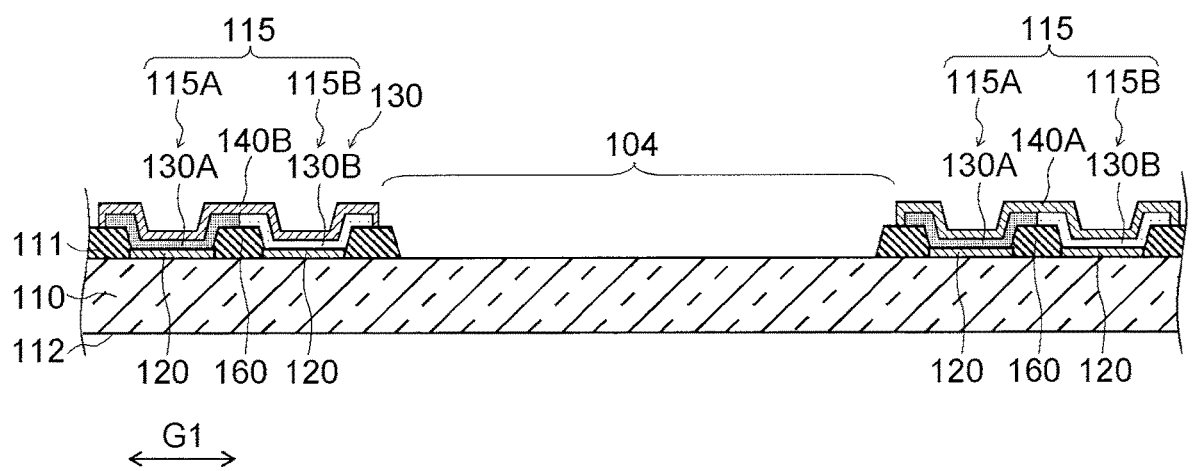
FIG. 10 is a sectional view of the organic device, taken along the line B-B in FIG. 7.

Next, an example of the layer structure of the organic device 100 will be described. FIG. 9 is a sectional view of the organic device, taken along the line A-A in FIG. 7. FIG. 10 is a sectional view of the organic device, taken along the line B-B in FIG. 7.

The organic device 100 includes a substrate 110, and the elements 115 disposed on the substrate 110. Each of the elements 115 may include a first electrode 120, the organic layer 130 disposed on the first electrode 120, and the second electrode 140 disposed on the organic layer 130.

The organic device 100 may include an insulating layer 160 located between any adjacent two of the first electrodes 120 in plan view. The insulating layer 160 includes, for example, polyimide. The insulating layer 160 may overlap the ends of the first electrodes 120. The insulating layer 160 may overlap the electrode overlap areas 145 in plan view. For example, in plan view, the electrode overlap area 145 may be surrounded by the outline of the insulating layer 160. The electrode overlap area 145 includes a plurality of layers of the second electrode 140. Therefore, the electrode overlap area 145 has a lower transmittance than one layer of the second electrode 140. When light passing through the electrode overlap area 145 exits from the organic device 100, the intensity of light can be not uniform. Since the insulating layer 160 overlaps the electrode overlap area 145, it is possible to reduce nonuniformity in the intensity of light.

The organic device 100 may be an active matrix type. For example, although not shown in the drawing, the organic device 100 may include switches. The switches are respectively electrically connected to the elements 115. Each of the switches is, for example, a transistor. Each of the switches is capable of controlling the on/off state of voltage or current to a corresponding one of the elements 115.

The substrate 110 may be a sheet-like member having electrical insulation properties. The substrate 110 preferably has transparency for transmitting light.

When the substrate 110 has a predetermined transparency, the transparency of the substrate 110 is preferably a transparency to such an extent that the substrate 110 is able to transmit light emitted from the organic layers 130 to display. For example, the transmittance of the substrate 110 in a visible light range is preferably higher than or equal to 70% and more preferably higher than or equal to 80%. The transmittance of the substrate 110 is able to be measured by a method of testing a total light transmittance of plastic-transparent material, which is in conformity with JIS K7361-1.

The substrate 110 may have flexibility or does not need to have flexibility. The substrate 110 can be selected as needed according to the uses of the organic device 100.

Examples of the material of the substrate 110 include non-flexible rigid materials, such as quartz glass, Pyrex (registered trademark) glass, synthetic quartz plate, and non-alkali glass, and flexible materials, such as resin film, optical resin sheet, and thin glass. The substrate material may be a multilayer body with a barrier layer on one side or each side of a resin film.

The thickness of the substrate 110 can be selected as needed according to a material used for the substrate 110, the use of the organic device 100, and the like, and, for example, may be greater than or equal to 0.005 mm. The thickness of the substrate 110 may be less than or equal to 5 mm.

Each of the elements 115 is capable of implementing a function when a voltage is applied between the first electrode 120 and the second electrode 140 or when a current flows between the first electrode 120 and the second electrode 140. When, for example, the elements 115 are pixels of an organic EL display device, the elements 115 are capable of emitting light that constitutes a video.

The first electrode 120 includes a material having electrical conductivity. Examples of the first electrode 120 include a metal, a metal oxide having electrical conductivity, and other inorganic materials having electrical conductivity. The first electrode 120 may include a metal oxide having transparency and electrical conductivity, such as indium tin oxide.

A metal, such as Au, Cr, Mo, Ag, and Mg, an inorganic oxide, such as indium tin oxide referred to as ITO, indium zinc oxide referred to as IZO, zinc oxide, and indium oxide, or a conductive polymer, such as metal-doped polythiophene, may be used as the material of the first electrode 120. These conductive materials may be used solely or two or more of these conductive materials may be used in combination. When two or more types are used, layers respectively made of materials may be laminated. Alternatively, an alloy that includes two or more materials may be used. Examples of the alloy include magnesium alloys, such as MgAg.

The organic layer 130 includes an organic material. When the organic layer 130 is energized, the organic layer 130 is capable of exerting a function. Energization means that a voltage is applied to the organic layer 130 or a current flows through the organic layer 130. A light emitting layer that emits light when energized, a layer that varies in transmittance or refractive index of light when energized, or the like may be used as the organic layer 130. The organic layer 130 may include an organic semiconductor material.

A multilayer structure that includes the first electrode 120, the first organic layer 130A, and the second electrode 140 is also referred to as first element 115A. A multilayer structure that includes the first electrode 120, the second organic layer 130B, and the second electrode 140 is also referred to as second element 115B. A multilayer structure that includes the first electrode 120, the third organic layer 130C, and the second electrode 140 is also referred to as third element. When the organic device 100 is an organic EL display device, the first element 115A, the second element 115B, and the third element each are a sub-pixel.

In the following description, when the configuration of an element, which is common among the first element 115A, the second element 115B, and the third element, is described, the term and the reference sign "element 115" are used.

When a voltage is applied between the first electrode 120 and the second electrode 140, the organic layer 130 disposed therebetween is driven. When the organic layer 130 is a light emitting layer, light is emitted from the organic layer 130, and the light is taken out from the second electrode 140 side or the first electrode 120 side.

When the organic layer 130 includes a light emitting layer that emits light when energized, the organic layer 130 may further include a hole injection layer, a hole transport layer, an electron transport layer, an electron injection layer, and the like. When, for example, the first electrode 120 is an anode, the organic layer 130 may include a hole injection and transport layer between the light emitting layer and the first electrode 120. The hole injection and transport layer may be a hole injection layer that has a hole injection function, may be a hole transport layer that has a hole transport function, or may have both the hole injection function and the hole transport function. Alternatively, the hole injection and transport layer may be formed by laminating a hole injection layer and a hole transport layer. When the second electrode 140 is a cathode, the organic layer 130 may have an electron injection and transport layer between the light emitting layer and the second electrode 140. The electron injection and transport layer may be an electron injection layer that has an electron injection function, may be an electron transport layer that has an electron transport function, or may have both the electron injection function and the electron transport function. Alternatively, the electron injection and transport layer may be formed by laminating an electron injection layer and an electron transport layer.

The light emitting layer includes a luminescent material. The light emitting layer may include an additive that improves leveling properties.

Known materials may be used as the luminescent material, and, for example, luminescent materials, such as dye materials, metal complex materials, and polymer materials, may be used. Examples of the dye materials include cyclopentadiene derivatives, tetraphenyl butadiene derivatives, triphenylamine derivatives, oxadiazole derivatives, pyrazolo-quinoline derivatives, distyrylbenzene derivatives, distyrylarylene derivatives, silole derivatives, thiophene ring compounds, pyridine ring compounds, perinone derivatives, perylene derivatives, oligothiophene derivatives, an oxadiazole dimer, and a pyrazoline dimer. Metal complexes that have Al, Zn, Be, or the like, or a rare earth metal, such as Tb, Eu, and Dy, as a central metal and that have oxadiazole, thiadiazole, phenylpyridine, phenylbenzimidazole, a quinoline structure, or the like, as a ligand may be used as the metal complex material. Examples of the metal complex material include aluminum quinolinol complexes, benzoquinolinol beryllium complexes, benzoxazole zinc complexes, benzothiazole zinc complexes, azomethyl zinc complexes, porphyrin zinc complexes, and europium complexes. Examples of the polymer materials include poly(p-phenylene vinylene) derivatives, polythiophene derivatives, poly(p-phenylene) derivatives, polysilane derivatives, polyacetylene derivatives, polyvinylcarbazole derivatives, polyfluorene derivatives, polyquinoxaline derivatives, and copolymers of them.

The light emitting layer may contain a dopant for the purpose of, for example, improving the luminous efficiency and varying the emission wavelength. Examples of the dopant include perylene derivatives, coumarin derivatives, rubrene derivatives, quinacridone derivatives, squarylium derivatives, porphyrin derivatives, styryl dyes, tetracene derivatives, pyrazoline derivatives, decacyclene, phenoxazone, quinoxaline derivatives, carbazole derivatives, and fluorene derivatives. Organic metal complexes that have ions of heavy metals, such as platinum and iridium, as a center and that exhibit phosphorescence may be used as the dopant. One dopant may be used solely or two or more dopants may be used.

For example, the materials described at paragraphs 0094 to 0099 in Japanese Unexamined Patent Application Publication No. 2010-272891 and the materials described at paragraphs 0053 to 0057 in International Publication No. 2012/132126 may also be used as the luminescent material and the dopant.

The thickness of the light emitting layer is not limited as long as the thickness allows to provide a field for recombination between electrons and holes and exert the function of light emission. The thickness, for example, may be greater than or equal to 1 nm and may be less than or equal to 500 nm.

A known material may be used as a hole injection and transport material used for the hole injection and transport layer. Examples of the hole injection and transport material include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxadiazole derivatives, styrylanthracene derivatives, fluorenone derivatives, hydrazone derivatives, stilbene derivatives, silazane derivatives, polythiophene derivatives, polyaniline derivatives, polypyrrole derivatives, phenylamine derivatives, anthracene derivatives, carbazole derivatives, fluorene derivatives, distyrylbenzene derivatives, polyphenylenevinylene derivatives, porphyrin derivatives, and styrylamine derivatives. Examples of the hole injection and transport material also include spiro compounds, phthalocyanine compounds, and metal oxides. For example, the compounds described in Japanese Unexamined Patent Application Publication No. 2011-119681, International Publication No. 2012/018082, Japanese Unexamined Patent Application Publication No. 2012-069963, and at paragraph 0106 in International Publication No. 2012/132126 may also be used as needed.

When the hole injection and transport layer is formed by laminating a hole injection layer and a hole transport layer, the hole injection layer may contain an additive A, the hole transport layer may contain an additive A, or the hole injection layer and the hole transport layer may contain an additive A. The additive A may be a low-molecular compound or may be a polymeric compound. Specifically, fluorine compounds, ester compounds, hydrocarbon compounds, or the like may be used.

A known material may be used as an electron injection and transport material used for the electron injection and transport layer. Examples of the electron injection and transport material include alkali metals, alkali metal alloys, alkali metal halides, alkaline earth metals, alkaline earth metal halides, alkaline earth metal oxides, alkali metal organic complexes, magnesium halides, magnesium oxides, and aluminum oxides. Examples of the electron injection and transport material include bathocuproine, bathophenanthroline, phenanthroline derivatives, triazole derivatives, oxadiazole derivatives, pyridine derivatives, nitro-substituted fluorene derivatives, anthraquinodimethane derivatives, diphenylquinone derivatives, thiopyran dioxide derivatives, aromatic ring tetracarboxylic anhydrides, such as naphthalene and perylene, carbodiimide, fluorenylidenemethane derivatives, anthraquinodimethane derivatives, anthrone derivatives, quinoxaline derivatives, metal complexes, such as quinolinol complexes, phthalocyanine compounds, and distyrylpyrazine derivatives.

An electron transport organic material may be doped with an alkali metal or an alkaline earth metal to form a metal dope layer, and the metal dope layer may be used as the electron injection and transport layer. Examples of the electron transport organic material include bathocuproine, bathophenanthroline, phenanthroline derivatives, triazole derivatives, oxadiazole derivatives, pyridine derivatives, metal complexes, such as tris(8-quinolinolato) aluminum ($Alq_3$), and polymeric derivatives of them. Li, Cs, Ba, Sr, or the like may be used as a dopant metal.

The second electrode 140 includes a material having electrical conductivity, such as a metal. The second electrode 140 is formed on the organic layers 130 by vapor deposition using masks (described later). Examples of the material of the second electrode 140 include platinum, gold, silver, copper, iron, tin, chromium, aluminum, indium, lithium, sodium, potassium, calcium, magnesium, and carbon. These materials may be used solely or two or more types of these materials may be used in combination. When two or more types are used, layers respectively made of materials may be laminated. Alternatively, an alloy that includes two or more materials may be used. Examples of the alloy include magnesium alloys, such as MgAg, aluminum alloys, such as AlLi, AlCa, and AlMg, alkali metal alloys, and alkaline earth metal alloys.

The thickness of the second electrode 140, for example, may be greater than or equal to 5 nm, may be greater than or equal to 10 nm, may be greater than or equal to 50 nm, or may be greater than or equal to 100 nm. The thickness of the second electrode 140, for example, may be less than or equal to 200 nm, may be less than or equal to 500 nm, may be less than or equal to 1 µm, or may be less than or equal to 100 µm. The range of the thickness of the second electrode 140 may be determined by a first group consisting of 5 nm, 10 nm, 50 nm, and 100 nm and/or a second group consisting of 200 nm, 500 nm, 1 µm, and 100 µm. The range of the thickness of the second electrode 140 may be determined by a combination of any one of the values in the first group and any one of the values in the second group. The range of the thickness of the second electrode 140 may be determined by a combination of any two of the values in the first group. The range of the thickness of the second electrode 140 may be determined by a combination of any two of the values in the second group. For example, the thickness of the second electrode 140 may be greater than or equal to 5 nm and less than or equal to 100 nm, may be greater than or equal to 5 nm and less than or equal to 1 µm, may be greater than or equal to 5 nm and less than or equal to 500 nm, may be greater than or equal to 5 nm and less than or equal to 200 nm, may be greater than or equal to 5 nm and less than or equal to 100 nm, may be greater than or equal to 5 nm and less than or equal to 50 nm, may be greater than or equal to 5 nm and less than or equal to 10 nm, may be greater than or equal to 10 nm and less than or equal to 100 µm, may be greater than or equal to 10 nm and less than or equal to 1 µm, may be greater than or equal to 10 nm and less than or equal to 500 nm, may be greater than or equal to 10 nm and less than or equal to 200 nm, may be greater than or equal to 10 nm and less than or equal to 100 nm, may be greater than or equal to 10 nm and less than or equal to 50 nm, may be greater than or equal to 50 nm and less than or equal to 100 µm, may be greater than or equal to 50 nm and less than or equal to 1 µm, may be greater than or equal to 50 nm and less than or equal to 500 nm, may be greater than or equal to 50 nm and less than or equal to 200 nm, may be greater than or equal to 50 nm and less than or equal to 100 nm, may be greater than or equal to 100 nm and less than or equal to 100 µm, may be greater than or equal to 100 nm and less than or equal to 1 µm, may be greater than or equal to 100 nm and less than or equal to 500 nm, may be greater than or equal to 100 nm and less than or equal to 200 nm, may be greater than or equal to 200 nm and less than or equal to 100 µm, may be greater than or equal to 200 nm and less than or equal to 1 µm, may be greater than or equal to 200 nm and less than or equal to 500 nm, may be greater than or equal to 500 nm and less than or equal to 100 µm, may be greater than or equal to 500 nm and less than or equal to 1 µm, or may be greater than or equal to 1 µm and less than or equal to 100 µm. As the thickness of the second electrode 140 reduces, the transmittance of the second electrode 140 increases, and the transmittance of the non-transmission areas 103 also increases. Light entering the non-transmission areas 103 is also able to reach the sensor according to the transmittance of the non-transmission areas 103. When the transmittance of the non-transmission areas 103 is increased, the amount of light received by the sensor is able to be increased.

The thickness of each of the components of the organic device 100, that is, the thickness of the substrate 110, the thickness of the second electrode 140, and the like, can be measured by observing the image of the cross section of the organic device 100 with a scanning electron microscope.

Figure 11:
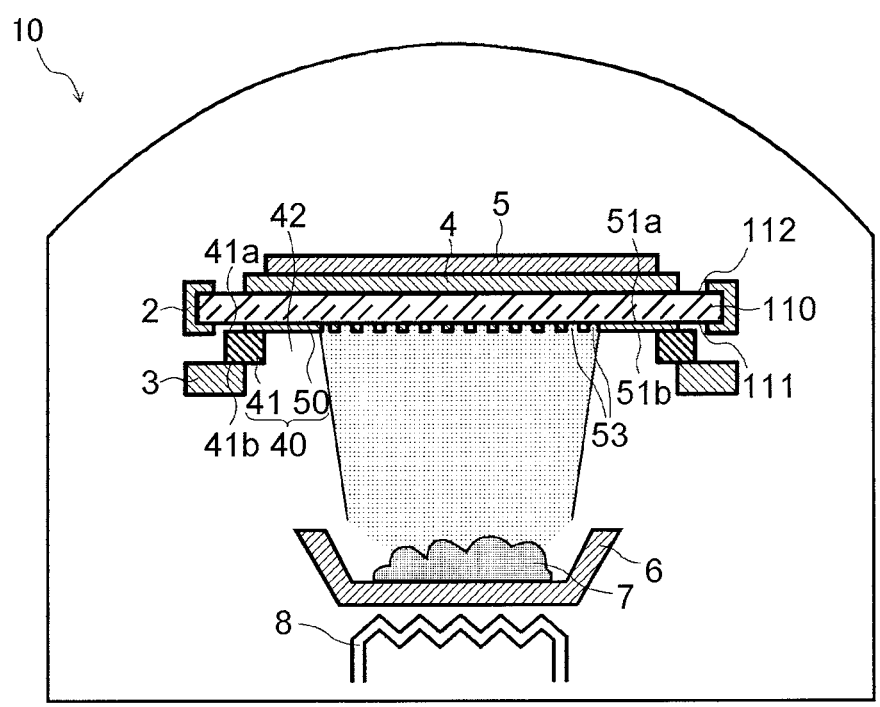
FIG. 11 is a diagram of an example of a vapor deposition system that includes a mask assembly.

Next, a method of forming the second electrode 140 of the organic device 100 by vapor deposition will be described. FIG. 11 is a diagram of a vapor deposition system 10. The vapor deposition system 10 performs a vapor deposition process for depositing a vapor deposition material on an object.

The vapor deposition system 10 may include a vapor deposition source 6, a heater 8, and a mask assembly 40 inside. The vapor deposition system 10 may include an evacuating means for evacuating the inside of the vapor deposition system 10 into a vacuum atmosphere. The vapor deposition source 6 is, for example, a crucible. The vapor deposition source 6 contains a vapor deposition material 7, such as a conductive material. The heater 8 vaporizes the vapor deposition material 7 in a vacuum atmosphere by heating the vapor deposition source 6. The mask assembly 40 is disposed so as to face the crucible 6.

As shown in FIG. 11, the mask assembly 40 may include at least one mask 50 and a frame 41 supporting the mask 50. The frame 41 may have a first frame face 41*a* and a second frame face 41*b*. The mask 50 may be fixed to the first frame face 41*a*. The second frame face 41*b* is located on the side opposite to the first frame face 41*a*. The frame 41 may have an opening 42. The opening 42 extends through from the first frame face 41a to the second frame face 41b. The mask 50 may be fixed to the frame 41 so as to cross the opening 42 in plan view. The frame 41 may support the mask 50 in a state where the mask 50 is pulled in a direction along the plane of the mask 50. Thus, it is possible to suppress a deflection of the mask 50.

A first mask 50A or a second mask 50B (described later) may be used as the mask 50. In the following description, when the configuration of the mask, which is common between the first mask 50A and the second mask 50B, is described, the term and the reference sign "mask 50" are used. For the components of the mask, such as through-holes, a blocking area, and the like (described later), similarly, a configuration common between the first mask 50A and the second mask 50B is described, a reference sign not suffixed with an alphabet and represented by only a numeral, that is, "53", "54", or the like, is used as a reference sign. On the other hand, when a configuration unique to each of the first mask 50A and the second mask 50B is described, a reference sign with a corresponding alphabet, that is, "A", "B", or the like, suffixed to a numeral can be used.

The mask 50 of the mask assembly 40 faces the substrate 110. The substrate 110 is an object on which the vapor deposition material 7 is deposited. The substrate 110 includes a first face 111 and a second face 112. The first face 111 faces the mask 50. The mask 50 includes a plurality of through-holes 53. The through-holes 53 pass the vapor deposition material 7 flying from the vapor deposition source 6. The vapor deposition material 7 having passed through the through-holes 53 is deposited on the first face 111 of the substrate 110. The mask 50 includes a first face 51a and a second face 51b. The first face 51a faces the first face 111. The second face 51b is located on the side opposite to the first face 51a. The through-holes 53 extend through from the first face 51a to the second face 51b.

The vapor deposition system 10 may include a substrate holder 2 that holds the substrate 110. The substrate holder 2 may be movable in the direction along the thickness of the substrate 110. The substrate holder 2 may be movable in the direction along the plane of the substrate 110. The substrate holder 2 may control the inclination of the substrate 110. For example, the substrate holder 2 may include a plurality of chucks attached to the outer edge of the substrate 110. Each of the chucks may be independently movable in the direction along the thickness and the plane of the substrate 110.

The vapor deposition system 10 may include a mask holder 3 that holds the mask assembly 40. The mask holder 3 may be movable in the direction along the thickness of the mask 50. The mask holder 3 may be movable in the direction along the plane of the mask 50. For example, the mask holder 3 may include a plurality of chucks attached to the outer edge of the frame 41. Each of the chucks may be independently movable in the direction along the thickness and the plane of the mask 50.

The position of the mask 50 of the mask assembly 40 with respect to the substrate 110 is able to be adjusted by moving at least any one of the substrate holder 2 and the mask holder 3.

The vapor deposition system 10 may include a cooling plate 4. The cooling plate 4 may be disposed on the second face 112 side of the substrate 110. The cooling plate 4 may have a flow channel for circulating refrigerant inside the cooling plate 4. The cooling plate 4 suppresses an increase in the temperature of the substrate 110 in a vapor deposition process.

The vapor deposition system 10 may include a magnet 5 disposed on the second face 112 side. The magnet 5 may be stacked on the cooling plate 4. The magnet 5 attracts the mask 50 toward the substrate 110 by magnetic force. Thus, it is possible to reduce the gap between the mask 50 and the substrate 110 or eliminate the gap. As a result, it is possible to reduce occurrence of a shadow in the vapor deposition process. Therefore, it is possible to increase the dimensional accuracy and positional accuracy of the second electrode 140. In this specification, a shadow means a phenomenon that a vapor deposition material 7 is included in the gap between the mask 50 and the substrate 110 and then the thickness of the second electrode 140 becomes uneven. Alternatively, the mask 50 may be attracted toward the substrate 110 with an electrostatic chuck by using an electrostatic force.

Figure 12:
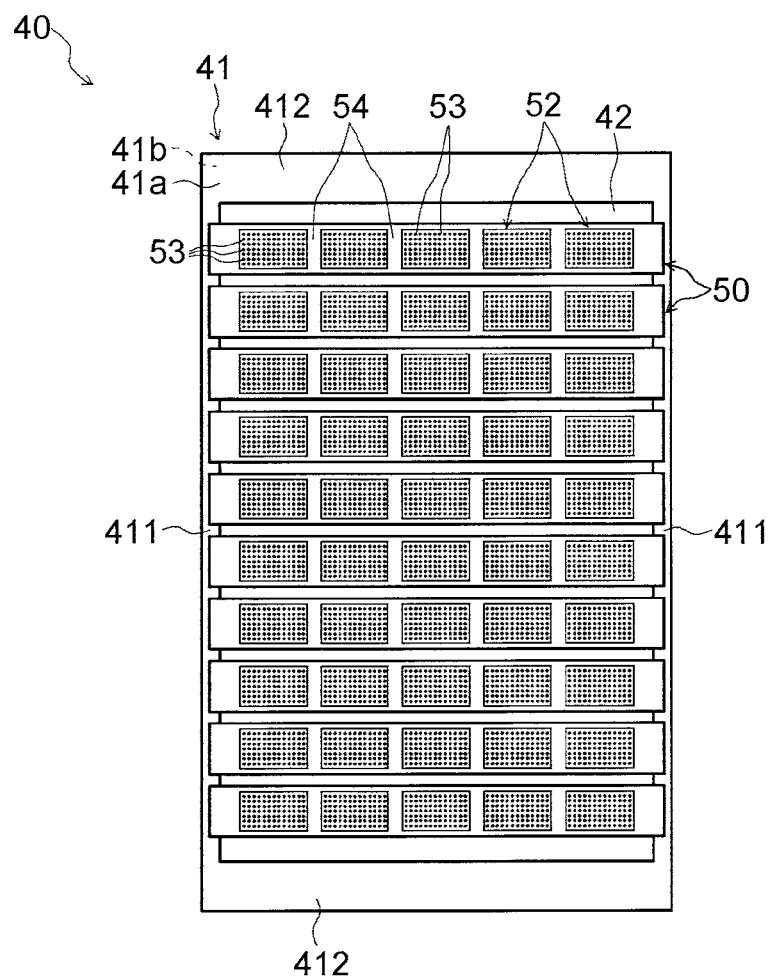
FIG. 12 is a plan view of an example of the mask assembly.

Next, the mask assembly 40 will be described. FIG. 12 is a plan view of the mask assembly 40. The mask assembly 40 may include two or more masks 50. The mask 50 may be fixed to the frame 41 by, for example, welding.

The frame 41 includes a pair of first sides 411 and a pair of second sides 412. The frame 41 may have a rectangular outline. The mask 50 to which a tension is applied may be fixed to the first sides 411. The first side 411 may be longer than the second side 412. The frame 41 may have the opening 42 surrounded by the pair of first sides 411 and the pair of second sides 412.

The mask 50 includes at least one cell 52. The cell 52 includes through-holes 53 and a blocking area 54. The mask 50 may include two or more cells 52. When a display device, such as an organic EL display device, is manufactured by using the mask 50, one cell 52 may correspond to the display area of one organic EL display device, that is, one screen. One cell 52 may correspond to a plurality of display areas. The mask 50 may have the blocking area 54 located between the cells 52. Although not shown in the drawing, the mask 50 may have the through-hole 53 located between the cells 52.

The cell 52, for example, may have a substantially quadrangular outline in plan view, more accurately, a substantially rectangular outline in plan view. Each cell 52 may have an outline of various shapes according to the shape of the display area of an organic EL display device. For example, each cell 52 may have a circular outline.

Figure 13:
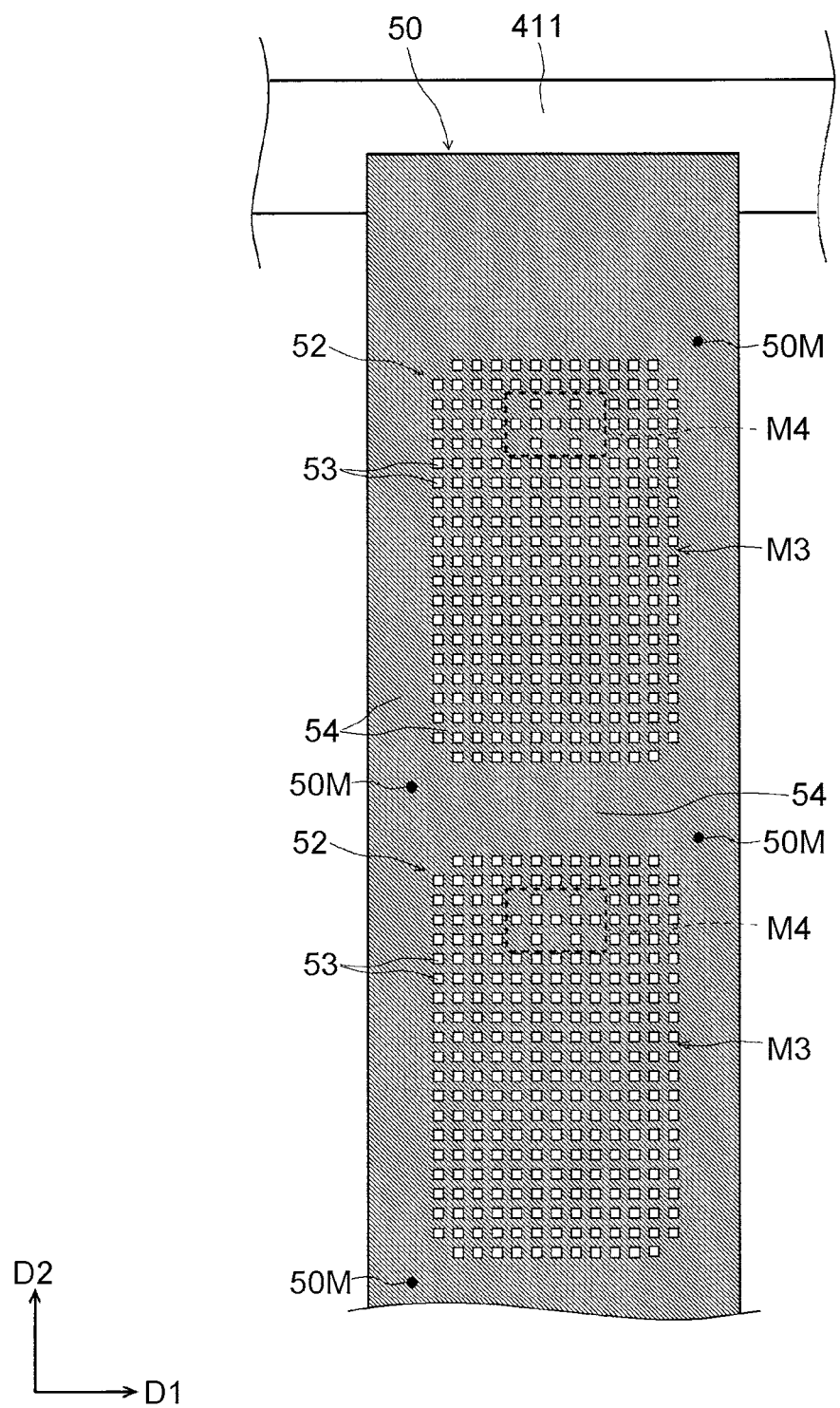
FIG. 13 is a plan view of a mask of the mask assembly.

FIG. 13 is an enlarged plan view of an example of the mask 50. The mask 50 has a first mask direction D1 and a second mask direction D2 that intersects with the first mask direction D1. The first mask direction D1 may be orthogonal to the second mask direction D2. The first mask direction D1 may correspond to the first element direction G1, and the second mask direction D2 may correspond to the second element direction G2.

The mask 50 includes the through-holes 53 and the blocking area 54. The through-holes 53 are arranged in the first mask direction D1 and the second mask direction D2.

When the mask 50 is viewed in the direction normal to the first face 51a, the mask 50 includes a third mask area M3 and a fourth mask area M4. The third mask area M3 corresponds to the first display area 101 of the organic device 100. The fourth mask area M4 corresponds to the second display area 102 of the organic device 100.

In the third mask area M3, the through-holes 53 have a third open area ratio. The third open area ratio is calculated by dividing the total area of the through-holes 53 located in the third mask area M3 by the area of the third mask area M3. In the fourth mask area M4, the through-holes 53 have a fourth open area ratio. The fourth open area ratio is calculated by dividing the total area of the through-holes 53 located in the fourth mask area M4 by the area of the fourth mask area M4. The fourth open area ratio may be less than the third open area ratio.

The ratio of the fourth open area ratio to the third open area ratio, for example, may be greater than or equal to 0.2, may be greater than or equal to 0.3, or may be greater than or equal to 0.4. The ratio of the fourth open area ratio to the third open area ratio, for example, may be less than or equal to 0.6, may be less than or equal to 0.7, or may be less than or equal to 0.8. The range of the ratio of the fourth open area ratio to the third open area ratio may be determined by a first group consisting of 0.2, 0.3, and 0.4, and/or a second group consisting of 0.6, 0.7, and 0.8. The range of the ratio of the fourth open area ratio to the third open area ratio may be determined by a combination of any one of the values in the first group and any one of the values in the second group. The range of the ratio of the fourth open area ratio to the third open area ratio may be determined by a combination of any two of the values in the first group. The range of the ratio of the fourth open area ratio to the third open area ratio may be determined by a combination of any two of the values in the second group. For example, the ratio of the fourth open area ratio to the third open area ratio may be greater than or equal to 0.2 and less than or equal to 0.8, may be greater than or equal to 0.2 and less than or equal to 0.7, may be greater than or equal to 0.2 and less than or equal to 0.6, may be greater than or equal to 0.2 and less than or equal to 0.4, may be greater than or equal to 0.2 and less than or equal to 0.3, may be greater than or equal to 0.3 and less than or equal to 0.8, may be greater than or equal to 0.3 and less than or equal to 0.7, may be greater than or equal to 0.3 and less than or equal to 0.6, may be greater than or equal to 0.3 and less than or equal to 0.4, may be greater than or equal to 0.4 and less than or equal to 0.8, may be greater than or equal to 0.4 and less than or equal to 0.7, may be greater than or equal to 0.4 and less than or equal to 0.6, may be greater than or equal to 0.6 and less than or equal to 0.8, may be greater than or equal to 0.6 and less than or equal to 0.7, or may be greater than or equal to 0.7 and less than or equal to 0.8.

The mask 50 may have alignment marks 50M. The alignment marks 50M are formed at, for example, the corners of the cell 52 of the mask 50. The alignment marks 50M may be used to align the mask 50 with the substrate 110 in a process of forming the second electrode 140 on the substrate 110 by vapor deposition using the mask 50. The alignment marks 50M may be formed at, for example, locations that overlap the frame 41. In manufacturing the mask assembly 40, the alignment marks 50M may be used to align the mask 50 with the frame 41.

Figure 14:
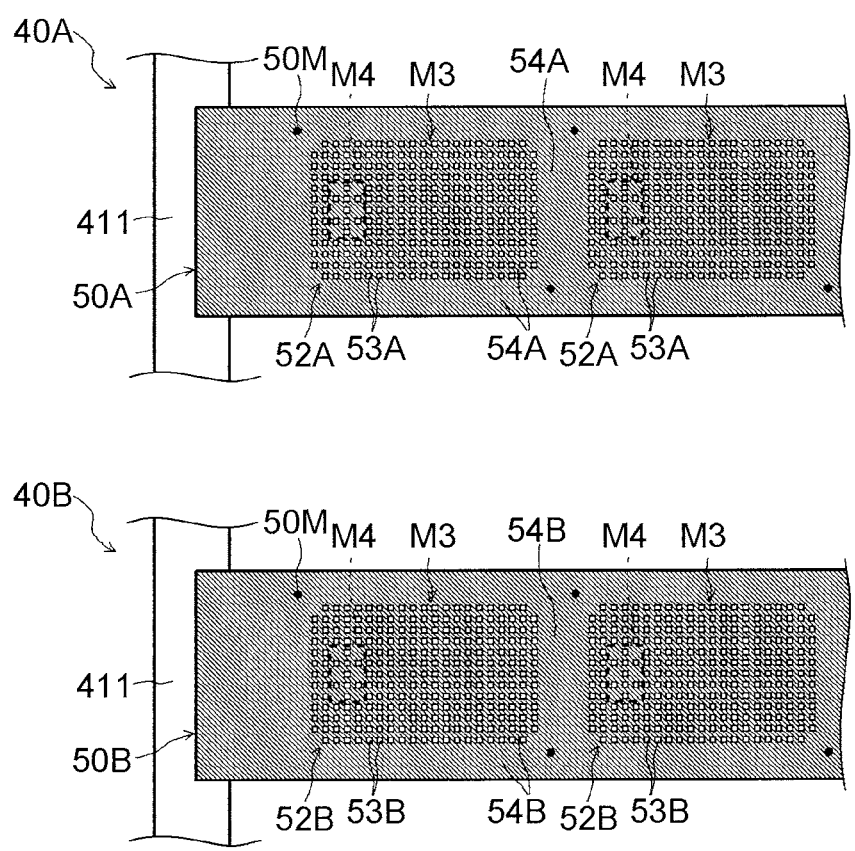
FIG. 14 is a diagram of a first mask assembly and a second mask assembly.

In the process of forming the second electrode 140, a plurality of the masks 50 may be used. For example, as shown in FIG. 14, the masks 50 may include the first mask 50A and the second mask 50B. The first mask 50A and the second mask 50B may respectively make up different mask assemblies 40. The mask assembly 40 that includes the first mask 50A is also referred to as first mask assembly 40A. The mask assembly 40 that includes the second mask 50B is also referred to as second mask assembly 40B.

In the process of forming the second electrode 140, for example, the first layers 140A of the second electrode 140 are formed on the substrate 110 by using the first mask assembly 40A in the vapor deposition system 10. Subsequently, the second layers 140B of the second electrode 140 are formed on the substrate 110 by using the second mask assembly 40B in the vapor deposition system 10. In this way, in the process of forming the second electrode 140 of the organic device 100, the plurality of masks 50, that is, the first mask 50A, the second mask 50B, and the like, are used sequentially. A group of the plurality of masks 50 used to form the second electrode 140 of the organic device 100 is also referred to as mask group.

Figure 15:
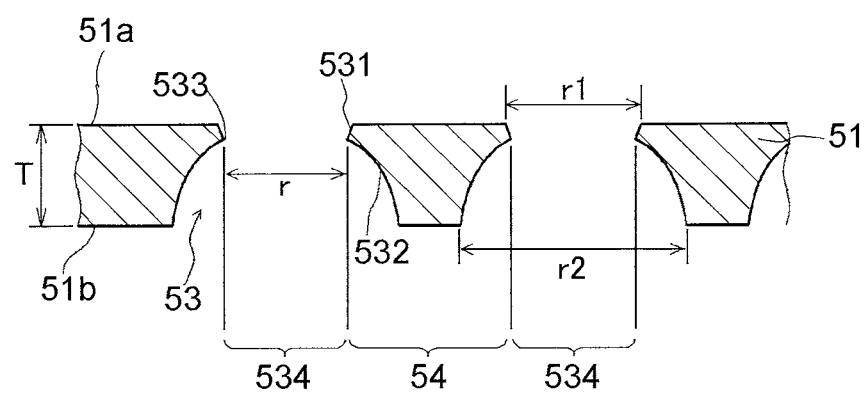
FIG. 15 is a diagram of an example of the sectional structure of the mask.

FIG. 15 is a diagram of an example of the sectional structure of the mask 50. The mask 50 includes the plurality of through-holes 53 formed in a metal sheet 51. The through-holes 53 extend through the metal sheet 51 from the first face 51*a* to the second face 51*b*.

Each of the through-holes 53 may have a first recess 531 and a second recess 532. The first recess 531 is located on the first face 51*a* side. The second recess 532 is located on the second face 51*b* side. The first recess 531 is connected to the second recess 532 in the direction along the thickness of the metal sheet 51.

In plan view, the size r2 of the second recess 532 may be greater than the size r1 of the first recess 531. The first recess 531 may be formed by the working of the metal sheet 51 by etching or the like from the first face 51*a* side. The second recess 532 may be formed by the working of the metal sheet 51 by etching or the like from the second face 51*b* side. The first recess 531 and the second recess 532 are connected at a connecting portion 533.

The reference sign 534 indicates a through portion. The open area of the through-hole 53 in plan view is smallest at the through portion 534. The through portion 534 may be defined by the connecting portion 533.

In vapor deposition using the masks 50, the vapor deposition material 7 having passed through the through portions 534 of the through-holes 53 from the second face 51*b* side to the first face 51*a* side is deposited on the substrate 110, with the result that layers, that is, the first layers 140A, the second layers 140B, the third layers 140C, and the like, are formed on the substrate 110. The outline of a layer formed on the substrate 110 in the in-plane direction of the substrate 110 is determined by the outline of the through portion 534 in plan view. The outlines of the through-holes 53 shown in the plan views of FIGS. 16 to 20, and the like (described later) are the outlines of the through portions 534. The area of the through-hole 53 may be the area of the through portion 534. The size of the through-hole 53 in plan view may be the size r of the through portion 534.

The area of the metal sheet 51, other than the through portions 534, is able to block the vapor deposition material 7 heading toward the substrate 110. The area of the metal sheet 51, other than the through portions 534, is also referred to as blocking area 54. In the plan views of the mask 50 of FIGS. 13, 14, 16, 17, and the like, the blocking area 54 is shaded by hatching. The blocking area 54 of the fourth mask area M4 may have a recess that does not extend through the metal sheet 51. When a recess is provided in the fourth mask area M4, the rigidity of the fourth mask area M4 is able to be reduced. Thus, it is possible to reduce the difference between the rigidity of the fourth mask area M4 and the rigidity of the third mask area M3. Therefore, it is possible to reduce occurrence of wrinkles in the mask 50 due to the difference in rigidity. Wrinkles tend to occur when, for example, a tension is applied to the mask 50.

The thickness T of the mask 50, for example, may be greater than or equal to 5 µm, may be greater than or equal to 10 µm, may be greater than or equal to 15 µm, or may be greater than or equal to 20 µm. The thickness T of the mask 50, for example, may be less than or equal to 25 µm, may be less than or equal to 30 µm, may be less than or equal to 50 µm, or may be less than or equal to 100 µm. The range of the thickness T of the mask 50 may be determined by a first group consisting of 5 µm, 10 µm, 15 µm, and 20 µm and/or a second group consisting of 25 µm, 30 µm, 50 µm, and 100 µm. The range of the thickness T of the mask 50 may be determined by a combination of any one of the values in the first group and any one of the values in the second group. The range of the thickness T of the mask 50 may be determined by a combination of any two of the values in the first group. The range of the thickness T of the mask 50 may be determined by a combination of any two of the values in the second group. For example, the thickness T of the mask 50 may be greater than or equal to 5 µm and less than or equal to 100 µm, may be greater than or equal to 5 µm and less than or equal to 50 µm, may be greater than or equal to 5 µm and less than or equal to 30 µm, may be greater than or equal to 5 µm and less than or equal to 25 µm, may be greater than or equal to 5 µm and less than or equal to 20 µm, may be greater than or equal to 5 µm and less than or equal to 15 µm, may be greater than or equal to 5 µm and less than or equal to 10 µm, may be greater than or equal to 10 µm and less than or equal to 100 µm, may be greater than or equal to 10 µm and less than or equal to 50 µm, may be greater than or equal to 10 µm and less than or equal to 30 µm, may be greater than or equal to 10 µm and less than or equal to 25 µm, may be greater than or equal to 10 µm and less than or equal to 20 µm, may be greater than or equal to 10 µm and less than or equal to 15 µm, may be greater than or equal to 15 µm and less than or equal to 100 µm, may be greater than or equal to 15 µm and less than or equal to 50 µm, may be greater than or equal to 15 µm and less than or equal to 30 µm, may be greater than or equal to 15 µm and less than or equal to 25 µm, may be greater than or equal to 15 µm and less than or equal to 20 µm, may be greater than or equal to 20 µm and less than or equal to 100 µm, may be greater than or equal to 20 µm and less than or equal to 50 µm, may be greater than or equal to 20 µm and less than or equal to 30 µm, may be greater than or equal to 20 µm and less than or equal to 25 µm, may be greater than or equal to 25 µm and less than or equal to 100 µm, may be greater than or equal to 25 µm and less than or equal to 50 µm, may be greater than or equal to 25 µm and less than or equal to 30 µm, may be greater than or equal to 30 µm and less than or equal to 100 µm, may be greater than or equal to 30 µm and less than or equal to 50 µm, or may be greater than or equal to 50 µm and less than or equal to 100 µm.

A contact measurement method may be adopted as a method of measuring the thickness T of the mask 50. The length gauge HEIDENHAIN-METRO MT1271 made by HEIDENHAIN, which includes a ball-bearing guide plunger, may be used as the contact measurement method.

The sectional shape of the through-hole 53 is not limited to the shape shown in FIG. 15. A method of forming the through-holes 53 is not limited to etching, and various methods may be adopted. For example, the mask 50 may be formed by plating such that the through-holes 53 are formed.

Examples of the material of the mask 50 include iron alloys that include nickel. The iron alloys may further include cobalt in addition to nickel. Examples of the material of the mask 50 include iron alloys of which the content of nickel and cobalt in total is higher than or equal to 30 percent by mass and lower than or equal to 54 percent by mass and the content of cobalt is higher than or equal to zero percent by mass and lower than or equal to six percent by mass. Examples of the iron alloys that include nickel or nickel and cobalt include Invar that includes nickel higher than or equal to 34 percent by mass and lower than or equal to 38 percent by mass, Super-Invar that includes nickel higher than or equal to 30 percent by mass and lower than or equal to 34 percent by mass and further includes cobalt, and Fe—Ni plating alloys that has a low-thermal expansion and that include nickel higher than or equal to 38 percent by mass and lower than or equal to 54 percent by mass. When such iron alloys are used, it is possible to reduce the thermal expansion coefficient of the mask 50. When, for example, a glass substrate is used as the substrate 110, the thermal expansion coefficient of the mask 50 is able to be set to a low value equivalent to that of the glass substrate. Thus, in the vapor deposition process, it is possible to suppress a decrease in the dimensional accuracy and positional accuracy of vapor deposition layers formed on the substrate 110 due to a difference in thermal expansion coefficient between the mask 50 and the substrate 110.

Figure 16:
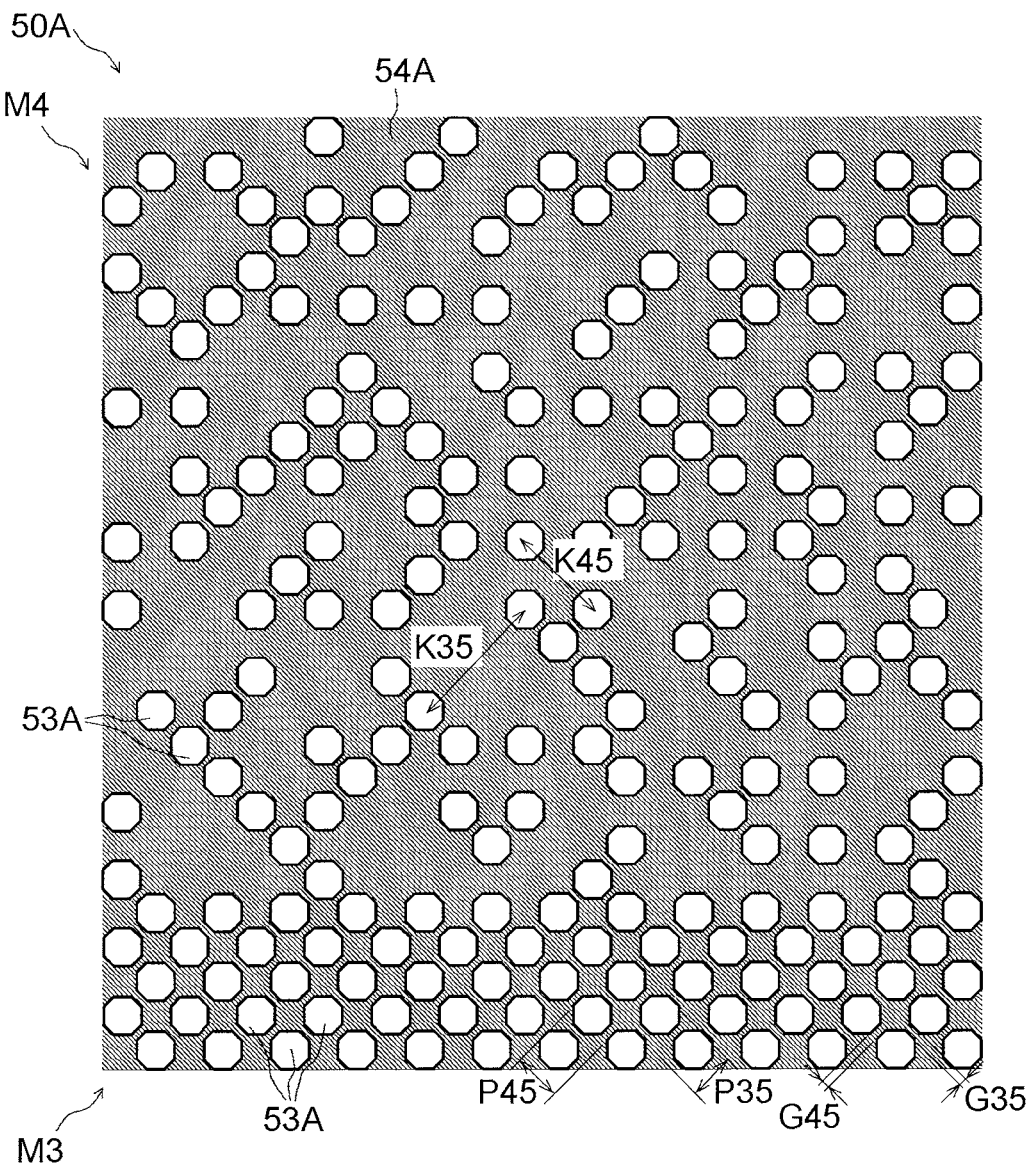
FIG. 16 is a plan view of an example of a first mask.
Figure 16:
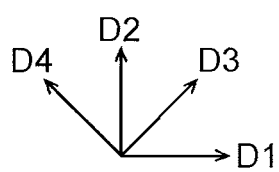

Next, the first mask 50A will be described in detail. FIG. 16 is an enlarged plan view of the third mask area M3 and the fourth mask area M4 of the first mask 50A. The first mask 50A includes first through-holes 53A and a first blocking area 54A.

The first mask 50A has the first mask direction D1, the second mask direction D2, a third mask direction D3, and a fourth mask direction D4. The first mask direction D1 may be parallel to the first element direction G1 in the vapor deposition process. The second mask direction D2 may be parallel to the second element direction G2 in the vapor deposition process. The third mask direction D3 is a direction that intersects with both the first mask direction D1 and the second mask direction D2. The angle formed by the third mask direction D3 with each of the first mask direction D1 and the second mask direction D2 is, for example, greater than or equal to 20° and less than or equal to 70°. The fourth mask direction D4 is a direction that intersects with both the first mask direction D1 and the second mask direction D2. The angle formed by the fourth mask direction D4 with each of the first mask direction D1 and the second mask direction D2 is, for example, greater than or equal to 20° and less than or equal to 70°. The third mask direction D3 intersects with the fourth mask direction D4. For example, the third mask direction D3 may be orthogonal to the fourth mask direction D4.

In the third mask area M3, the first through-holes 53A may be arranged at a thirty-fifth pitch P35 in the third mask direction D3. In the third mask area M3, the first through-holes 53A may be arranged at a forty-fifth pitch P45 in the fourth mask direction D4.

The reference sign G35 indicates the gap between any adjacent two of the first through-holes 53A in the third mask direction D3 in the third mask area M3. The gap G35, for example, may be greater than or equal to 5 µm, may be greater than or equal to 10 µm, or may be greater than or equal to 15 µm. The gap G35, for example, may be less than or equal to 30 µm, may be less than or equal to 40 µm, or may be less than or equal to 50 µm. The range of the gap G35 may be determined by a first group consisting of 5 µm, 10 µm, and 15 µm and/or a second group consisting of 30 µm, 40 µm, and 50 µm. The range of the gap G35 may be determined by a combination of any one of the values in the first group and any one of the values in the second group. The range of the gap G35 may be determined by a combination of any two of the values in the first group. The range of the gap G35 may be determined by a combination of any two of the values in the second group. For example, the gap G35 may be greater than or equal to 5 µm and less than or equal to 50 µm, may be greater than or equal to 5 µm and less than or equal to 40 µm, may be greater than or equal to 5 µm and less than or equal to 30 µm, may be greater than or equal to 5 µm and less than or equal to 15 µm, may be greater than or equal to 5 µm and less than or equal to 10 µm, may be greater than or equal to 10 µm and less than or equal to 50 µm, may be greater than or equal to 10 µm and less than or equal to 40 µm, may be greater than or equal to 10 µm and less than or equal to 30 µm, may be greater than or equal to 10 µm and less than or equal to 15 µm, may be greater than or equal to 15 µm and less than or equal to 50 µm, may be greater than or equal to 15 µm and less than or equal to 40 µm, may be greater than or equal to 15 µm and less than or equal to 30 µm, may be greater than or equal to 30 µm and less than or equal to 50 µm, may be greater than or equal to 30 µm and less than or equal to 40 µm, or may be greater than or equal to 40 µm and less than or equal to 50 µm.

The reference sign G45 indicates the gap between any adjacent two of the first through-holes 53A in the fourth mask direction D4 in the fourth mask area M4. The above-described range of the gap G35 may be adopted as the range of the gap G45.

As shown in FIG. 16, in the fourth mask area M4, the first through-holes 53A may be arranged in the third mask direction D3. In the fourth mask area M4, the distance K35 between the centers of any adjacent two of the first through-holes 53A in the third mask direction D3 may be N1 times the thirty-fifth pitch P35. N1 may be a number greater than or equal to one. N1 may be an integer greater than or equal to one. The value of N1 may vary according to a location.

The average of N1, for example, may be greater than or equal to 1.1, may be greater than or equal to 1.2, or may be greater than or equal to 1.5. The average of N1, for example, may be less than or equal to 2.0, may be less than or equal to 2.5, or may be less than or equal to 3.0. The range of the average of N1 may be determined by a first group consisting of 1.1, 1.2, and 1.5 and/or a second group consisting of 2.0, 2.5, and 3.0. The range of the average of N1 may be determined by a combination of any one of the values in the first group and any one of the values in the second group. The range of the average of N1 may be determined by a combination of any two of the values in the first group. The range of the average of N1 may be determined by a combination of any two of the values in the second group. For example, the average of N1 may be greater than or equal to 1.1 and less than or equal to 3.0, may be greater than or equal to 1.1 and less than or equal to 2.5, may be greater than or equal to 1.1 and less than or equal to 2.0, may be greater than or equal to 1.1 and less than or equal to 1.5, may be greater than or equal to 1.1 and less than or equal to 1.2, may be greater than or equal to 1.2 and less than or equal to 3.0, may be greater than or equal to 1.2 and less than or equal to 2.5, may be greater than or equal to 1.2 and less than or equal to 2.0, may be greater than or equal to 1.2 and less than or equal to 1.5, may be greater than or equal to 1.5 and less than or equal to 3.0, may be greater than or equal to 1.5 and less than or equal to 2.5, may be greater than or equal to 1.5 and less than or equal to 2.0, may be greater than or equal to 2.0 and less than or equal to 3.0, may be greater than or equal to 2.0 and less than or equal to 2.5, or may be greater than or equal to 2.5 and less than or equal to 3.0.

The ratio of the standard deviation of N1 to the average of N1, for example, may be greater than or equal to 0.2, may be greater than or equal to 0.3, or may be greater than or equal to 0.4. The ratio of the standard deviation of N1 to the average of N1, for example, may be less than or equal to 0.6, may be less than or equal to 0.7, or may be less than or equal to 0.8. The range of the ratio of the standard deviation of N1 to the average of N1 may be determined by a first group consisting of 0.2, 0.3, and 0.4 and/or a second group consisting of 0.6, 0.7, and 0.8. The range of the ratio of the standard deviation of N1 to the average of N1 may be determined by a combination of any one of the values in the first group and any one of the values in the second group. The range of the ratio of the standard deviation of N1 to the average of N1 may be determined by a combination of any two of the values in the first group. The range of the ratio of the standard deviation of N1 to the average of N1 may be determined by a combination of any two of the values in the second group. For example, the ratio of the standard deviation of N1 to the average of N1 may be greater than or equal to 0.2 and less than or equal to 0.8, may be greater than or equal to 0.2 and less than or equal to 0.7, may be greater than or equal to 0.2 and less than or equal to 0.6, may be greater than or equal to 0.2 and less than or equal to 0.4, may be greater than or equal to 0.2 and less than or equal to 0.3, may be greater than or equal to 0.3 and less than or equal to 0.8, may be greater than or equal to 0.3 and less than or equal to 0.7, may be greater than or equal to 0.3 and less than or equal to 0.6, may be greater than or equal to 0.3 and less than or equal to 0.4, may be greater than or equal to 0.4 and less than or equal to 0.8, may be greater than or equal to 0.4 and less than or equal to 0.7, may be greater than or equal to 0.4 and less than or equal to 0.6, may be greater than or equal to 0.6 and less than or equal to 0.8, may be greater than or equal to 0.6 and less than or equal to 0.7, or may be greater than or equal to 0.7 and less than or equal to 0.8.

In the fourth mask area M4, the first through-holes 53A may be arranged in the fourth mask direction D4. In the fourth mask area M4, the distance K45 between the centers of any adjacent two of the first through-holes 53A in the fourth mask direction D4 may be N2 times the forty-fifth pitch P45. N2 may be a number greater than or equal to one. N2 may be an integer greater than or equal to one. The value of N2 may vary according to a location. The above-described range of the average of N1 may be adopted as the range of the average of N2. The above-described range of the ratio of the standard deviation of N1 to the average of N1 may be adopted as the range of the ratio of the standard deviation of N2 to the average of N2.

Figure 17:
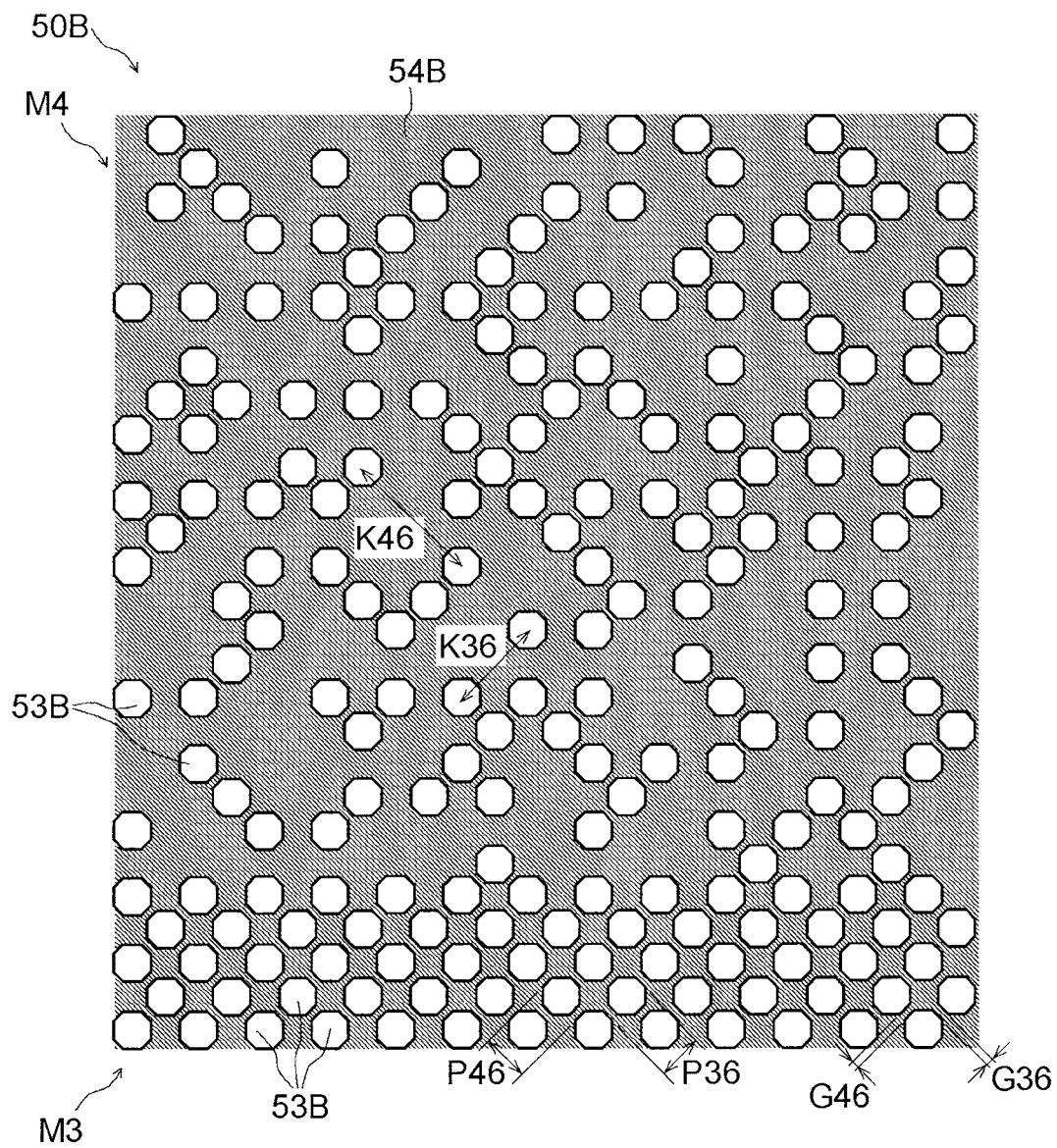
FIG. 17 is a plan view of an example of a second mask.
Figure 17:
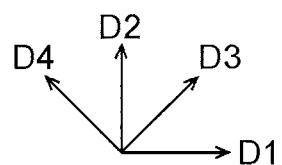

The second mask 50B will be described with reference to FIG. 17. The description of part of the second mask 50B configured similarly to the first mask 50A may not be repeated.

The second mask 50B includes second through-holes 53B and a second blocking area 54B. In the third mask area M3, the second through-holes 53B, as well as the first through-holes 53A, may be arranged at a thirty-sixth pitch P36 in the third mask direction D3. The thirty-sixth pitch P36 may be the same as the thirty-fifth pitch P35 in the first mask 50A. In the third mask area M3, the second through-holes 53B, as well as the first through-holes 53A, may be arranged at a forty-sixth pitch P46 in the fourth mask direction D4. The forty-sixth pitch P46 may be the same as the forty-fifth pitch P45 in the first mask 50A.

The reference sign G36 indicates the gap between any adjacent two of the second through-holes 53B in the third mask direction D3 in the third mask area M3. The above-described range of the gap G35 may be adopted as the range of the gap G36.

The reference sign G46 indicates the gap between any adjacent two of the second through-holes 53B in the fourth mask direction D4 in the third mask area M3. The above-described range of the gap G35 may be adopted as the range of the gap G46.

In the fourth mask area M4, the second through-holes 53B may be arranged in the third mask direction D3. In the fourth mask area M4, the distance K36 between the centers of any adjacent two of the second through-holes 53B in the third mask direction D3 may be N3 times the thirty-sixth pitch P36. N3 may be a number greater than or equal to one. N3 may be an integer greater than or equal to one. The value of N3 may vary according to a location. The above-described range of the average of N1 may be adopted as the range of the average of N3. The above-described range of the ratio of the standard deviation of N1 to the average of N1 may be adopted as the range of the ratio of the standard deviation of N3 to the average of N3.

In the fourth mask area M4, the second through-holes 53B may be arranged in the fourth mask direction D4. In the fourth mask area M4, the distance K46 between the centers of any adjacent two of the second through-holes 53B in the fourth mask direction D4 may be N4 times the forty-sixth pitch P46. N4 may be a number greater than or equal to one. N4 may be an integer greater than or equal to one. The value of N4 may vary according to a location. The above-described range of the average of N1 may be adopted as the range of the average of N4. The above-described range of the ratio of the standard deviation of N1 to the average of N1 may be adopted as the range of the ratio of the standard deviation of N4 to the average of N4.

In a method of measuring the shapes and arrangements of the through-holes 53A, 53B of the masks 50A, 50B, parallel light is caused to enter one of the first face 51a and the second face 51b in the direction normal to each mask. The parallel light exits from the other one of the first face 51a and the second face 51b. The shape of an area occupied by the outgoing light is measured as the shape of the through-hole 53.

A method of calculating N1 will be described. Initially, the arrangements and shapes of all the first through-holes 53A located in the fourth mask area M4 are measured and analyzed by using a size measuring device AMIC-701 made by SOKIA. Thus, the distance K35 on all the first through-holes 53A located in the fourth mask area M4 is calculated. In addition, the arrangements and shapes of the first through-holes 53A located in the third mask area M3 are similarly measured and analyzed. Thus, the thirty-fifth pitch P35 is calculated. Subsequently, the distance K35 is divided by the thirty-fifth pitch P35. Thus, N1 on all the first through-holes 53A located in the fourth mask area M4 is calculated. N2, N3, and N4 are also calculated similarly. N1, N2, N3, and N4 may be calculated in accordance with a design drawing and design values for manufacturing a mask.

Figure 18:
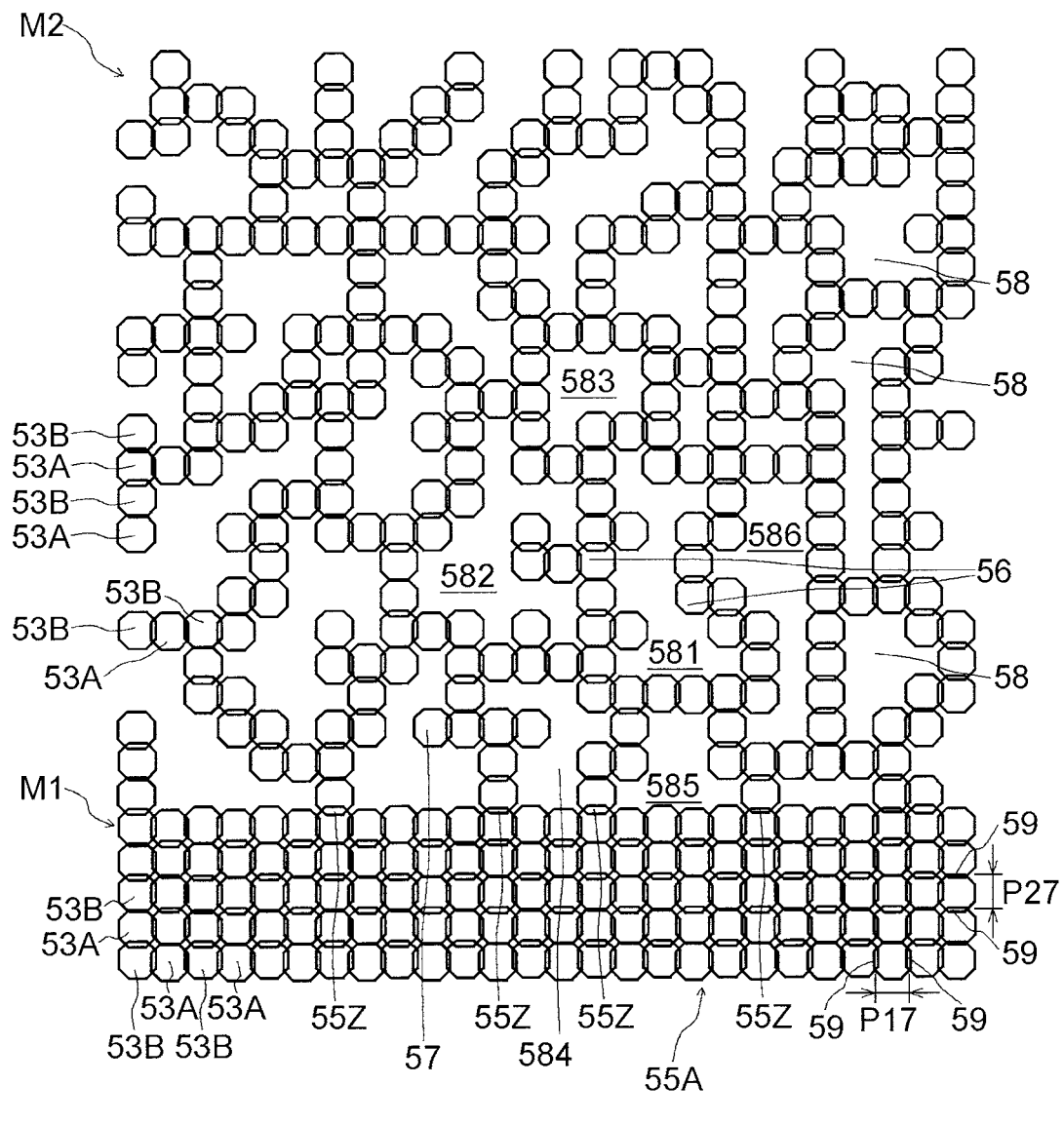
FIG. 18 is a plan view of an example of a mask stack.

Next, the positional relationship between the first mask 50A and the second mask 50B will be described. FIG. 18 is a plan view of a mask stack 55. The mask stack 55 includes two or more stacked masks 50. The mask stack 55 shown in FIG. 18 includes the stacked first mask 50A and second mask 50B.

In the mask stack 55, the alignment marks 50M of the masks 50A, 50B may overlap each other. Alternatively, the masks 50A, 50B may be stacked in accordance with the arrangement of the cells 52 of the masks 50A, 50B. Alternatively, the masks 50A, 50B may be stacked in accordance with the arrangement of the through-holes 53A, 53B and blocking areas 54A, 54B of the masks 50A, 50B. In stacking the masks 50A, 50B, a tension may be applied to each of the masks 50A, 50B, or a tension does not need to be applied.

A view in a state where two or more masks 50 are stacked may be obtained by superposing image data of the masks 50. For example, initially, image data on the outline of each of the through-holes 53A, 53B of the masks 50A, 50B is obtained by using an image capturing apparatus. Subsequently, the pieces of image data of the masks 50A, 50B are superposed by using an image processing apparatus. Thus, the view as shown in FIG. 18 is drawn. In acquiring image data, a tension may be applied to each of the masks 50A, 50B, or a tension does not need to be applied. A view in a state where two or more masks 50 are stacked may be obtained by superposing design drawings for manufacturing the masks 50A, 50B.

As shown in FIG. 18, the mask stack 55 includes through areas 55A, overlap areas 58, and hole overlap areas 59.

The through area 55A includes at least one of the through-holes 53 of the masks 50 included in the mask stack 55 in plan view. In the example shown in FIG. 18, the through area 55A includes at least one of the through-holes 53A, 53B of the masks 50A, 50B. In other words, the through area 55A overlaps at least any one of the through-holes 53A, 53B of the masks 50A, 50B in plan view. Therefore, in the vapor deposition process, at least one-layer second electrode 140 is formed in an area of the substrate 110, corresponding to the through area 55A.

The hole overlap area 59 is an area in which the through-holes 53 of two or more masks 50 overlap in plan view. In other words, the hole overlap area 59 includes at least two of the through-holes 53 of two or more of the masks 50 included in the mask stack 55 in plan view. In the example shown in FIG. 18, the hole overlap area 59 is an area in which the first through-hole 53A and the second through-hole 53B overlap in plan view. In other words, the hole overlap area 59 includes the first through-hole 53A and the second through-hole 53B. Therefore, in the vapor deposition process, the second electrode 140 with at least two-layer is formed in areas of the substrate 110, corresponding to the hole overlap areas 59.

The overlap area 58 is an area in which all the blocking areas 54 of the masks 50 overlap in plan view. In other words, the overlap area 58 includes all the blocking areas 54 of the masks 50 in plan view. In other words, the overlap area 58 does not overlap any of the through-holes 53 of the masks in plan view. In the example shown in FIG. 18, the overlap area 58 is an area in which the first blocking area 54A and the second blocking area 54B overlap in plan view. In other words, the overlap area 58 includes the first blocking area 54A and the second blocking area 54B. Therefore, in the vapor deposition process, the second electrode 140 is not formed in areas of the substrate 110, corresponding to the overlap area 58. In other words, in the vapor deposition process, the transmission areas 104 are formed in areas of the substrate 110, corresponding to the overlap areas 58.

In plan view, the mask stack 55 includes the first mask area M1 and the second mask area M2. The first mask area M1 corresponds to the first display area 101 of the organic device 100. The second mask area M2 corresponds to the second display area 102 of the organic device 100.

In the first mask area M1, the through area 55A has a first open area ratio. The first open area ratio is calculated by dividing the total area of the through area 55A located in the first mask area M1 by the area of the first mask area M1. In the second mask area M2, the through area 55A has a second open area ratio. The second open area ratio is calculated by dividing the total area of the through area 55A located in the second mask area M2 by the area of the second mask area M2. The second open area ratio may be less than the first open area ratio.

The ratio of the second open area ratio to the first open area ratio, for example, may be greater than or equal to 0.2, may be greater than or equal to 0.3, or may be greater than or equal to 0.4. The ratio of the second open area ratio to the first open area ratio, for example, may be less than or equal to 0.6, may be less than or equal to 0.7, or may be less than or equal to 0.8. The range of the ratio of the second open area ratio to the first open area ratio may be determined by a first group consisting of 0.2, 0.3, and 0.4, and/or a second group consisting of 0.6, 0.7, and 0.8. The range of the ratio of the second open area ratio to the first open area ratio may be determined by a combination of any one of the values in the first group and any one of the values in the second group. The range of the ratio of the second open area ratio to the first open area ratio may be determined by a combination of any two of the values in the first group. The range of the ratio of the second open area ratio to the first open area ratio may be determined by a combination of any two of the values in the second group. For example, the ratio of the second open area ratio to the first open area ratio may be greater than or equal to 0.2 and less than or equal to 0.8, may be greater than or equal to 0.2 and less than or equal to 0.7, may be greater than or equal to 0.2 and less than or equal to 0.6, may be greater than or equal to 0.2 and less than or equal to 0.4, may be greater than or equal to 0.2 and less than or equal to 0.3, may be greater than or equal to 0.3 and less than or equal to 0.8, may be greater than or equal to 0.3 and less than or equal to 0.7, may be greater than or equal to 0.3 and less than or equal to 0.6, may be greater than or equal to 0.3 and less than or equal to 0.4, may be greater than or equal to 0.4 and less than or equal to 0.8, may be greater than or equal to 0.4 and less than or equal to 0.7, may be greater than or equal to 0.4 and less than or equal to 0.6, may be greater than or equal to 0.6 and less than or equal to 0.8, may be greater than or equal to 0.6 and less than or equal to 0.7, or may be greater than or equal to 0.7 and less than or equal to 0.8.

In the first mask area M1, the first through-hole 53A and the second through-hole 53B may be alternately arranged in the first mask direction D1. The first through-hole 53A may be connected to the second through-hole 53B in the first mask direction D1. In this case, in the first mask area M1, the hole overlap areas 59 may be arranged at a seventeenth pitch P17 in the first mask direction D1.

In the first mask area M1, the first through-hole 53A and the second through-hole 53B may be alternately arranged in the second mask direction D2. The first through-hole 53A may be connected to the second through-hole 53B in the second mask direction D2. In this case, in the first mask area M1, the hole overlap areas 59 may be arranged at a twenty-seventh pitch P27 in the second mask direction D2.

The area of the hole overlap area 59 may be less than the area of the first through-hole 53A. The ratio of the area of the hole overlap area 59 to the area of the first through-hole 53A, for example, may be greater than or equal to 0.02, may be greater than or equal to 0.05, or may be greater than or equal to 0.10. The ratio of the area of the hole overlap area 59 to the area of the first through-hole 53A, for example, may be less than or equal to 0.20, may be less than or equal to 0.30, or may be less than or equal to 0.40. The range of the ratio of the area of the hole overlap area 59 to the area of the first through-hole 53A may be determined by a first group consisting of 0.01, 0.05, and 0.10 and/or a second group consisting of 0.20, 0.30, and 0.40. The range of the ratio of the area of the hole overlap area 59 to the area of the first through-hole 53A may be determined by a combination of any one of the values in the first group and any one of the values in the second group. The range of the ratio of the hole overlap area 59 to the area of the first through-hole 53A may be determined by a combination of any two of the values in the first group. The range of the ratio of the hole overlap area 59 to the area of the first through-hole 53A may be determined by a combination of any two of the values in the second group. For example, the ratio of the area of the hole overlap area 59 to the area of the first through-hole 53A may be greater than or equal to 0.01 and less than or equal to 0.40, may be greater than or equal to 0.01 and less than or equal to 0.30, may be greater than or equal to 0.01 and less than or equal to 0.20, may be greater than or equal to 0.01 and less than or equal to 0.10, may be greater than or equal to 0.01 and less than or equal to 0.05, may be greater than or equal to 0.05 and less than or equal to 0.40, may be greater than or equal to 0.05 and less than or equal to 0.30, may be greater than or equal to 0.05 and less than or equal to 0.20, may be greater than or equal to 0.05 and less than or equal to 0.10, may be greater than or equal to 0.10 and less than or equal to 0.40, may be greater than or equal to 0.10 and less than or equal to 0.30, may be greater than or equal to 0.10 and less than or equal to 0.20, may be greater than or equal to 0.20 and less than or equal to 0.40, may be greater than or equal to 0.20 and less than or equal to 0.30, or may be greater than or equal to 0.30 and less than or equal to 0.40.

The area of the hole overlap area 59 may be less than the area of the second through-hole 53B. The above-described range of the ratio of the area of the hole overlap area 59 to the area of the first through-hole 53A may be adopted as the range of the ratio of the area of the hole overlap area 59 to the area of the second through-hole 53B.

As shown in FIG. 18, in the second mask area M2, the overlap areas 58 may be disposed irregularly. Thus, each of the transmission areas 104 corresponding to the overlap areas 58 may have an irregular shape.

An example of the irregular shapes will be described. As shown in FIG. 18, the overlap areas 58 may include a first overlap area 581 and a second overlap area 582. The second overlap area 582 is adjacent to the first overlap area 581 via the through area 55A. The first overlap area 581 has a first mask shape. The second overlap area 582 may have a second mask shape different from the first mask shape. A specific difference between the first mask shape and the second mask shape is selected. For example, the area of the second mask shape may be different from the area of the first mask shape.

Figure 19:
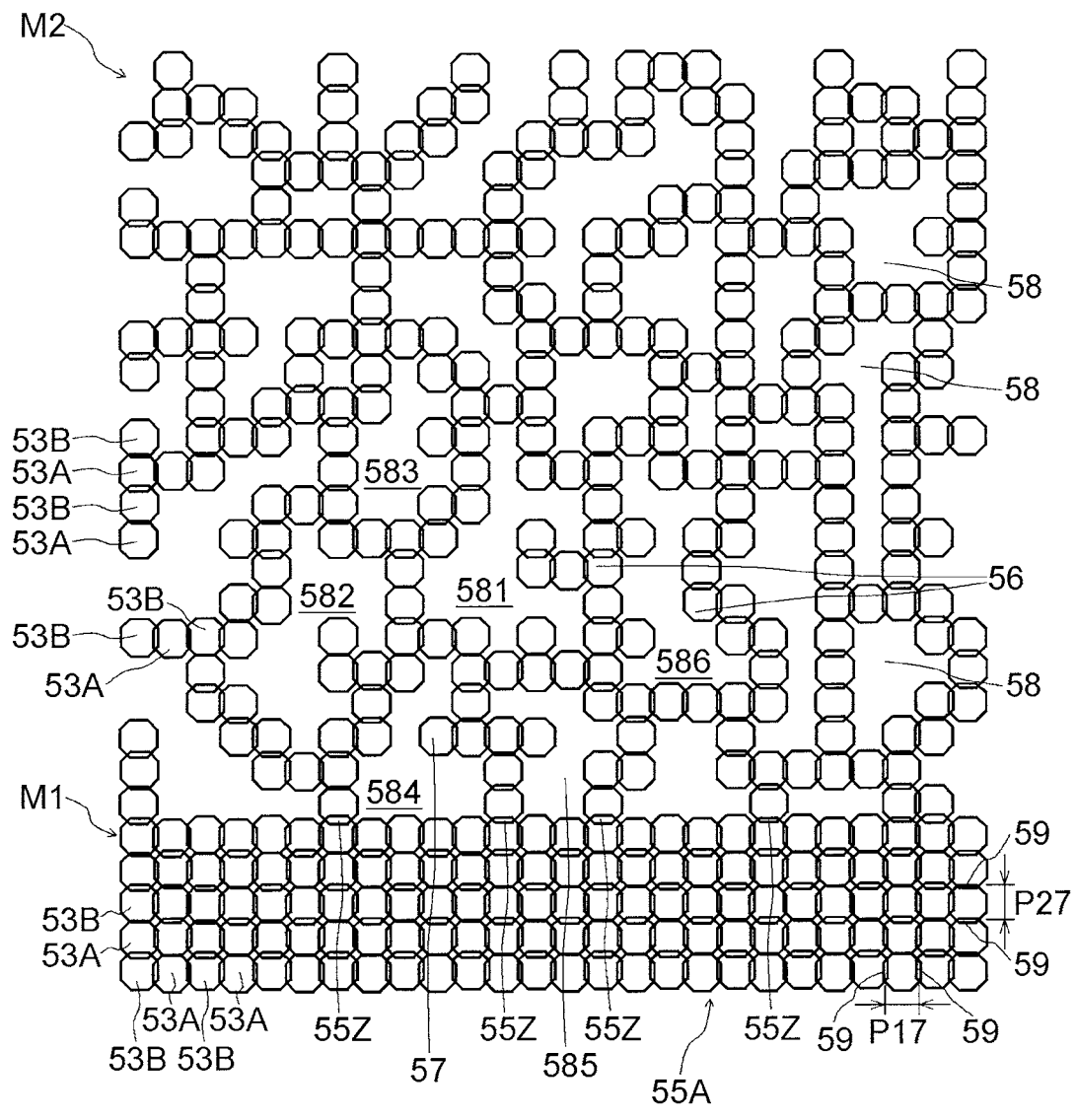
FIG. 19 is a plan view of an example of a manner of classifying overlap areas of the mask stack.

The first overlap area 581 does not need to be a term that indicates a specific overlap area 58. For example, as shown in FIG. 19, the overlap area 58 different from the first overlap area 581 in the case of FIG. 18 may correspond to the first overlap area 581. The shapes of the through area 55A and the overlap area 58 in FIG. 19 are the same as the shapes of the through area 55A and the overlap area 58 in FIG. 18. In the example of FIG. 19 as well, there is the overlap area 58 adjacent to the first overlap area 581 via the through area 55A and that having a shape different from that of the first overlap area 581. In other words, in the example of FIG. 19 as well, there is the overlap area 58 that corresponds to the second overlap area 582 in relation to the first overlap area 581. In this way, when the adjacent two of the overlap areas 58 via the through area 55A have shape different from each other, one of the overlap areas 58 may be referred to as the first overlap area 581, and the other one of the overlap areas 58 may be referred to as the second overlap area 582.

The second mask area M2 may have an eleventh applicable percentage. The eleventh applicable percentage is the percentage of an eleventh applicable number to the total number of the overlap areas 58. The eleventh applicable number is the number of the overlap areas 58 that can be referred to as the first overlap area 581 in relation to the second overlap area 582. The eleventh applicable percentage, for example, may be higher than or equal to 80%, may be higher than or equal to 85%, or may be higher than or equal to 90%. The eleventh applicable percentage, for example, may be lower than or equal to 95%, may be lower than or equal to 97%, or may be lower than or equal to 99%. The range of the eleventh applicable percentage may be determined by a first group consisting of 80%, 85%, and 90% and/or a second group consisting of 95%, 97%, and 99%. The range of the eleventh applicable percentage may be determined by a combination of any one of the values in the first group and any one of the values in the second group. The range of the eleventh applicable percentage may be determined by a combination of any two of the values in the first group. The range of the eleventh applicable percentage may be determined by a combination of any two of the values in the second group. For example, the eleventh applicable percentage may be higher than or equal to 80% and lower than or equal to 99%, may be higher than or equal to 80% and lower than or equal to 97%, may be higher than or equal to 80% and lower than or equal to 95%, may be higher than or equal to 80% and lower than or equal to 90%, may be higher than or equal to 80% and lower than or equal to 85%, may be higher than or equal to 85% and lower than or equal to 99%, may be higher than or equal to 85% and lower than or equal to 97%, may be higher than or equal to 85% and lower than or equal to 95%, may be higher than or equal to 85% and lower than or equal to 90%, may be higher than or equal to 90% and lower than or equal to 99%, may be higher than or equal to 90% and lower than or equal to 97%, may be higher than or equal to 90% and lower than or equal to 95%, may be higher than or equal to 95% and lower than or equal to 99%, may be higher than or equal to 95% and lower than or equal to 97%, or may be higher than or equal to 97% and lower than or equal to 99%.

As shown in FIGS. 18 and 19, the overlap areas 58 may include a third overlap area 583. The third overlap area 583 is adjacent to the first overlap area 581 and the second overlap area 582 via the through area 55A. The third overlap area 583 may have a third mask shape different from the first mask shape or the second mask shape. For example, the area of the third mask shape may be different from the area of the first mask shape or the area of the second mask shape.

The second mask area M2 may have a twelfth applicable percentage. The twelfth applicable percentage is the percentage of a twelfth applicable number to the total number of the overlap areas 58. The twelfth applicable number is the number of the overlap areas 58 that can be referred to as the first overlap area 581 in relation to the second overlap area 582 and the third overlap area 583. The above-described range of the eleventh applicable percentage may be adopted as the range of the twelfth applicable percentage.

As shown in FIGS. 18 and 19, the overlap areas 58 may include a fourth overlap area 584. The fourth overlap area 584 is adjacent to the first overlap area 581 and the second overlap area 582 via the through area 55A. The fourth overlap area 584 may have a fourth mask shape different from the first mask shape or the second mask shape. For example, the area of the fourth mask shape may be different from the area of the first mask shape or the area of the second mask shape. The fourth mask shape may be different from the third mask shape.

The second mask area M2 may have a thirteenth applicable percentage. The thirteenth applicable percentage is the percentage of a thirteenth applicable number to the total number of the overlap areas 58. The thirteenth applicable number is the number of the overlap areas 58 that can be referred to as the first overlap area 581 in relation to the second overlap area 582, the third overlap area 583, and the fourth overlap area 584. The above-described range of the eleventh applicable percentage may be adopted as the range of the thirteenth applicable percentage.

As shown in FIGS. 18 and 19, the overlap areas 58 may include a fifth overlap area 585. The fifth overlap area 585 is adjacent to the first overlap area 581 via the through area 55A. The fifth overlap area 585 is adjacent to the fourth overlap area 584 via the through area 55A. The fifth overlap area 585 may have a fifth mask shape different from the first mask shape. For example, the area of the fifth mask shape may be different from the area of the first mask shape. The fifth mask shape may be different from the second mask shape, the third mask shape, or the fourth mask shape.

The second mask area M2 may have a fourteenth applicable percentage. The fourteenth applicable percentage is the percentage of a fourteenth applicable number to the total number of the overlap areas 58. The fourteenth applicable number is the number of the overlap areas 58 that can be referred to as the first overlap area 581 in relation to the second overlap area 582, the third overlap area 583, the fourth overlap area 584, and the fifth overlap area 585. The above-described range of the eleventh applicable percentage may be adopted as the range of the fourteenth applicable percentage.

As shown in FIGS. 18 and 19, the overlap areas 58 may include a sixth overlap area 586. The sixth overlap area 586 is adjacent to the first overlap area 581 via the through area 55A. The sixth overlap area 586 may have a sixth mask shape different from the first mask shape. For example, the area of the sixth mask shape may be different from the area of the first mask shape. The sixth mask shape may be different from the second mask shape, the third mask shape, the fourth mask shape, or the fifth mask shape.

The second mask area M2 may have a fifteenth applicable percentage. The fifteenth applicable percentage is the percentage of a fifteenth applicable number to the total number of the overlap areas 58. The fifteenth applicable number is the number of the overlap areas 58 that can be referred to as the first overlap area 581 in relation to the second overlap area 582, the third overlap area 583, the fourth overlap area 584, the fifth overlap area 585, and the sixth overlap area 586. The above-described range of the eleventh applicable percentage may be adopted as the range of the fifteenth applicable percentage.

Next, the through areas 55A will be described. As shown in FIGS. 18 and 19, the through areas 55A may have connection ends 55Z. Each of the connection ends 55Z connects the through area 55A of the second mask area M2 to the through area 55A of the first mask area M1. Each of the connection ends 55Z is the through area 55A located at the boundary between the first mask area M1 and the second mask area M2. The connection ends 55Z, as well as the above-described electrode connection ends 1402 of the second electrode 140, may include a first connection end, a second connection end, a third connection end, and a fourth connection end. The first connection end is located at one of the boundaries in the first mask direction D1. The second connection end is located at the other one of the boundaries in the first mask direction D1. The third connection end is located at one of the boundaries in the second mask direction D2. The fourth connection end is located at the other one of the boundaries in the second mask direction D2.

As well as the second electrode 140Y of the second display area 102, the through areas 55A of the second mask area M2 may include an area that is continuous from one of the connection ends to another one of the connection ends. For example, the through areas 55A may include the following areas. The areas may overlap each other. The through areas 55A may include all the areas of the following types. The through areas 55A may include one or some of the areas of the following types.

An area continuous from the first connection end to the second connection end

An area continuous from the first connection end to the third connection end

An area continuous from the first connection end to the fourth connection end

An area continuous from the second connection end to the third connection end

An area continuous from the second connection end to the fourth connection end

An area continuous from the third connection end to the fourth connection end

As shown in FIGS. 18 and 19, the through areas 55A of the second mask area M2 may include trunk areas 56 and branch areas 57. Each of the trunk areas 56 makes up a path from one of the connection ends to another one of the connection ends. Each of the branch areas 57 is connected to any one of the trunk areas 56.

Figure 20:
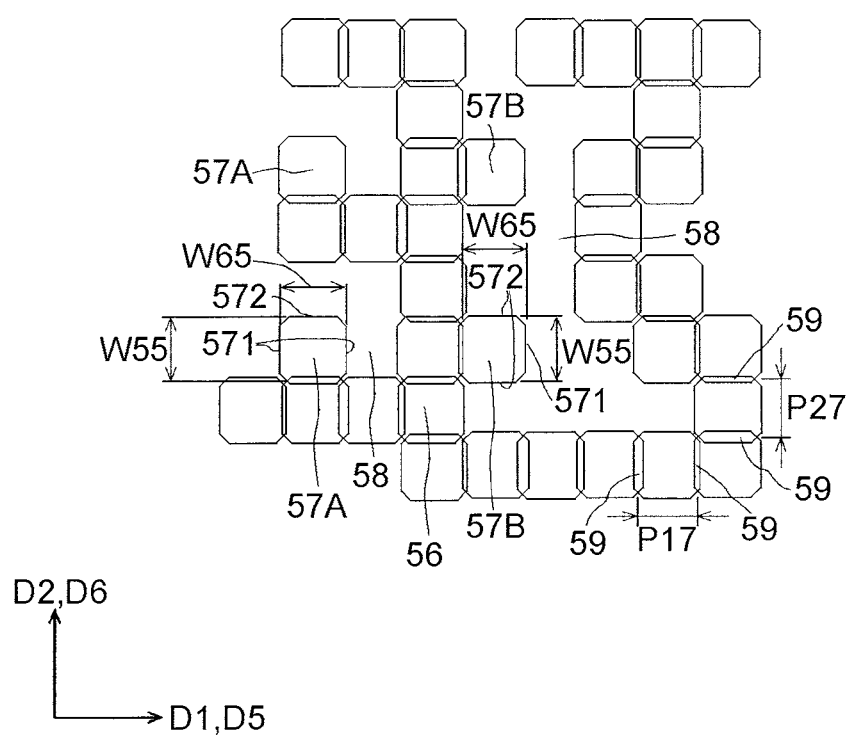
FIG. 20 is a plan view of examples of a branch area in the overlap area.

FIG. 20 is a plan view of examples of the branch area 57. The branch area 57 may be a first branch area 57A or may be a second branch area 57B.

The first branch area 57A includes two first area ends 571 and one second area end 572. The first area end 571 is an end of the branch area 57 in a fifth mask direction D5. The two first area ends 571 are opposite in the fifth mask direction D5. The fifth mask direction D5 may be parallel to the first mask direction D1. Although not shown in the drawing, the fifth mask direction D5 does not need to be parallel to the first mask direction D1. The second area end 572 is an end of the branch area 57 in a sixth mask direction D6. The sixth mask direction D6 intersects with the fifth mask direction D5. The sixth mask direction D6 may be orthogonal to the fifth mask direction D5. The two first area ends 571 and the one second area end 572 are in contact with the overlap area 58.

The second branch area 57B includes one first area end 571 and two second area ends 572. The two second area ends 572 are opposite in the sixth mask direction D6. The one first area end 571 and the two second area ends 572 are in contact with the overlap area 58.

The width W55 of the first area end 571 may have a constant ratio to the twenty-seventh pitch P27. The ratio of the width W55 to the twenty-seventh pitch P27, for example, may be greater than or equal to 0.4, may be greater than or equal to 0.6, or may be greater than or equal to 0.8. The ratio of the width W55 to the twenty-seventh pitch P27, for example, may be less than or equal to 1.2, may be less than or equal to 1.4, or may be less than or equal to 1.6. The range of the ratio of the width W55 to the twenty-seventh pitch P27 may be determined by a first group consisting of 0.4, 0.6, and 0.8 and/or a second group consisting of 1.2, 1.4, and 1.6. The range of the ratio of the width W55 to the twenty-seventh pitch P27 may be determined by a combination of any one of the values in the first group and any one of the values in the second group. The range of the ratio of the width W55 to the twenty-seventh pitch P27 may be determined by a combination of any two of the values in the first group. The range of the ratio of the width W55 to the twenty-seventh pitch P27 may be determined by a combination of any two of the values in the second group. For example, the ratio of width W55 to the twenty-seventh pitch P27 may be greater than or equal to 0.4 and less than or equal to 1.6, may be greater than or equal to 0.4 and less than or equal to 1.4, may be greater than or equal to 0.4 and less than or equal to 1.2, may be greater than or equal to 0.4 and less than or equal to 0.8, may be greater than or equal to 0.4 and less than or equal to 0.6, may be greater than or equal to 0.6 and less than or equal to 1.6, may be greater than or equal to 0.6 and less than or equal to 1.4, may be greater than or equal to 0.6 and less than or equal to 1.2, may be greater than or equal to 0.6 and less than or equal to 0.8, may be greater than or equal to 0.8 and less than or equal to 1.6, may be greater than or equal to 0.8 and less than or equal to 1.4, may be greater than or equal to 0.8 and less than or equal to 1.2, may be greater than or equal to 1.2 and less than or equal to 1.6, may be greater than or equal to 1.2 and less than or equal to 1.4, or may be greater than or equal to 1.4 and less than or equal to 1.6.

The width W65 of the second area end 572 may have a constant ratio to the seventeenth pitch P17. The ratio of the width W65 to the seventeenth pitch P17, for example, may be greater than or equal to 0.4, may be greater than or equal to 0.6, or may be greater than or equal to 0.8. The ratio of the width W65 to the seventeenth pitch P17, for example, may be less than or equal to 1.2, may be less than or equal to 1.4, or may be less than or equal to 1.6. The range of the ratio of the width W65 to the seventeenth pitch P17 may be determined by a first group consisting of 0.4, 0.6, and 0.8 and/or a second group consisting of 1.2, 1.4, and 1.6. The range of the ratio of the width W65 to the seventeenth pitch P17 may be determined by a combination of any one of the values in the first group and any one of the values in the second group. The range of the ratio of the width W65 to the seventeenth pitch P17 may be determined by a combination of any two of the values in the first group. The range of the ratio of the width W65 to the seventeenth pitch P17 may be determined by a combination of any two of the values in the second group. For example, the ratio of width W65 to the seventeenth pitch P17 may be greater than or equal to 0.4 and less than or equal to 1.6, may be greater than or equal to 0.4 and less than or equal to 1.4, may be greater than or equal to 0.4 and less than or equal to 1.2, may be greater than or equal to 0.4 and less than or equal to 0.8, may be greater than or equal to 0.4 and less than or equal to 0.6, may be greater than or equal to 0.6 and less than or equal to 1.6, may be greater than or equal to 0.6 and less than or equal to 1.4, may be greater than or equal to 0.6 and less than or equal to 1.2, may be greater than or equal to 0.6 and less than or equal to 0.8, may be greater than or equal to 0.8 and less than or equal to 1.6, may be greater than or equal to 0.8 and less than or equal to 1.4, may be greater than or equal to 0.8 and less than or equal to 1.2, may be greater than or equal to 1.2 and less than or equal to 1.6, may be greater than or equal to 1.2 and less than or equal to 1.4, or may be greater than or equal to 1.4 and less than or equal to 1.6.

Since the through areas 55A include the branch areas 57, it is easy to dispose the through areas 55A irregularly. Therefore, the second electrode 140Y can be formed irregularly. Thus, it is possible to further reduce constructive interference between light waves diffracted at the time of passing through the transmission areas 104.

Next, an example of the method of manufacturing the organic device 100 will be described.

Initially, the substrate 110 on which the first electrodes 120 are formed is prepared. The first electrodes 120 are formed by, for example, forming a conductive layer that makes up the first electrodes 120 on the substrate 110 by sputtering or the like and then patterning the conductive layer by photolithography or the like. The insulating layer 160 located between any adjacent two of the first electrodes 120 in plan view may be formed on the substrate 110.

Subsequently, as shown in FIG. 8, the organic layers 130 that include the first organic layers 130A and the second organic layers 130B are formed on the first electrodes 120. The first organic layers 130A may be formed by, for example, vapor deposition using a mask having through-holes corresponding to the first organic layers 130A. For example, the first organic layers 130A are able to be formed by depositing an organic material or the like on the first electrodes 120 corresponding to the first organic layers 130A via the mask. The second organic layers 130B may also be formed by, for example, vapor deposition using a mask having through-holes corresponding to the second organic layers 130B.

Subsequently, a second electrode forming process may be carried out. In the second electrode forming process, the second electrode 140 is formed on the organic layers 130 by using the above-described mask group. Initially, a process of forming the first layers 140A of the second electrode 140 by vapor deposition using the first mask 50A may be performed. For example, a conductive material or the like, such as a metal, is deposited on the organic layers 130 and the like via the first mask 50A. Thus, the first layers 140A are formed. Subsequently, a process of forming the second layers 140B of the second electrode 140 by vapor deposition using the second mask 50B may be performed. For example, a conductive material or the like, such as a metal, is deposited on the organic layers 130 and the like via the second mask 50B. Thus, the second layers 140B are formed. In this way, as shown in FIG. 7, the second electrode 140 that includes the first layers 140A and the second layers 140B is formed.

The order in which the first layers 140A and the second layers 140B are formed is not limited. For example, a vapor deposition process may be performed in order of the second layers 140B and the first layers 140A.

The advantageous effects of the embodiment of the present disclosure will be summarized.

When the second display area 102 of the organic device 100 includes the transmission areas 104, light having reached the organic device 100 is able to pass through the transmission areas 104 and reach an optical component or the like on the back side of the substrate. Therefore, the second display area 102 is able to detect light and display a video. Therefore, the function of the sensor, such as a camera and a fingerprint sensor, can be implemented in the second display area 102.

When the shape of the transmission area 104 is not constant, it is possible to reduce constructive interference between light waves diffracted at the time of passing through the transmission areas 104. Therefore, it is possible to reduce entry of high-intensity diffracted light into the sensor. Thus, for example, it is possible to reduce blurring of an image generated by the sensor.

Figure 21:
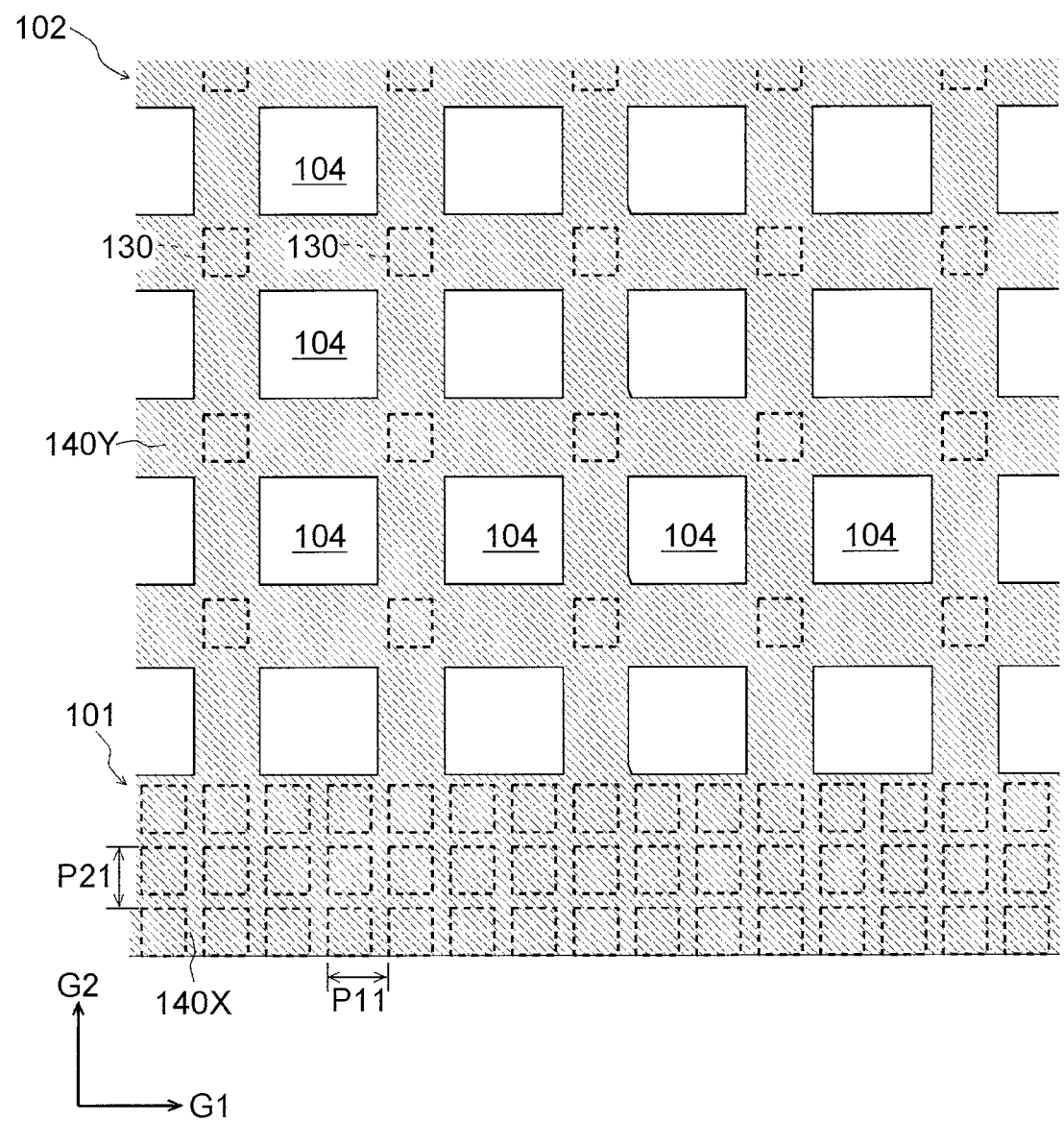
FIG. 21 is a plan view of an example of a second display area according to a reference embodiment.

FIG. 21 is an enlarged plan view of an example of the second display area 102 according to a reference embodiment. In the example shown in FIG. 21, the shape the transmission area 104 is constant. Specifically, the transmission area 104 has a square shape in plan view. In this case, light waves diffracted at the time of passing through the transmission areas 104 can reinforce each other in a specific direction. Therefore, an image generated by the sensor provided in the second display area 102 can be blurred.

In contrast, according to the example of FIG. 3, since the shape of the transmission area 104 is not constant, it is possible to reduce constructive interference between light waves diffracted at the time of passing through the transmission areas 104. Therefore, it is possible to reduce entry of high-intensity diffracted light into the sensor. Thus, for example, it is possible to reduce blurring of an image generated by the sensor.

Various modifications may be applied to the above-described embodiment. Hereinafter, other embodiments will be described with reference to the attached drawings as needed. In the following description and the drawings used in the following description, like reference signs to the reference signs used for corresponding portions in the above-described embodiment are used for portions that can be similarly configured to those of the above-described embodiment, and the description thereof will not be repeated. When the operation and advantageous effects obtained in the above-described embodiment are also apparently obtained in the other embodiments, the description thereof may be omitted.

In the above-described embodiment, an example in which each of the organic layers 130 of the first display area 101 and each of the organic layers 130 of the second display area 102 have the same size has been described. Alternatively, each of the organic layers 130 of the second display area 102 may have a size different from the size of each of the organic layers 130 of the first display area 101. For example, as shown in FIG. 22, each of the organic layers 130 of the second display area 102 may have a size greater than the size of each of the organic layers 130 of the first display area 101.

Figure 22:
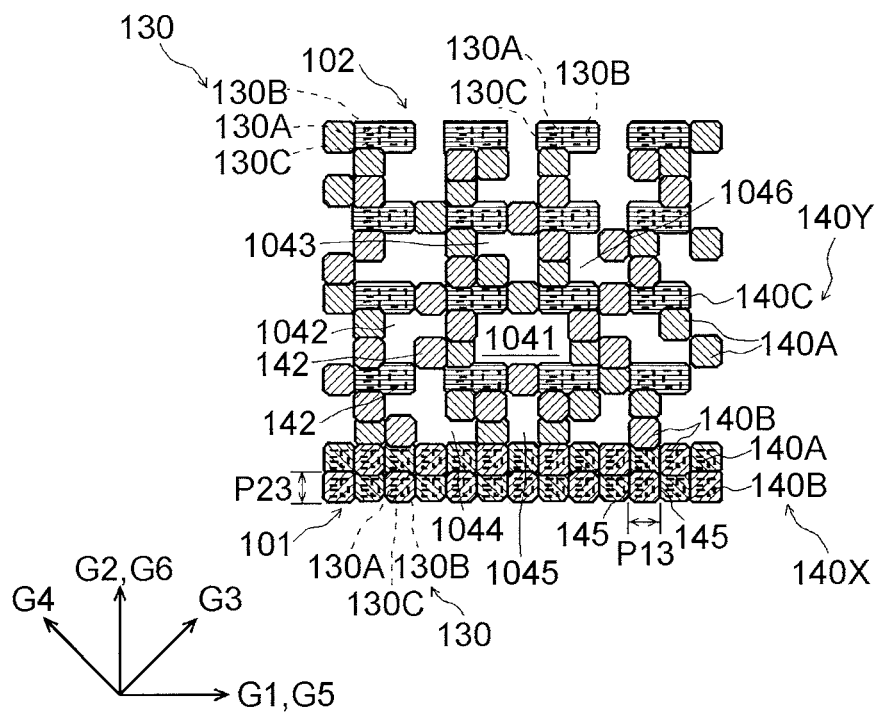
FIG. 22 is a plan view of an example of the second display area.

The first display area 101 shown in FIG. 22 has the same configuration as the first display area 101 shown in FIGS. 3 and 7. Specifically, in the first display area 101, the organic layers 130 that each include the first organic layer 130A, the second organic layer 130B, and the third organic layer 130C are arranged in the first element direction G1 and the second element direction G2. The second electrode 140X includes the first layers 140A, the second layers 140B, and the third layers 140C. In plan view, one first layer 140A or one second layer 140B overlaps one organic layer 130.

In the second display area 102, the second electrode 140Y may include the first layer 140A, the second layer 140B, and the third layer 140C. The first layers 140A are formed by vapor deposition using a first mask 50A (described later). The second layers 140B are formed by vapor deposition using a second mask 50B (described later). The third layers 140C are formed by vapor deposition using a third mask 50C (described later).

The third layer 140C may overlap the organic layer 130 that includes the first organic layer 130A, the second organic layer 130B, and the third organic layer 130C. The first layer 140A and the second layer 140B do not need to overlap the organic layer 130.

In the example of FIG. 22, the second electrodes 140Y may be disposed irregularly. Thus, each transmission area 104 surrounded by the second electrode 140Y may have an irregular shape. For example, as in the case of the example of FIG. 3, the transmission areas 104 may include the first transmission area 1041 and the second transmission area 1042. The transmission areas 104 may include the third transmission area 1043. The transmission areas 104 may include the fourth transmission area 1044. The transmission areas 104 may include the fifth transmission area 1045. The transmission areas 104 may include the sixth transmission area 1046.

Figure 24:
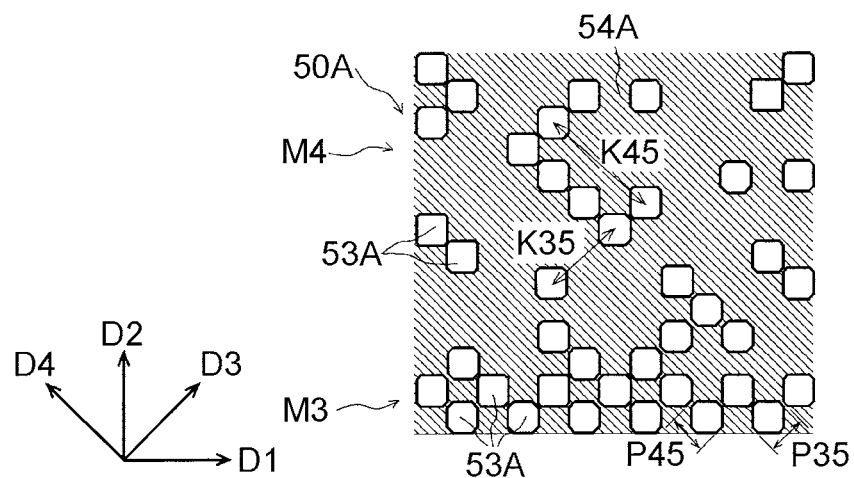
FIG. 24 is a plan view of an example of the first mask.
Figure 25:
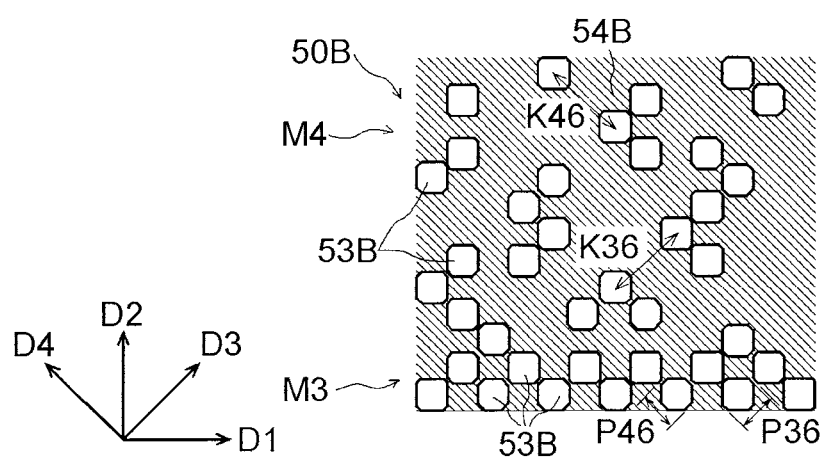
FIG. 25 is a plan view of an example of the second mask.
Figure 26:
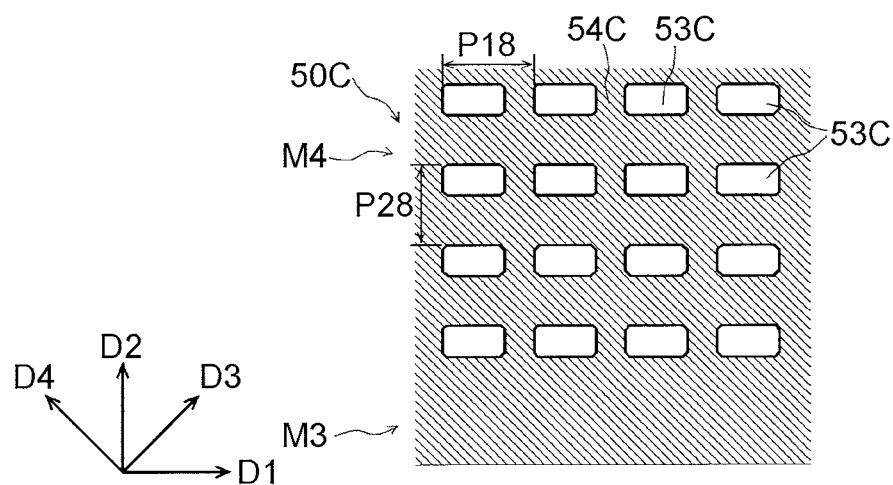
FIG. 26 is a plan view of an example of a third mask.

FIG. 24 is a plan view of an example of the first mask 50A. FIG. 25 is a plan view of an example of the second mask 50B. FIG. 26 is a plan view of an example of the third mask 50C.

As shown in FIG. 24, the first mask 50A includes first through-holes 53A and a first blocking area 54A. As in the case of the example shown in FIG. 16, in the fourth mask area M4, the distance K35 between the centers of any adjacent two of the first through-holes 53A in the third mask direction D3 may be N1 times the thirty-fifth pitch P35. In the fourth mask area M4, the distance K45 between the centers of any adjacent two of the first through-holes 53A in the fourth mask direction D4 may be N2 times the forty-fifth pitch P45.

As shown in FIG. 25, the second mask 50B includes second through-holes 53B and a second blocking area 54B. As in the case of the example shown in FIG. 17, in the fourth mask area M4, the distance K36 between the centers of any adjacent two of the second through-holes 53B in the third mask direction D3 may be N3 times the thirty-sixth pitch P36. In the fourth mask area M4, the distance K46 between the centers of any adjacent two of the second through-holes 53B in the fourth mask direction D4 may be N4 times the forty-sixth pitch P46.

As shown in FIG. 26, the third mask 50C includes the third mask area M3 and the fourth mask area M4. The third mask 50C may include third through-holes 53C and a third blocking area 54C in the fourth mask area M4. The third through-holes 53C may be arranged at an eighteenth pitch P18 in the first mask direction D1. The third through-holes 53C may be arranged at a twenty-eighth pitch P28 in the second mask direction D2. The third mask 50C includes the third blocking area 54C in the third mask area M3. The third mask SOC does not need to have the third through-hole 53C in the third mask area M3.

Figure 23:
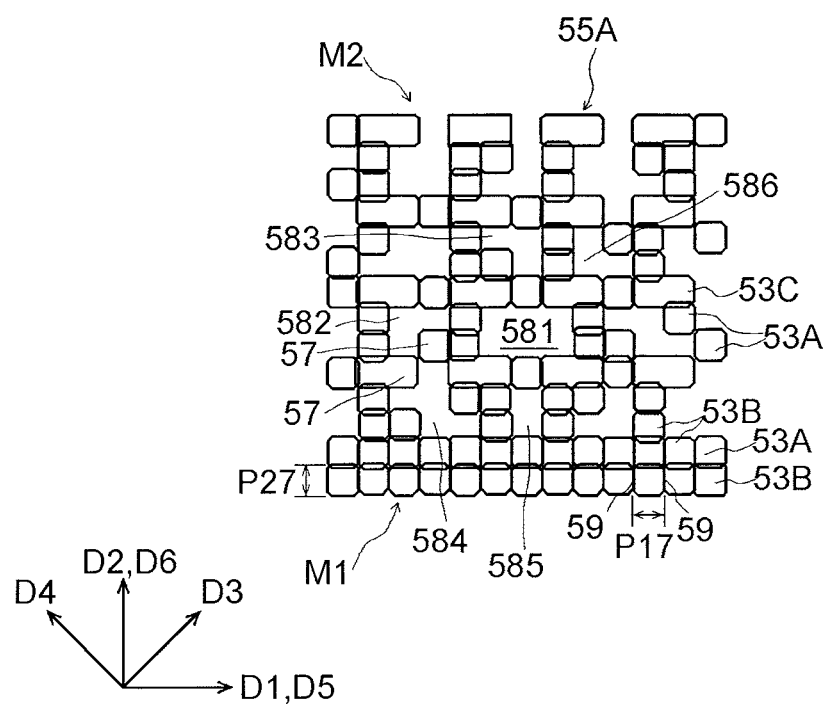
FIG. 23 is a plan view of an example of the mask stack.

FIG. 23 is a plan view of the mask stack 55. The mask stack 55 includes the stacked first mask 50A, second mask 50B, and third mask 50C. In the mask stack 55, the first through-hole 53A and the second through-hole 53B may be connected to the third through-hole 53C in the first mask direction D1. The first through-hole 53A and the second through-hole 53B may be connected to the third through-hole 53C in the second mask direction D2.

The mask stack 55 includes the through areas 55A, the overlap areas 58, and the hole overlap areas 59. As in the case of the example shown in FIG. 18, in the second mask area M2, the overlap areas 58 may be disposed irregularly. Thus, the transmission areas 104 corresponding to the overlap areas 58 may have irregular shapes. For example, as in the case of the example shown in FIG. 18, the overlap areas 58 may include the first overlap area 581 and the second overlap area 582. The overlap areas 58 may include the third overlap area 583. The overlap areas 58 may include the fourth overlap area 584. The overlap areas 58 may include the fifth overlap area 585. The overlap areas 58 may include the sixth overlap area 586.

In the second electrode forming process, the second electrode 140 is formed by using the mask group that includes the first mask 50A, the second mask 50B, and the third mask 50C. Initially, a process of forming the first layers 140A of the second electrode 140 by vapor deposition using the first mask 50A may be performed. Subsequently, a process of forming the second layers 140B of the second electrode 140 by vapor deposition using the second mask 50B may be performed. Subsequently, a process of forming the third layers 140C of the second electrode 140 by vapor deposition using the third mask 50C may be performed. In this way, as shown in FIG. 22, the second electrode 140 that includes the first layers 140A, the second layers 140B, and the third layers 140C are formed.

In the above-described embodiment, an example in which the organic layer 130 that includes the first organic layer 130A, the second organic layer 130B, and the third organic layer 130C overlaps one of the layers of the second electrode 140 has been described. Alternatively, the organic layer 130 may overlap two or more of the layers of the second electrode 140. For example, as shown in FIG. 27, the first organic layer 130A and the third organic layer 130C may overlap one of the layers of the second electrode 140, and the second organic layer 130B may overlap the other one of the layers of the second electrode 140.

Figure 27:
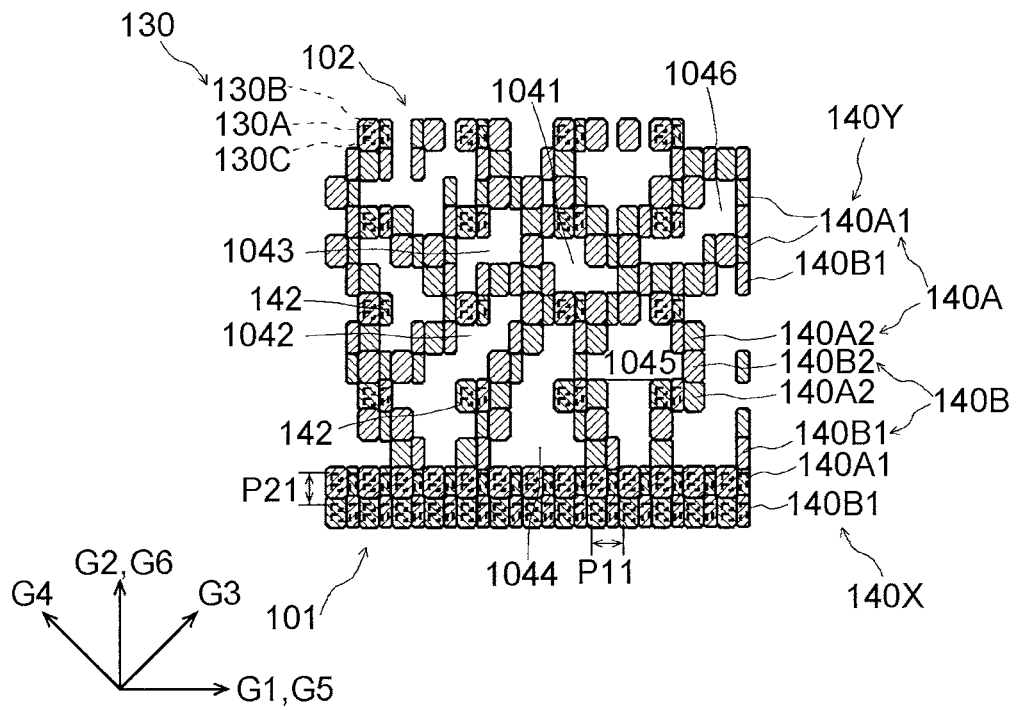
FIG. 27 is a plan view of an example of the second display area.

As shown in FIG. 27, the second electrode 140 may include the first layers 140A and the second layers 140B. The first layers 140A may include an eleventh layer 140A1 and a twelfth layer 140A2. The twelfth layer 140A2 may have an area greater than the area of the eleventh layer 140A1. The second layers 140B may include a twenty-first layer 140B1 and a twenty-second layer 140B2. The twenty-second layer 140B2 may have an area greater than the area of the twenty-first layer 140B1.

The eleventh layer 140A1 may be connected to the twenty-second layer 140B2 in the first element direction G1. The eleventh layer 140A1 may be connected to the twenty-first layer 140B1 in the second element direction G2. The twenty-first layer 140B1 may be connected to the twelfth layer 140A2 in the first element direction G1. The twenty-second layer 140B2 may be connected to the twelfth layer 140A2 in the second element direction G2.

One first organic layer 130A and one third organic layer 130C may overlap one twelfth layer 140A2 or one twenty-second layer 140B2 in plan view. One second organic layer 130B may overlap one eleventh layer 140A1 or one twenty-first layer 140B1 in plan view.

In the example of FIG. 27, the second electrode 140Y may be disposed irregularly. Thus, each transmission area 104 surrounded by the second electrode 140Y may have an irregular shape. For example, as in the case of the example of FIG. 3, the transmission areas 104 may include the first transmission area 1041 and the second transmission area 1042. The transmission areas 104 may include the third transmission area 1043. The transmission areas 104 may include the fourth transmission area 1044. The transmission areas 104 may include the fifth transmission area 1045. The transmission areas 104 may include the sixth transmission area 1046.

Figure 29:
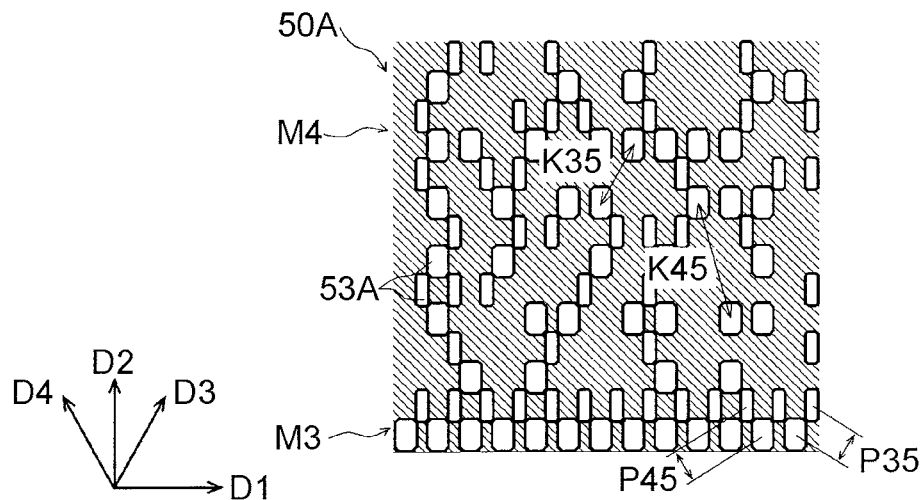
FIG. 29 is a plan view of an example of the first mask.
Figure 30:
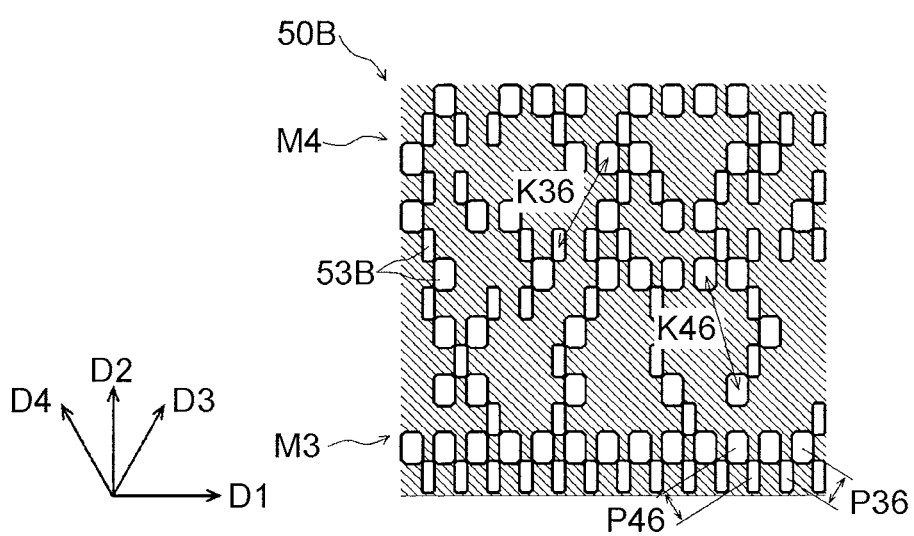
FIG. 30 is a plan view of an example of the second mask.

FIG. 29 is a plan view of an example of the first mask 50A. FIG. 30 is a plan view of an example of the second mask 50B.

As shown in FIG. 29, the first mask 50A includes first through-holes 53A and a first blocking area 54A. As in the case of the example shown in FIG. 16, in the fourth mask area M4, the distance K35 between the centers of any adjacent two of the first through-holes 53A in the third mask direction D3 may be N1 times the thirty-fifth pitch P35. In the fourth mask area M4, the distance K45 between the centers of any adjacent two of the first through-holes 53A in the fourth mask direction D4 may be N2 times the forty-fifth pitch P45.

As shown in FIG. 30, the second mask 50B includes second through-holes 53B and a second blocking area 54B. As in the case of the example shown in FIG. 17, in the fourth mask area M4, the distance K36 between the centers of any adjacent two of the second through-holes 53B in the third mask direction D3 may be N3 times the thirty-sixth pitch P36. In the fourth mask area M4, the distance K46 between the centers of any adjacent two of the second through-holes 53B in the fourth mask direction D4 may be N4 times the forty-sixth pitch P46.

Figure 28:
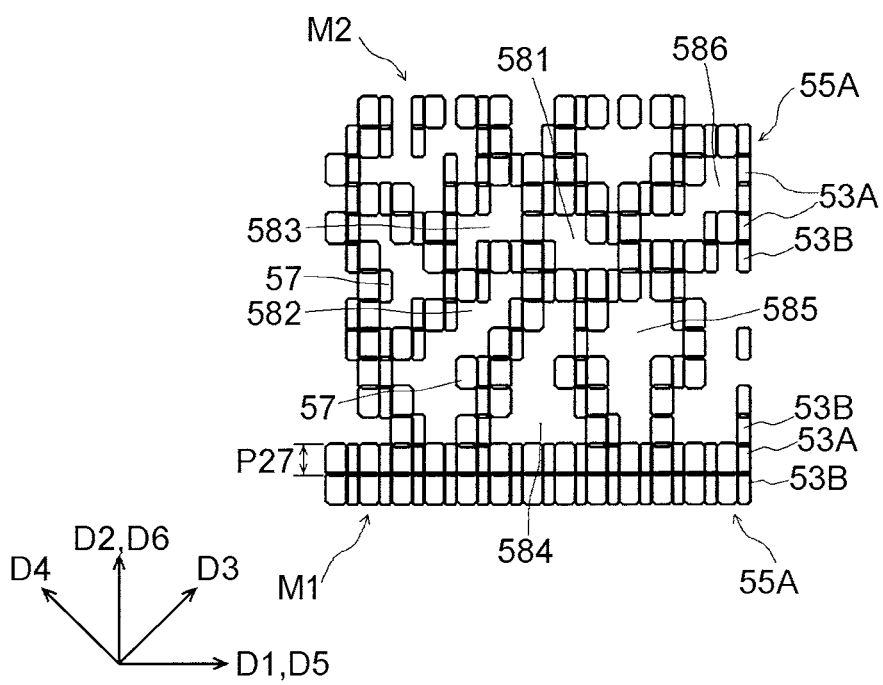
FIG. 28 is a plan view of an example of the mask stack.

FIG. 28 is a plan view of the mask stack 55. The mask stack 55 includes the stacked first mask 50A and second mask 50B.

The mask stack 55 includes the through areas 55A, the overlap areas 58, and the hole overlap areas 59. As in the case of the example shown in FIG. 18, in the second mask area M2, the overlap areas 58 may be disposed irregularly. Thus, the transmission areas 104 corresponding to the overlap areas 58 may have irregular shapes. For example, as in the case of the example shown in FIG. 18, the overlap areas 58 may include the first overlap area 581 and the second overlap area 582. The overlap areas 58 may include the third overlap area 583. The overlap areas 58 may include the fourth overlap area 584. The overlap areas 58 may include the fifth overlap area 585. The overlap areas 58 may include the sixth overlap area 586.

An example of the organic device 100 will be described with reference to FIGS. 38 and 39.

Figure 38:
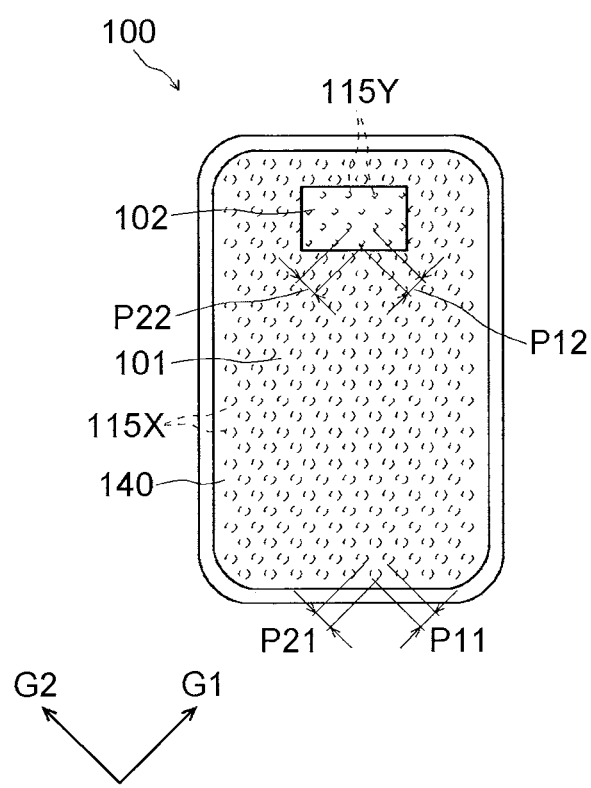
FIG. 38 is a plan view of an example of the organic device.

FIG. 38 is a plan view of an example of the organic device 100. The elements 115 located in the first display area 101 are also referred to as elements 115X. The elements 115 located in the second display area 102 are also referred to as elements 115Y.

In the first display area 101, organic layers of the elements 115X may be arranged at the eleventh pitch P11 in the first element direction G1. In the second display area 102, organic layers of the elements 115Y may be arranged at the twelfth pitch P12 in the first element direction G1. The twelfth pitch P12 may be the same as the eleventh pitch P11. Since the twelfth pitch P12 is the same as the eleventh pitch P11, it is possible to reduce the visual difference between the first display area 101 and the second display area 102.

In the first display area 101, organic layers of the elements 115X may be arranged at the twenty-first pitch P21 in the second element direction G2. In the second display area 102, organic layers of the elements 115Y may be arranged at the twenty-second pitch P22 in the second element direction G2. The twenty-second pitch P22 may be the same as the twenty-first pitch P21. Since the twenty-second pitch P22 is the same as the twenty-first pitch P21, it is possible to reduce the visual difference between the first display area 101 and the second display area 102.

Figure 39:
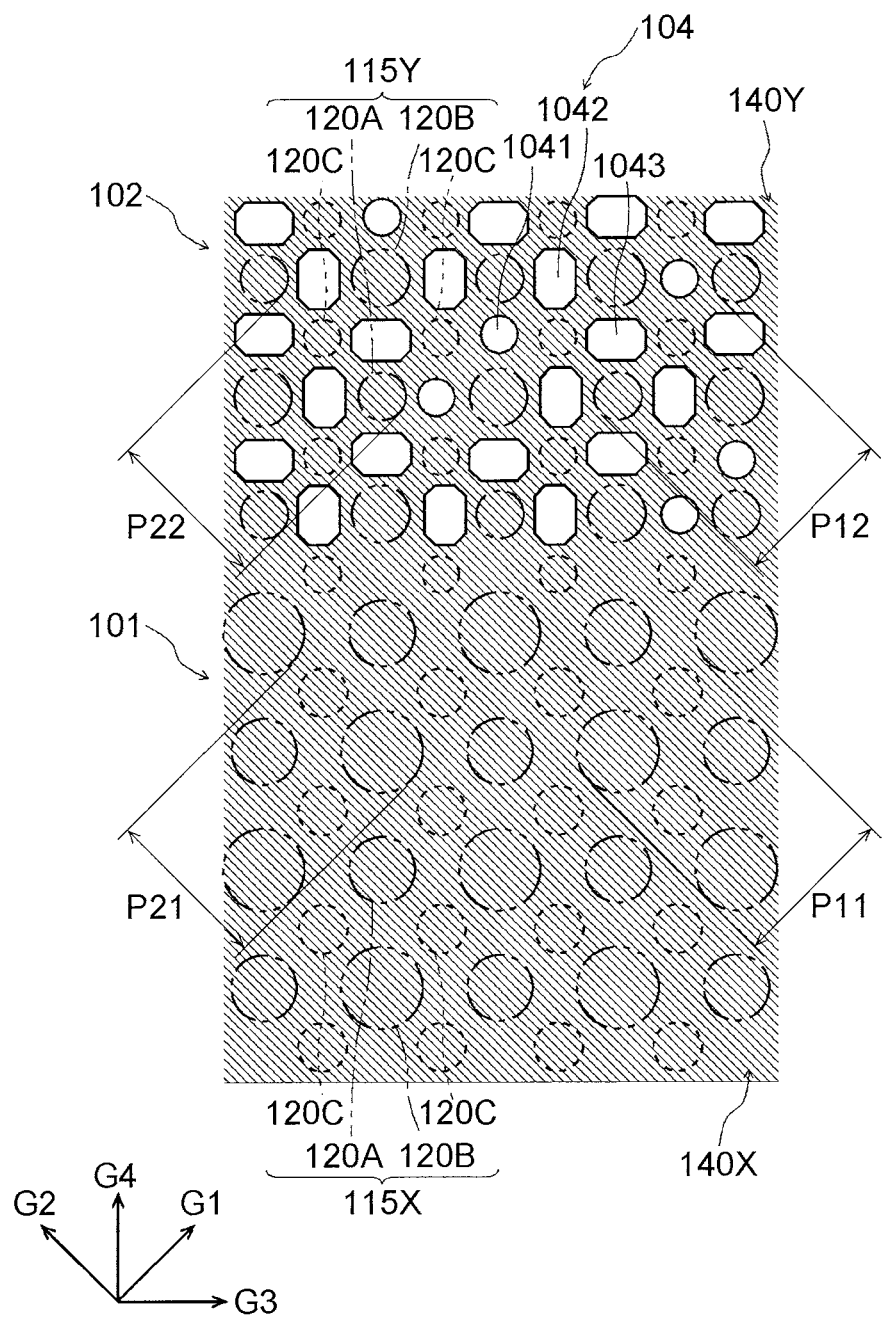
FIG. 39 is a plan view of an example of the second display area.

FIG. 39 is a plan view of an example of the second display area 102 shown in FIG. 38. In FIG. 39, the first electrodes 120 covered with the second electrode 140 are represented by the dashed lines. The first electrodes 120 may include first-A electrodes 120A, first-B electrodes 120B, and first-C electrodes 120C. The first-A electrode 120A overlaps the first organic layer in plan view. The first-B electrode 120B overlaps the second organic layer in plan view. The first-C electrode 120C overlaps the third organic layer in plan view.

The element 115X may include at least one first-A electrode 120A, at least one first-B electrode 120B, and at least one first-C electrode 120C. For example, the element 115X may include one first-A electrode 120A, one first-B electrode 120B, and two first-C electrodes 120C. The pitch of the elements 115X in the first element direction G1 and the second element direction G2 may be determined in accordance with the pitch of any one of the first-A electrodes 120A and the first-B electrodes 120B.

The element 115Y, as well as the element 115X, may include at least one first-A electrode 120A, at least one first-B electrode 120B, and at least one first-C electrode 120C. For example, the element 115Y, as well as the element 115X, may include one first-A electrode 120A, one first-B electrode 120B, and two first-C electrodes 120C. The pitch of the elements 115Y in the first element direction G1 and the second element direction G2 may be determined in accordance with the pitch of any one of the first-A electrodes 120A and the first-B electrodes 120B.

The area of the element 115Y in the second display area 102 may be less than the area of the element 115X in the first display area 101. For example, the area of the organic layer of the element 115Y in the second display area 102 may be less than the area of the organic layer of the element 115X in the first display area 101. For example, the area of the first electrode of the element 115Y in the second display area 102 may be less than the area of the first electrode of the element 115X in the first display area 101. When the area of the element 115Y is less than the area of the element 115X, the transmission areas 104, that is, the first transmission area 1041, the second transmission area 1042, the third transmission area 1043, and the like, are able to be formed in the second display area 102 as shown in FIG. 39. In the example shown in FIG. 39, the area of the first electrode of the element 115X is the sum of the area of one first-A electrode 120A, the area of one first-B electrode 120B, and the area of two first-C electrodes 120C. In the example shown in FIG. 39, the area of the first electrode of the element 115Y is the sum of the area of one first-A electrode 120A, the area of one first-B electrode 120B, and the area of two first-C electrodes 120C.

The ratio of the area of the first electrode of the element 115Y to the area of the first electrode of the element 115X, for example, may be greater than or equal to 0.1, may be greater than or equal to 0.2, or may be greater than or equal to 0.3. The ratio of the area of the first electrode of the element 115Y to the area of the first electrode of the element 115X, for example, may be less than or equal to 0.5, may be less than or equal to 0.7, or may be less than or equal to 0.9. The range of the ratio of the area of the first electrode of the element 115Y to the area of the first electrode of the element 115X may be determined by a first group consisting of 0.1, 0.2, and 0.3 and/or a second group consisting of 0.5, 0.7, and 0.9. The range of the ratio of the area of the first electrode of the element 115Y to the area of the first electrode of the element 115X may be determined by a combination of any one of the values in the first group and any one of the values in the second group. The range of the ratio of the area of the first electrode of the element 115Y to the area of the first electrode of the element 115X may be determined by a combination of any two of the values in the first group. The range of the ratio of the area of the first electrode of the element 115Y to the area of the first electrode of the element 115X may be determined by a combination of any two of the values in the second group. For example, the ratio of the area of the first electrode of the element 115Y to the area of the first electrode of the element 115X may be greater than or equal to 0.1 and less than or equal to 0.9, may be greater than or equal to 0.1 and less than or equal to 0.7, may be greater than or equal to 0.1 and less than or equal to 0.5, may be greater than or equal to 0.1 and less than or equal to 0.3, may be greater than or equal to 0.1 and less than or equal to 0.2, may be greater than or equal to 0.2 and less than or equal to 0.9, may be greater than or equal to 0.2 and less than or equal to 0.7, may be greater than or equal to 0.2 and less than or equal to 0.5, may be greater than or equal to 0.2 and less than or equal to 0.3, may be greater than or equal to 0.3 and less than or equal to 0.9, may be greater than or equal to 0.3 and less than or equal to 0.7, may be greater than or equal to 0.3 and less than or equal to 0.5, may be greater than or equal to 0.5 and less than or equal to 0.9, may be greater than or equal to 0.5 and less than or equal to 0.7, or may be greater than or equal to 0.7 and less than or equal to 0.9.

Two of the transmission areas 104 having different shapes may be adjacent to each other via the first electrode 120 and the second electrode 140Y in a direction in which the plurality of first electrodes 120 is arranged regularly. In the example shown in FIG. 39, the plurality of first electrodes 120 is regularly arranged in the third element direction G3 and the fourth element direction G4. In the example shown in FIG. 39, the first transmission area 1041 and the third transmission area 1043 are adjacent to each other in the third element direction G3 via the first electrode 120 and the second electrode 140Y. In the example shown in FIG. 39, the angle formed by the third element direction G3 with each of the first element direction G1 and the second element direction G2 is 45°. In the example shown in FIG. 39, the fourth element direction G4 is orthogonal to the third element direction G3.

An example of a method of forming the transmission areas 104 will be described with reference to FIGS. 40 to 43. Specifically, an example in which an inhibition layer is formed on the substrate 110 before a process of forming the second electrode 140 will be described. The inhibition layer has properties such that a conductive material of the second electrode 140 is difficult to be deposited.

Figure 40:
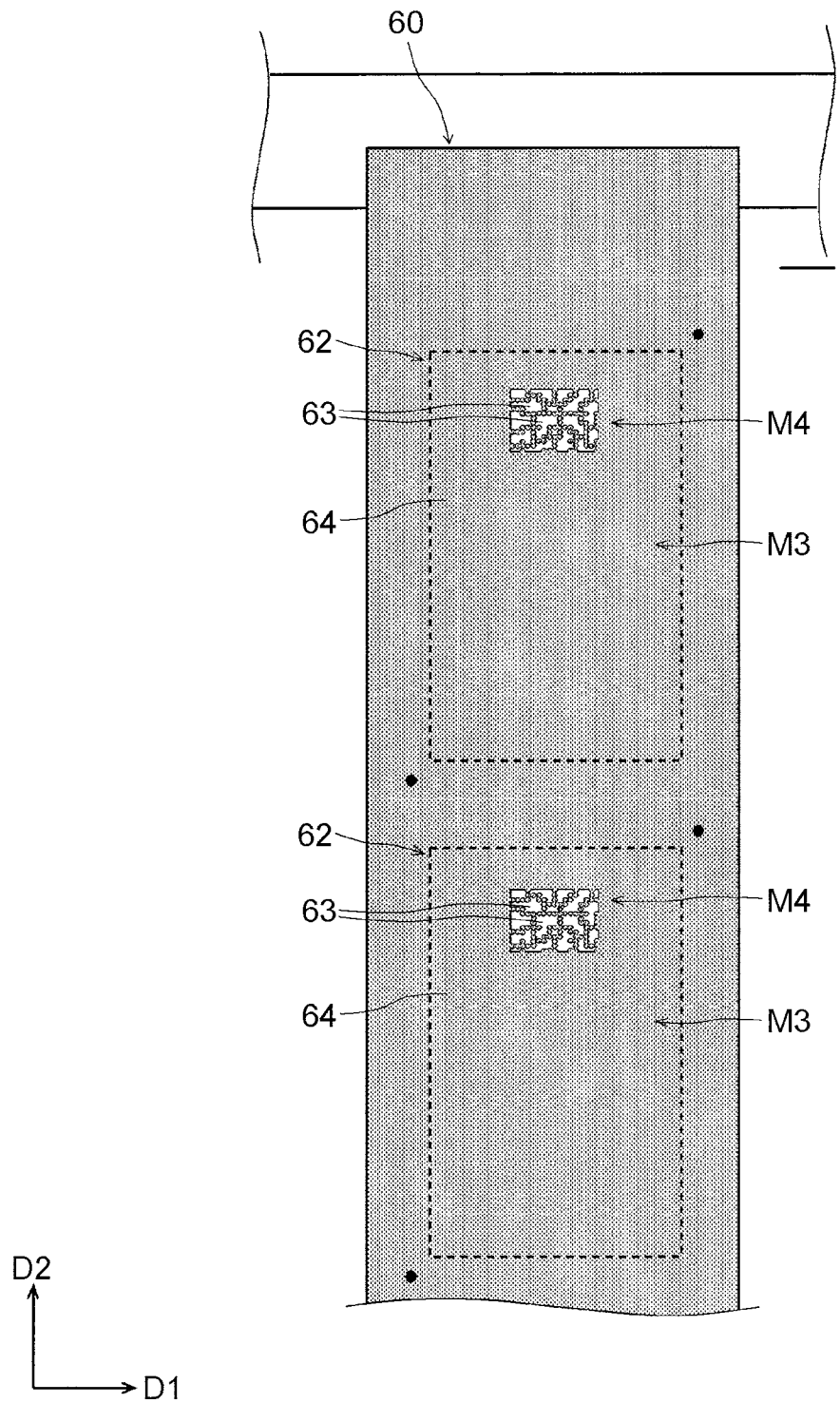
FIG. 40 is a plan view of an example of a mask for forming an inhibition layer.

FIG. 40 is a plan view of an example of a mask 60 for forming an inhibition layer. The mask 60 includes at least one cell 62. The cell 62 includes through-holes 63 and a blocking area 64. The mask 60 may include two or more cells 62. One cell 62 may correspond to the display area of one organic EL display device, that is, one screen.

The mask 60, as well as the mask 50, includes the third mask area M3 and the fourth mask area M4. The third mask area M3 corresponds to the first display area 101 of the organic device 100. The fourth mask area M4 corresponds to the second display area 102 of the organic device 100.

The third mask area M3 includes the blocking area 64. The third mask area M3 does not need to have the through-hole 63. In other words, the entire third mask area M3 may be made up of the blocking area 64.

The fourth mask area M4 have the through-holes 63 and the blocking areas 64. The through-holes 63 in the fourth mask area M4 correspond to the transmission areas 104. The blocking areas 64 may be disposed irregularly. Thus, the through-holes 63 each surrounded by the blocking area 64 have irregular shapes. For example, the fourth mask area M4 may have two through-holes 63 having different shapes and adjacent to each other via the blocking area 64. For example, the fourth mask area M4 may have a first through-hole to a sixth through-hole that respectively correspond to the first transmission area 1041 to the sixth transmission area 1046.

Figure 41:
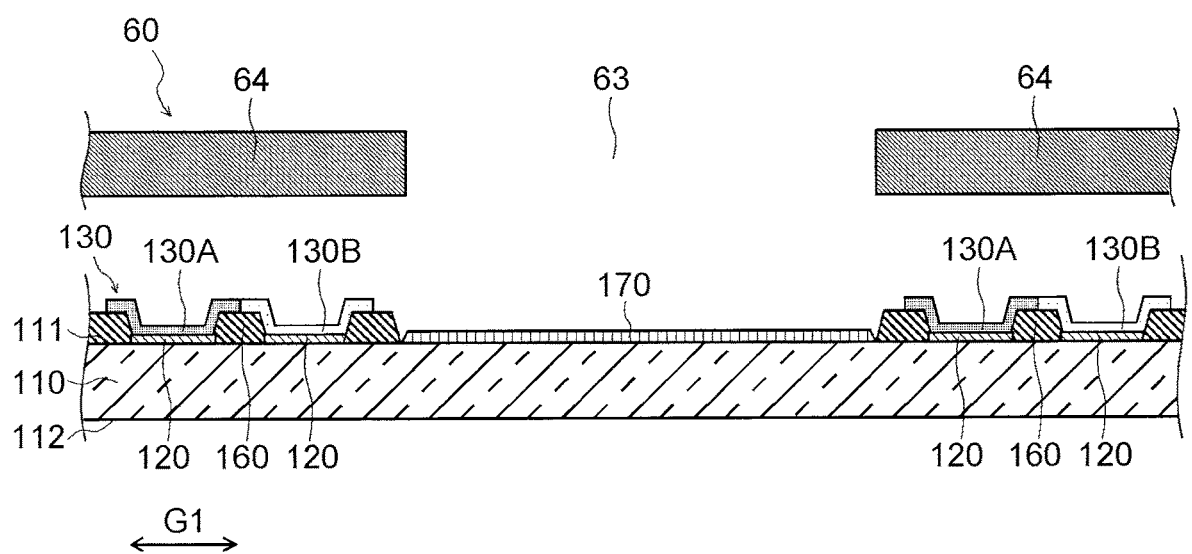
FIG. 41 is a sectional view of an example of a process of forming an inhibition layer.

FIG. 41 is a sectional view of an example of an inhibition layer forming process of forming an inhibition layer 170. The inhibition layer forming process is performed after a process of forming the organic layers 130 and before a process of forming the second electrode 140.

The inhibition layer forming process may include a process of depositing the material of the inhibition layer 170 on the substrate 110 via the mask 60. As shown in FIG. 41, the inhibition layer 170 is formed in areas of the substrate 110, which overlap the through-holes 63.

Figure 42:
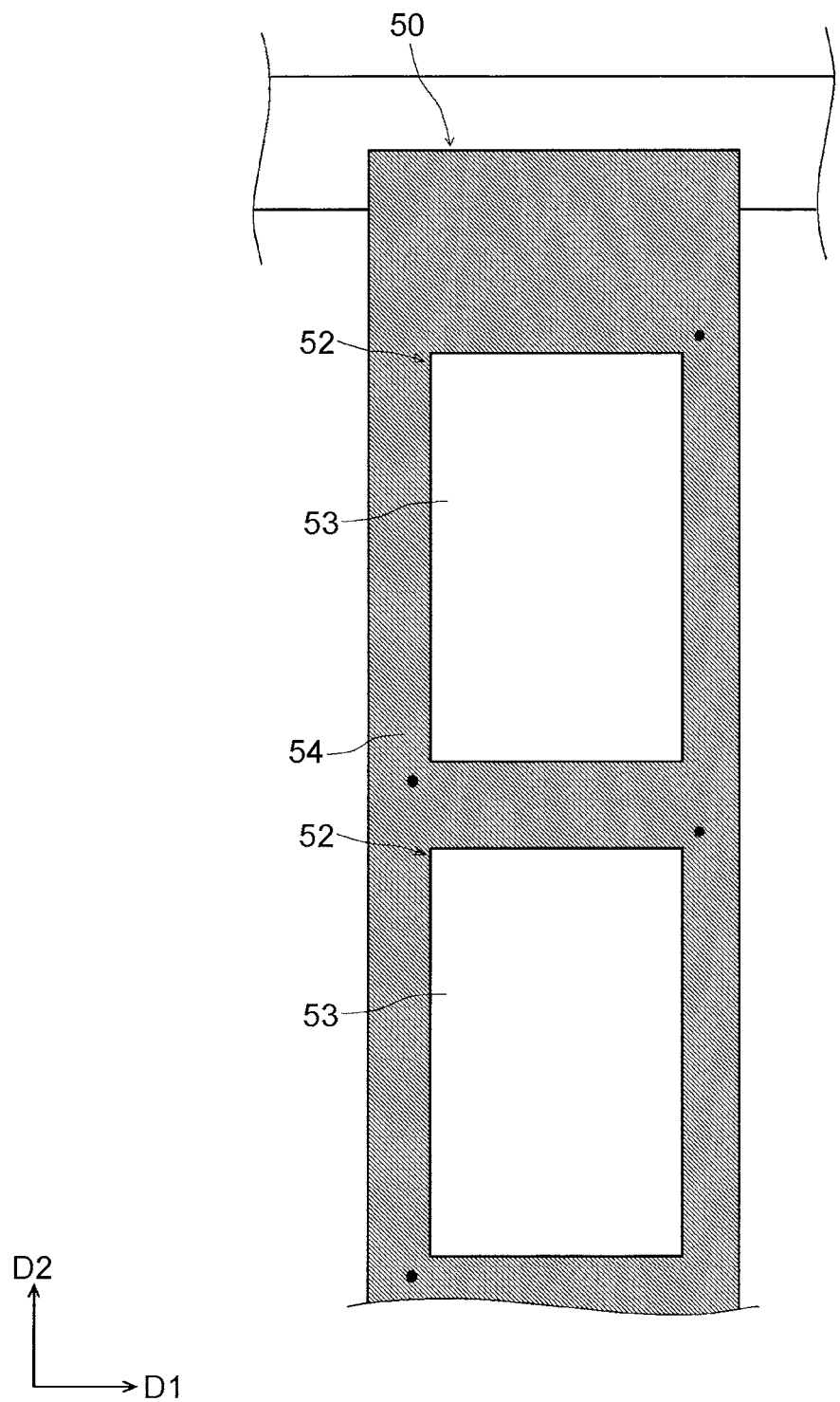
FIG. 42 is a plan view of an example of a mask for forming a second electrode.

FIG. 42 is a plan view of an example of the mask 50 for forming the second electrode 140. The mask 50 includes at least one cell 52. Each cell 52 is made up of the through-hole 53. Each cell 52 is surrounded by the blocking area 54.

Figure 43:
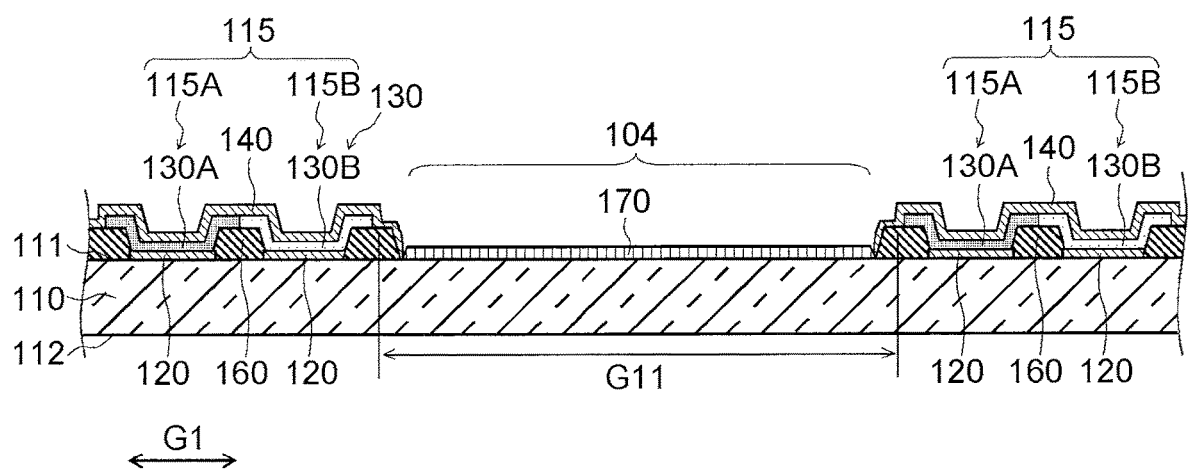
FIG. 43 is a sectional view of an example of a process of forming the second electrode.

FIG. 43 is a sectional view of an example of a process of forming the second electrode 140. The second electrode 140 is formed by depositing the material of the second electrode 140 on the substrate 110 via the mask 50 shown in FIG. 42.

As described above, the inhibition layer 170 has properties such that a conductive material of the second electrode 140 is difficult to be deposited. As shown in FIG. 43, it is possible to inhibit formation of the second electrode 140 on the inhibition layer 170. Therefore, the area in which the inhibition layer 170 is formed is able to function as the transmission area 104.

The inhibition layer 170 has transparency. For example, the transmittance of a stack that includes the substrate 110 and the inhibition layer 170 is preferably higher than or equal to 70% and more preferably higher than or equal to 80%. The transmittance of the stack that includes the substrate 110 and the inhibition layer 170 is able to be measured by a method of testing a total light transmittance of plastic-transparent material, which is in conformity with JIS K7361-1.

The material of the inhibition layer 170 may be the material of a nucleation inhibiting coating, described in WO2017072678A1 or WO2019150327A1. Examples of the material of the inhibition layer 170 may include organic materials, such as low-molecular organic materials and organic polymers. Examples of the organic materials may include polycycle aromatic compounds. A polycycle aromatic compound includes an organic molecule that includes a core portion and at least one terminal portion bound to the core portion. An organic molecule may include one or plurality of hetero atoms, such as nitrogen, sulfur, oxygen, phosphorus, and aluminum. The number of terminal portions may be greater than or equal to one, may be greater than or equal to two, may be greater than or equal to three, or may be greater than or equal to four. When the organic molecule includes two or more terminal portions, the two or more terminal portions may be the same or may be different.

The terminal portion may include a biphenylyl part expressed by any one of the following chemical structures (1-a), (1-b), and (1-c).

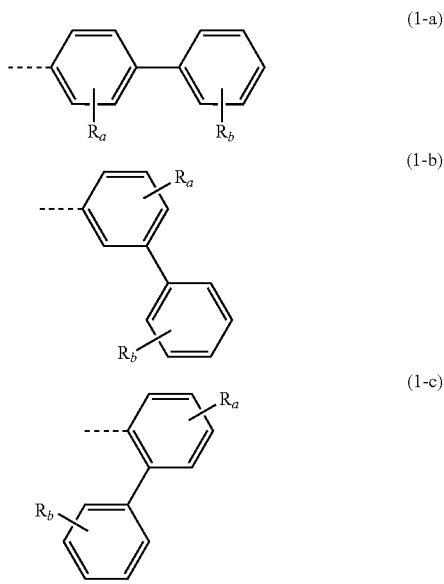

The substituents $R_a$ and $R_b$ each may be independently selected from among deuterium, fluorine, alkyls including $C_1$ to $C_4$ alkyls, cycloalkyl, arylated alkyl, silyl, aryl, heteroaryl, fluoroalkyl, and any combination of these.

An example of a method of forming the transmission area 104 will be described with reference to FIGS. 44 and 45. Specifically, an example in which the transmission area 104 is formed by partially removing the second electrode 140 will be described.

Figure 44:
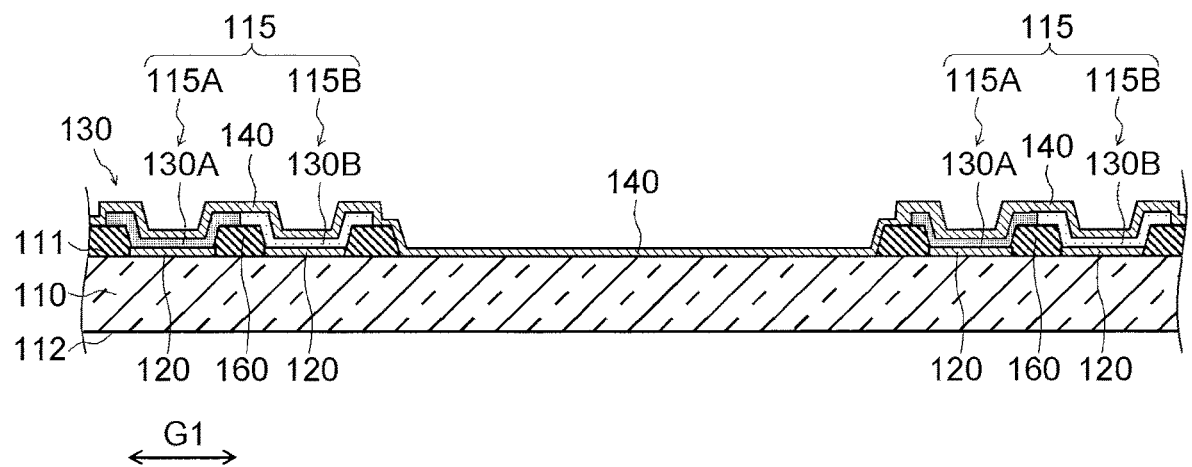
FIG. 44 is a sectional view of an example of a process of forming the second electrode.
Figure 45:
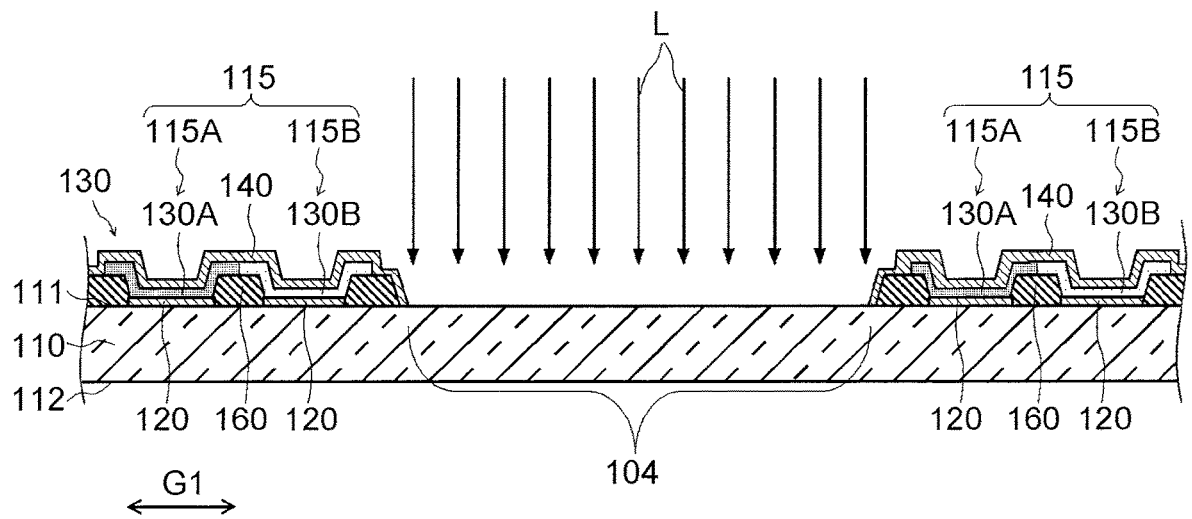
FIG. 45 is a sectional view of an example of a process of removing the second electrode.

FIG. 44 is a sectional view of an example of a process of forming the second electrode 140. The second electrode 140 shown in FIG. 44 is formed by depositing the material of the second electrode 140 on the substrate 110 via the mask 50 shown in FIG. 42. In this case, the second electrode 140 is formed in the entire first display area 101 and the entire second display area 102.

After a process of forming the second electrode 140, a process of partially removing the second electrode 140 is performed. For example, as shown in FIG. 45, laser L is partially applied to the second electrode 140 in the second display area 102. Because the second electrode 140 irradiated with laser L flies out, the transmission area 104 is formed.

Although not shown in the drawing, laser L may be applied to the second electrode 140 via a laser mask. The laser mask includes a through-hole corresponding to the transmission area 104.

EXAMPLES

Next, the embodiment of the present disclosure will be further specifically described by way of examples. The embodiment of the present disclosure is not limited to the following examples without departing from the scope of the present disclosure.

Example 1

Diffraction of light having passed through the transmission area 104 was tested by simulation.

Figure 31:
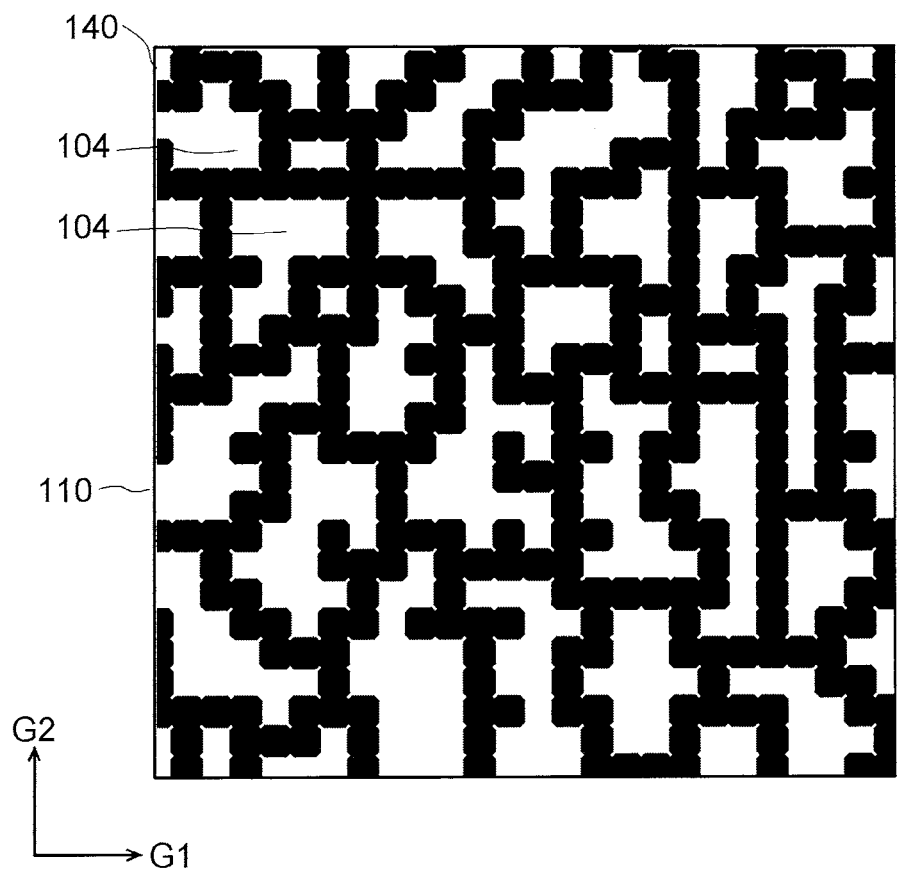
FIG. 31 is a plan view of a second electrode according to Example 1.

The substrate 110 and the second electrode 140 shown in FIG. 31 were designed. The second electrode 140 is disposed irregularly. Therefore, each transmission area 104 surrounded by the second electrode 140Y has an irregular shape.

Figure 32:
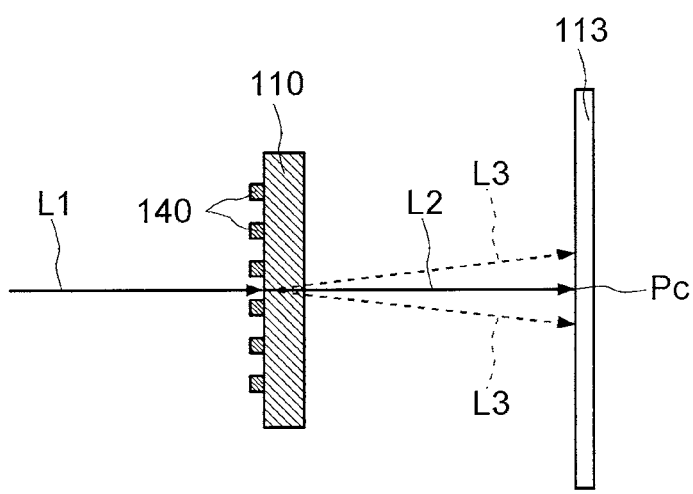
FIG. 32 is a diagram of a method of evaluating the diffraction properties of the second electrode.

Based on the configuration shown in FIG. 32, an intensity distribution of light that passes through the transmission areas 104 and reaches a screen 113 was calculated by simulation. Initially, light L1 was caused to enter the substrate 110 in the direction normal to the substrate 110. Subsequently, diffraction of light, caused by the second electrode 140, was calculated by simulation. The reference sign L2 represents light that travels straight and reaches the screen 113 without diffraction. The reference sign Pc represents a point that the light L3 reaches on the screen 113. The reference sign L3 represents light diffracted by the second electrode 140. The wavelength of the light L1 is 550 nm. The distance between the second electrode 140 and the screen 113 is 5000 mm. Refraction of light due to the substrate 110 was ignored.

Figure 33:
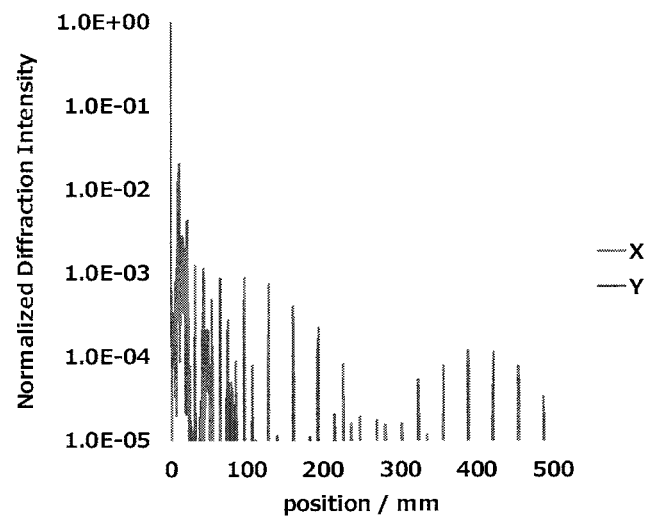
FIG. 33 is a graph of evaluation results of the second electrode of Example 1.
Figure 34:
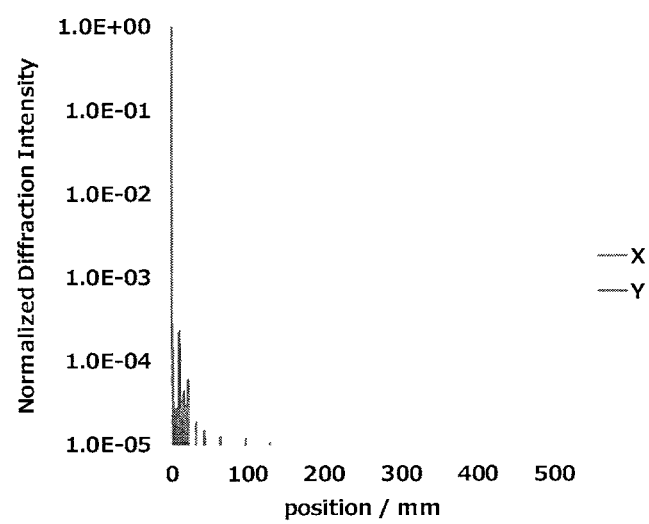
FIG. 34 is a graph of evaluation results of the second electrode of Example 1.

The results of the simulation are shown in FIGS. 33 and 34. The abscissa axis represents a distance from point Pc. The ordinate axis represents the intensity of light having reached the screen 113. FIG. 33 is a simulation result in the case where the transmittance of the second electrode 140 is set to 0%. FIG. 34 is a simulation result in the case where the transmittance of the second electrode 140 is set to 60%.

Example 2

Figure 35:
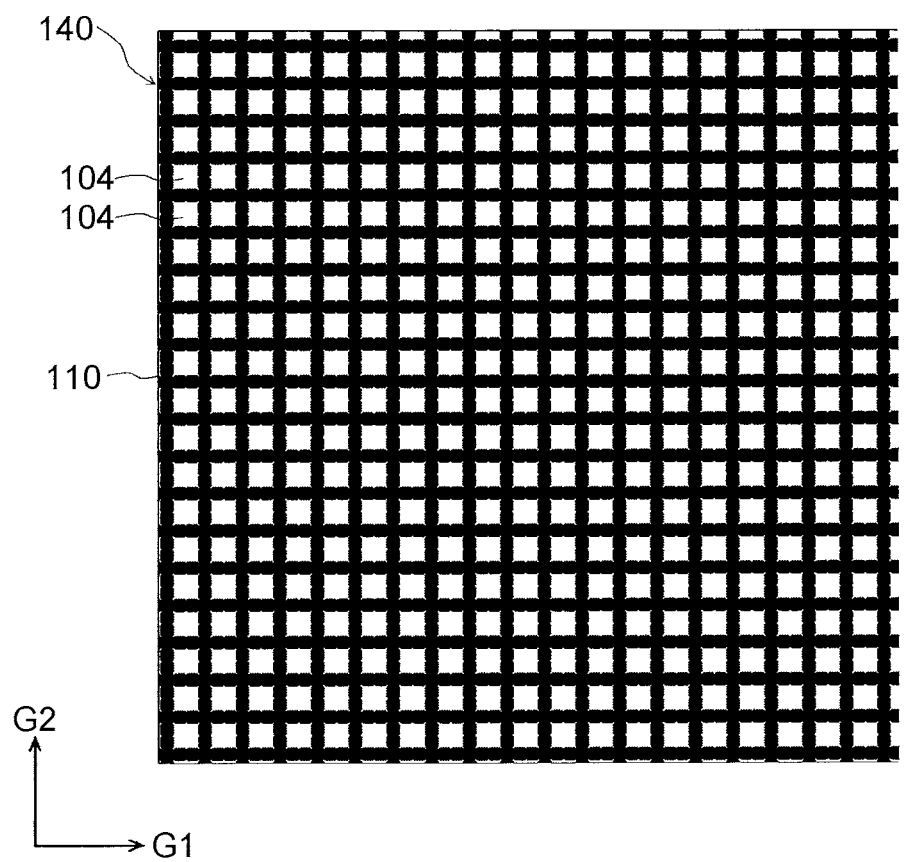
FIG. 35 is a plan view of a second electrode according to Example 2.

The substrate 110 and the second electrode 140 shown in FIG. 35 were designed. The second electrode 140 is disposed irregularly. Therefore, each transmission area 104 surrounded by the second electrode 140Y has a square shape.

Figure 36:
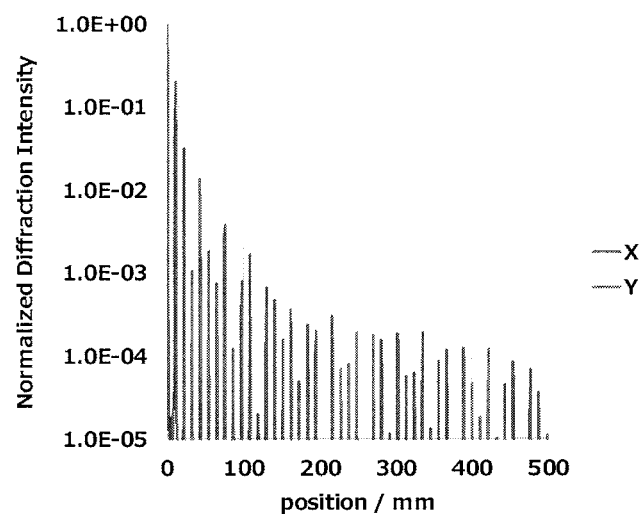
FIG. 36 is a graph of evaluation results of the second electrode of Example 2.
Figure 37:
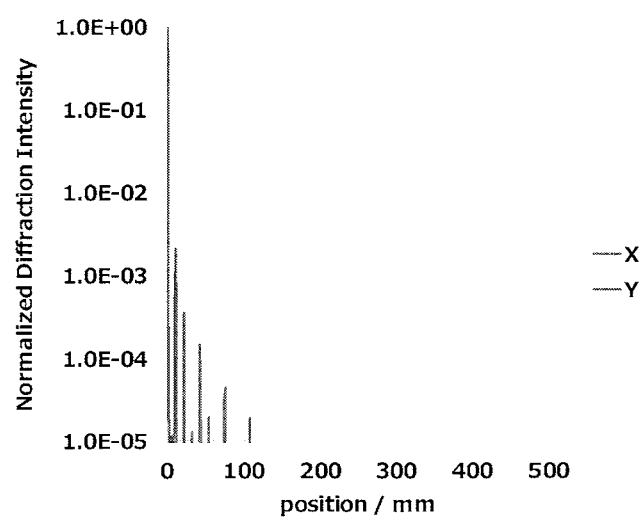
FIG. 37 is a graph of evaluation results of the second electrode of Example 2.

An intensity distribution of light that passes through the transmission areas 104 and reaches a screen 113 was calculated by simulation. The results of the simulation are shown in FIGS. 36 and 37. FIG. 36 is a simulation result in the case where the transmittance of the second electrode 140 is set to 0%. FIG. 37 is a simulation result in the case where the transmittance of the second electrode 140 is set to 60%.

As is apparent from the comparison between FIG. 33 and FIG. 36 and the comparison between FIG. 34 and FIG. 37, high-intensity diffracted light L3 reaching the screen 113 is reduced by the transmission areas 104 each having an irregular shape.

Example 3

Figure 46:
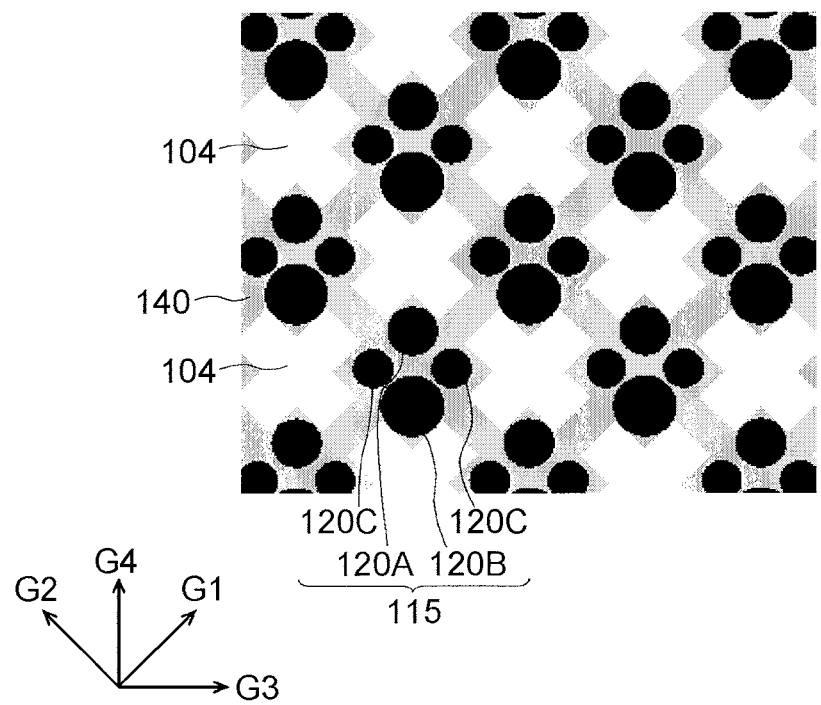
FIG. 46 is a plan view of a second electrode according to Example 3.

The first-A electrode 120A, the first-B electrode 120B, the first-C electrode 120C, and the second electrode 140 shown in FIG. 46 were designed. The plurality of transmission areas 104 each has a cross shape. The plurality of transmission areas 104 is regularly arranged in the first element direction G1 and the second element direction G2.

As in the case of Example 1, an intensity distribution of light that passes through the transmission areas 104 and reaches a screen 113 was calculated by simulation. The setting conditions of simulation are as follows.

Transmittance of Transmission Area 104: 100%
Transmittance of Second Electrode 140: 60%
Transmittance of each of First-A Electrode 120A, First-B Electrode 120B, and First-C Electrode 120C: 0%

The maximum intensity of diffracted light that appears in the intensity distribution was 9.5%. The intensity of diffracted light is normalized by the intensity of light at point Pc on the screen 113.

Example 4

Figure 47:
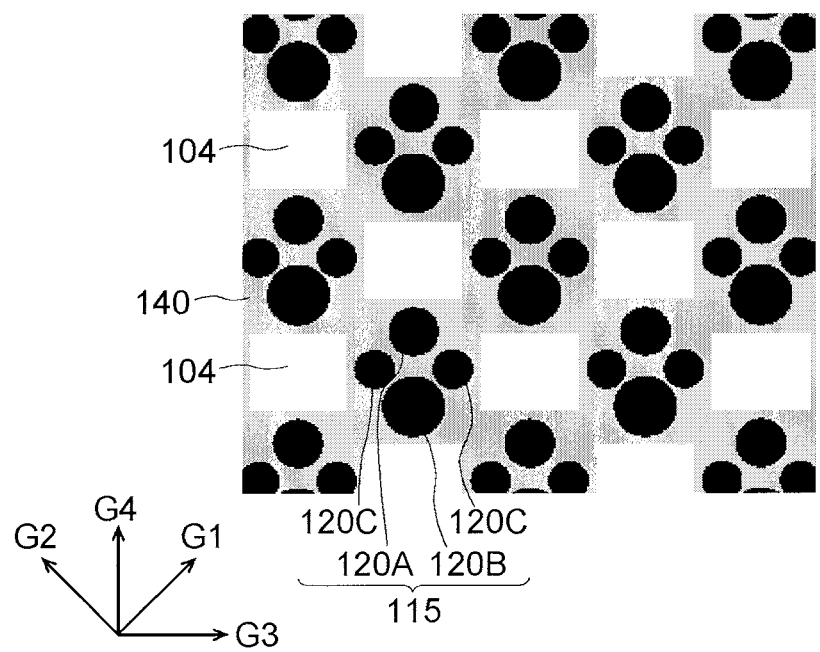
FIG. 47 is a plan view of a second electrode according to Example 4.

The first-A electrode 120A, the first-B electrode 120B, the first-C electrode 120C, and the second electrode 140 shown in FIG. 47 were designed. The pitch of the elements 115 in the first element direction G1 and the second element direction G2 is the same as that in the case of Example 3. The plurality of transmission areas 104 each has a rectangular shape. The plurality of transmission areas 104 is regularly arranged in the first element direction G1 and the second element direction G2.

As in the case of Example 3, an intensity distribution of light that passes through the transmission areas 104 and reaches a screen 113 was calculated by simulation. The maximum intensity of diffracted light that appears in the intensity distribution was 9.5%.

Example 5

Figure 48:
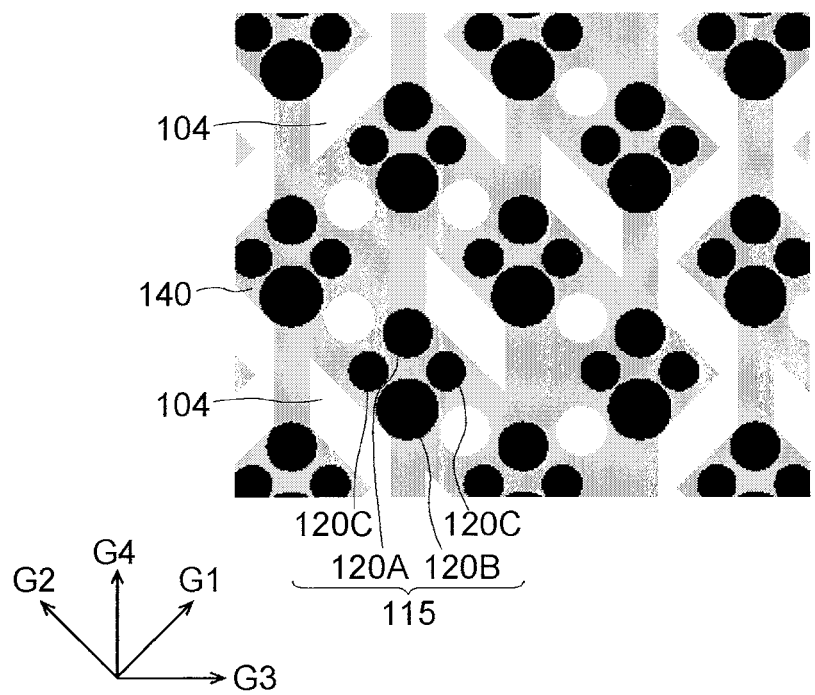
FIG. 48 is a plan view of a second electrode according to Example 5.

The first-A electrode 120A, the first-B electrode 120B, the first-C electrode 120C, and the second electrode 140 shown in FIG. 48 were designed. The pitch of the elements 115 in the first element direction G1 and the second element direction G2 is the same as that in the case of Example 3.

The second electrode 140Y in Example 5 is disposed irregularly. Therefore, each transmission area 104 surrounded by the second electrode 140Y has an irregular shape. Each of the transmission areas 104 is located between any adjacent two of the elements 115 in the first element direction G1 or between any adjacent two of the elements 115 in the second element direction G2. Some of the transmission areas 104 have a circular shape. Some of the transmission areas 104 have a quadrangular shape. Some of the transmission areas 104 are connected to adjacent transmission areas 104.

Example 5 includes two circular transmission areas 104 adjacent via one element 115 in the third element direction G3. Example 5 includes two circular transmission areas 104 adjacent via one element 115 in the fourth element direction G4. In Example 5, the angle formed by the third element direction G3 with each of the first element direction G1 and the second element direction G2 is 45°. In Example 5, the fourth element direction G4 is orthogonal to the third element direction G3. In Example 5, the probability that two circular transmission areas 104 are adjacent via one element 115 is 1/16. The probability is the ratio of the number of second combinations to the number of first combinations. The number of first combinations is the number of combinations of adjacent two transmission areas 104 via one element 115 in the third element direction G3 or the fourth element direction G4. The number of second combinations is the number of combinations of adjacent two circular transmission areas 104 via one element 115 in the third element direction G3 or the fourth element direction G4.

As in the case of Example 3, an intensity distribution of light that passes through the transmission areas 104 and reaches a screen 113 was calculated by simulation. The maximum intensity of diffracted light that appears in the intensity distribution was 5.5%.

Example 6

Figure 49:
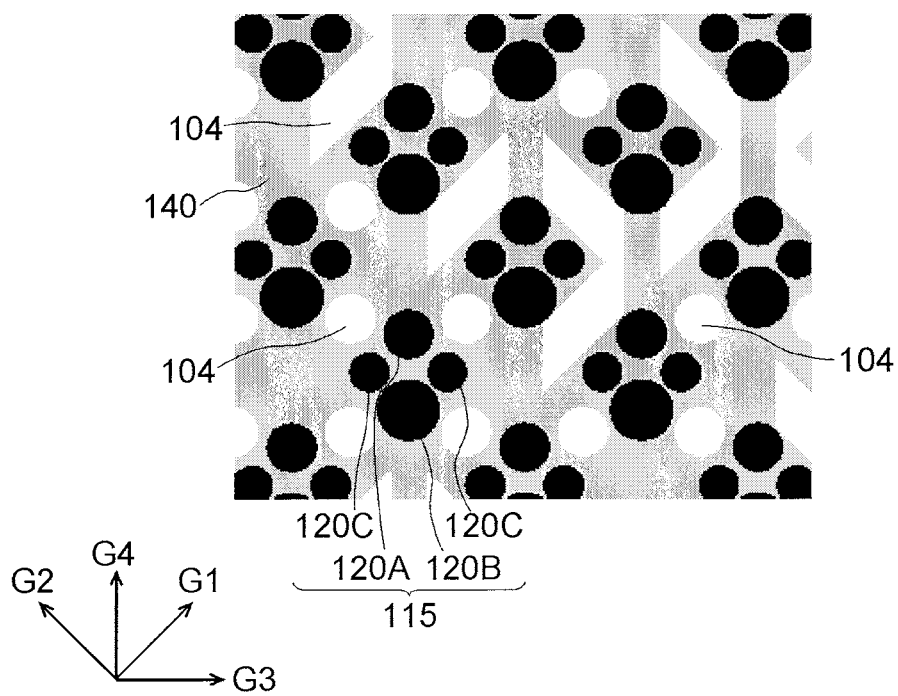
FIG. 49 is a plan view of a second electrode according to Example 6.

The first-A electrode 120A, the first-B electrode 120B, the first-C electrode 120C, and the second electrode 140 shown in FIG. 49 were designed. The pitch of the elements 115 in the first element direction G1 and the second element direction G2 is the same as that in the case of Example 3.

The second electrode 140 in Example 6, as in the case of Example 5, is disposed irregularly. Therefore, each transmission area 104 surrounded by the second electrode 140Y has an irregular shape. Each of the transmission areas 104 is located between any adjacent two of the elements 115 in the first element direction G1 or between any adjacent two of the elements 115 in the second element direction G2. Some of the transmission areas 104 have a circular shape. Some of the transmission areas 104 have a quadrangular shape. Some of the transmission areas 104 are connected to adjacent transmission areas 104.

Example 6, as in the case of Example 5, includes two circular transmission areas 104 adjacent via one element 115 in the third element direction G3. Example 6, as in the case of Example 5, includes two circular transmission areas 104 adjacent via one element 115 in the fourth element direction G4. In Example 6, the probability that two circular transmission areas 104 are adjacent via one element 115 is 1/4.

As in the case of Example 3, an intensity distribution of light that passes through the transmission areas 104 and reaches a screen 113 was calculated by simulation. The maximum intensity of diffracted light that appears in the intensity distribution was 5.3%.

The invention claimed is:
1. An organic device comprising:
   a substrate;
   first electrodes disposed on the substrate;
   organic layers respectively disposed on the first electrodes; and
   a second electrode disposed on the organic layers, wherein
   when the organic device is viewed in a direction normal to the substrate, the organic device includes a first display area that includes the second electrode at a first occupancy and a second display area that includes the second electrode at a second occupancy lower than the first occupancy,
   the second display area includes the second electrode, and transmission areas each surrounded by the second electrode in plan view,
   the transmission areas include a first transmission area, and a second transmission area adjacent to the first transmission area via the second electrode,
   the first transmission area has a first shape, and
   the second transmission area has a second shape different from the first shape.

2. The organic device according to claim 1, wherein an area of the first transmission area is different from an area of the second transmission area.

3. The organic device according to claim 1, wherein
   the transmission areas include a third transmission area adjacent to the first transmission area and the second transmission area via the second electrode, and
   the third transmission area has a third shape different from the first shape and different from the second shape.

4. The organic device according to claim 1, wherein
   the transmission areas include a fourth transmission area adjacent to the first transmission area and the second transmission area via the second electrode, and
   the fourth transmission area has a fourth shape different from the first shape and different from the second shape.

5. The organic device according to claim 1, wherein 80% or higher of the transmission areas correspond to the first transmission area.

6. The organic device according to claim 1, wherein
   the second display area has a first split percentage of higher than or equal to 80%,
   the first split percentage is the percentage of a first split number to the total number of pixel groups each including the four organic layers,
   the first split number is the number of split pixel groups, and
   a path connecting the four organic layers of each of the split pixel groups partially includes the transmission area.

7. The organic device according to claim 1, wherein
   in the second display area, the second electrode includes a trunk electrode, and a branch electrode connected to the trunk electrode,
   the branch electrode includes two first electrode ends in a first electrode direction, and one second electrode end in a second electrode direction that intersects with the first electrode direction, and
   the two first electrode ends and the one second electrode end are in contact with the transmission area.

8. The organic device according to claim 7, wherein
   the second electrode includes a first layer and a second layer,
   the first display area includes electrode overlap areas arranged at a twenty-third pitch in a second element direction,
   each of the electrode overlap areas includes the first layer and the second layer in plan view, and
   a width of the first electrode end is greater than or equal to 0.4 times the twenty-third pitch.

9. The organic device according to claim 7, wherein
the second electrode includes a first layer and a second layer,
the first display area includes electrode overlap areas arranged at a thirteenth pitch in a first element direction,
each of the electrode overlap areas includes the first layer and the second layer in plan view, and
a width of the second electrode end is greater than or equal to 0.4 times the thirteenth pitch.

* * * * *